(12) United States Patent
Koenemann et al.

(10) Patent No.: US 10,230,023 B2
(45) Date of Patent: Mar. 12, 2019

(54) COLOR CONVERTER

(71) Applicant: BASF SE, Ludwigshafen (DE)

(72) Inventors: Martin Koenemann, Mannheim (DE); Gerhard Wagenblast, Wachenheim (DE); Robert Send, Karlsruhe (DE); Sorin Ivanovici, Heidelberg (DE); Gerardus De Keyzer, Riehen (DE)

(73) Assignee: BASF SE, Ludwigshafen (DE)

( * ) Notice: Subject to any disclaimer, the term of this patent is extended or adjusted under 35 U.S.C. 154(b) by 124 days.

(21) Appl. No.: 15/180,161

(22) Filed: Jun. 13, 2016

(65) Prior Publication Data

US 2016/0284947 A1 Sep. 29, 2016

Related U.S. Application Data

(62) Division of application No. 14/123,530, filed as application No. PCT/EP2012/060844 on Jun. 8, 2012, now Pat. No. 9,406,848.

(60) Provisional application No. 61/495,420, filed on Jun. 10, 2011.

(30) Foreign Application Priority Data

Jun. 10, 2011 (EP) .................................. 11169614
Nov. 15, 2011 (EP) .................................. 11189213
Feb. 23, 2012 (EP) .................................. 12156727

(51) Int. Cl.
  H01L 33/50 (2010.01)
  C09K 11/02 (2006.01)
  C09B 57/06 (2006.01)
  C09K 11/06 (2006.01)

(52) U.S. Cl.
  CPC ............ H01L 33/502 (2013.01); C09B 57/06 (2013.01); C09K 11/02 (2013.01); C09K 11/06 (2013.01); C09K 2211/1007 (2013.01); C09K 2211/1011 (2013.01); C09K 2211/1044 (2013.01); Y02E 10/52 (2013.01)

(58) Field of Classification Search
  CPC ....... H01L 33/502; C09K 11/02; C09K 11/06; C09K 2211/1044; C09K 2211/1011; C09K 2211/1007; C09B 57/06; Y02E 10/52

See application file for complete search history.

(56) References Cited

U.S. PATENT DOCUMENTS

| | | | |
|---|---|---|---|
| 3,819,632 A * | 6/1974 | Burdeska | C07C 63/48 546/52 |
| 5,085,946 A | 2/1992 | Saito et al. | |
| 8,611,070 B2 | 12/2013 | Ivanovici et al. | |
| 8,637,857 B2 | 1/2014 | Langer et al. | |
| 9,406,848 B2 * | 8/2016 | Koenemann | C09K 11/06 |
| 2004/0194236 A1 * | 10/2004 | Adam | C07D 491/16 8/531 |
| 2007/0003743 A1 | 1/2007 | Asano et al. | |
| 2008/0252198 A1 | 10/2008 | Katano et al. | |
| 2011/0143107 A1 | 6/2011 | Steinig-Nowakowski et al. | |
| 2011/0201190 A1 | 8/2011 | Hermes et al. | |
| 2011/0203649 A1 | 8/2011 | Könemann et al. | |
| 2011/0253988 A1 | 10/2011 | Molt et al. | |
| 2011/0268647 A1 | 11/2011 | Ivanovici et al. | |
| 2011/0308592 A1 | 12/2011 | Könemann et al. | |
| 2011/0309343 A1 | 12/2011 | Langer et al. | |
| 2011/0309344 A1 | 12/2011 | Watanabe et al. | |
| 2011/0309346 A1 | 12/2011 | Watanabe et al. | |
| 2012/0007063 A1 | 1/2012 | Langer et al. | |
| 2012/0095222 A1 | 4/2012 | Schaefer et al. | |
| 2012/0168731 A1 | 7/2012 | Schildknecht et al. | |
| 2012/0199823 A1 | 8/2012 | Molt et al. | |
| 2012/0205645 A1 | 8/2012 | Fuchs et al. | |
| 2012/0241681 A1 | 9/2012 | Schaefer et al. | |
| 2013/0032766 A1 | 2/2013 | Molt et al. | |
| 2013/0065168 A1 | 3/2013 | De Keyzer et al. | |
| 2013/0078393 A1 | 3/2013 | De Keyzer et al. | |
| 2013/0092874 A1 | 4/2013 | Bacher et al. | |
| 2013/0164635 A1 | 6/2013 | Schmidt et al. | |
| 2013/0244862 A1 | 9/2013 | Ivanovici et al. | |
| 2013/0334546 A1 | 12/2013 | Wagenblast et al. | |

FOREIGN PATENT DOCUMENTS

DE  10 2008 057 720 A1  5/2010
JP      2001-240733 A     9/2001
(Continued)

OTHER PUBLICATIONS

International Search Report dated Jul. 30, 2012 in PCT/EP2012/060844.

(Continued)

*Primary Examiner* — John M Mauro
(74) *Attorney, Agent, or Firm* — Oblon, McClelland, Maier & Neustadt, L.L.P.

(57) ABSTRACT

Color converter comprising at least one polymer and at least one organic fluorescent dye comprising at least one structural unit of the formula (I)

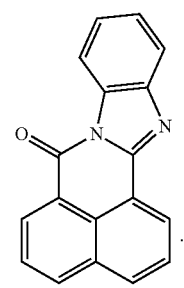

(I)

where the structural unit may be mono- or polysubstituted by identical or different substituents and where one or more CH groups of the six-membered ring of the benzimidazole structure shown may be replaced by nitrogen.

3 Claims, 1 Drawing Sheet

(56) References Cited

FOREIGN PATENT DOCUMENTS

| | | |
|---|---|---|
| JP | 2004-006064 A | 1/2004 |
| RU | 2 069 429 C1 | 11/1996 |
| RU | 2 288 102 C1 | 11/2006 |
| TW | 200641096 | 12/2006 |
| WO | WO 03/038915 A1 | 5/2003 |
| WO | WO 2007/006717 A1 | 1/2007 |
| WO | WO 2009/037283 A1 | 3/2009 |
| WO | WO 2010/031833 A1 | 3/2010 |
| WO | WO 2010/145991 A1 | 12/2010 |
| WO | WO 2011/027894 A1 | 3/2011 |
| WO | WO 2011/045337 A1 | 4/2011 |
| WO | WO 2011/051404 A1 | 5/2011 |
| WO | WO 2011/073149 A1 | 6/2011 |
| WO | WO 2011/082961 A2 | 7/2011 |
| WO | WO 2011/101777 A1 | 8/2011 |
| WO | WO 2011/101810 A1 | 8/2011 |
| WO | WO 2011/125020 A1 | 10/2011 |
| WO | WO 2011/131722 A1 | 10/2011 |
| WO | WO 2011/138176 A1 | 11/2011 |
| WO | WO 2011/138287 A1 | 11/2011 |
| WO | WO 2011/141486 A1 | 11/2011 |
| WO | WO 2011/147924 A1 | 12/2011 |
| WO | WO 2011/157614 A1 | 12/2011 |
| WO | WO 2011/157779 A1 | 12/2011 |
| WO | WO 2011/157790 A1 | 12/2011 |
| WO | WO 2011/158204 A1 | 12/2011 |
| WO | WO 2011/158211 A1 | 12/2011 |
| WO | WO 2012/004765 A2 | 1/2012 |
| WO | WO 2012/020327 A1 | 2/2012 |
| WO | WO 2012/045710 A1 | 4/2012 |
| WO | WO 2012/070013 A1 | 5/2012 |
| WO | WO 2012/113884 A1 | 8/2012 |
| WO | WO 2012/130709 A1 | 10/2012 |
| WO | WO 2012/152812 A1 | 11/2012 |
| WO | WO 2012/168395 A1 | 12/2012 |

OTHER PUBLICATIONS

International Preliminary Report on Patentability dated Jul. 19, 2013 in PCT/EP2012/060844.
"1,8 Naphthoilene-1,2-benzimidazole (luminor yellow-green 490 rt) / CAS 23749-58-8" chem-info.com, XP002679400, 2008, http://www.chem-info.com/trade/sell/1,8-Naphthoilene-1,2-benzimidazole-%28luminor-yellow-green-490-rt%29-313820.html.
Chinese Office Action dated Nov. 26, 2014 in Patent Application No. 201280028556.0 (English Translation only).
"STN Files: CA, CAPLUS, CASREACT, USPATFULL", STN Columbus, Nov. 16, 1984, 3 pages.
Reusanov et al., "Synthesis and Study of Some Bis(1'8'-naphyhoylene-1,2-benzimidazoles)", *Khimiya Geterotsiklicheskikh Soedinenii*, No. 7, pp. 968-971, Jul. 1979.
Taiwan Search Report dated Jan. 26, 2016, issued in corresponding Taiwan Patent Application No. 101120799.

\* cited by examiner

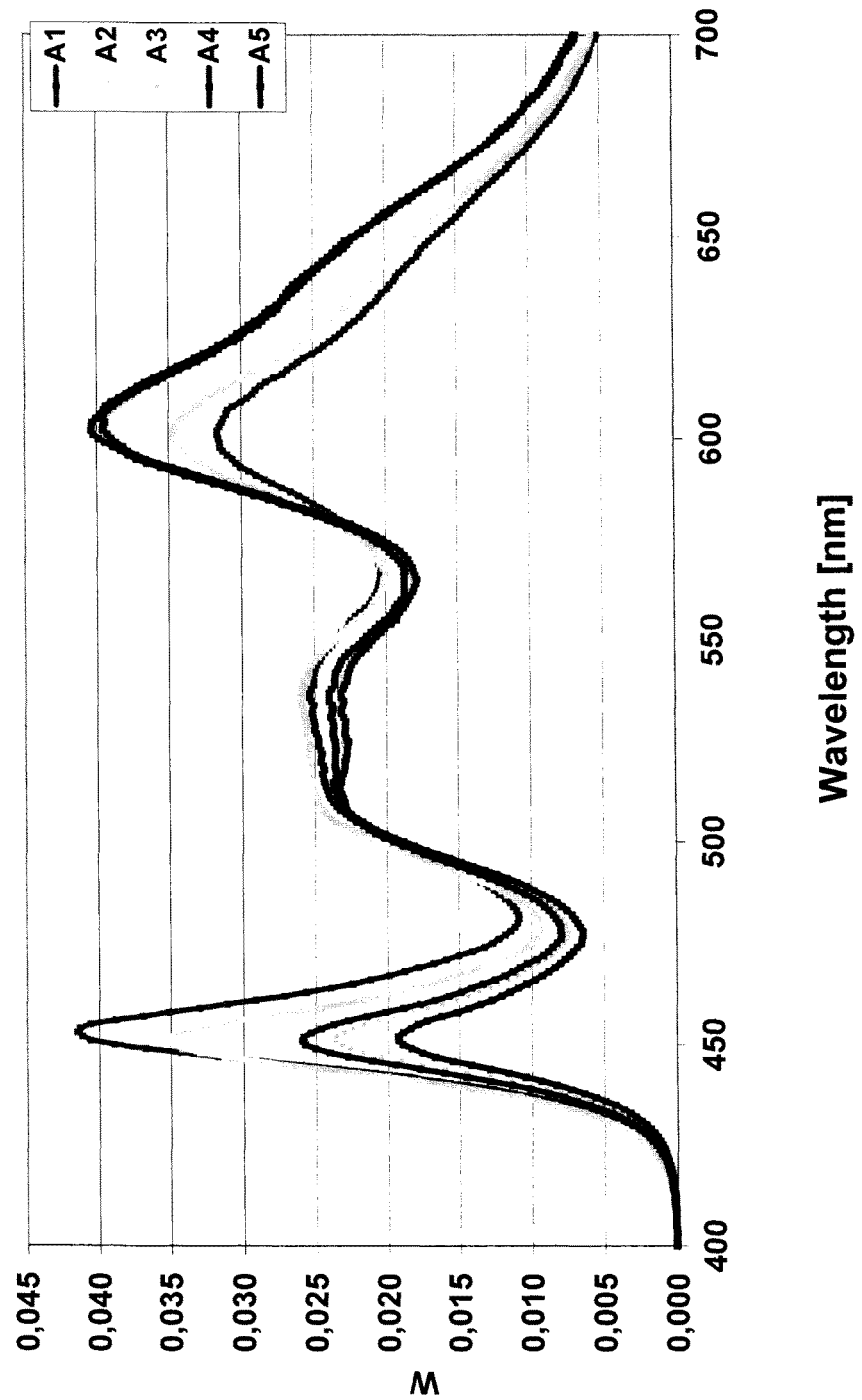

COLOR CONVERTER

CROSS REFERENCE TO RELATED APPLICATIONS

This application is a division of U.S. application Ser. No. 14/123,530, filed Dec. 3, 2013, now U.S. Pat. No. 9,406,848; which is a 371 of PCT/EP2012/060844, filed Jun. 8, 2012; which claims the benefit of U.S. provisional application Ser. No. 61/495,420, filed Jun. 10, 2011, the disclosures of which are incorporated herein by reference in their entireties. This application claims priority to European Patent Application No. 11169614.2, filed Jun. 10, 2011; European Patent Application No. 11189213.9, filed Nov. 15, 2011; and European Patent Application No. 12156727.5, filed Feb. 23, 2012, the disclosures of which are incorporated herein by reference in its entirety.

The present invention provides color converters comprising at least one polymer as a matrix material and at least one organic fluorescent dye comprising at least one structural unit of the formula (I)

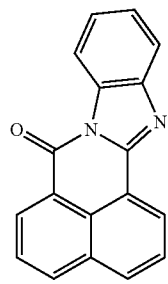

(I)

where the structural unit may be mono- or polysubstituted by identical or different substituents and where one or more CH groups of the six-membered ring of the benzimidazole structure shown may be replaced by nitrogen, and processes for production thereof.

The invention further provides illumination devices comprising at least one LED and at least one color converter comprising at least one polymer as a matrix material and at least one organic fluorescent dye comprising at least one structural unit of the formula (I)

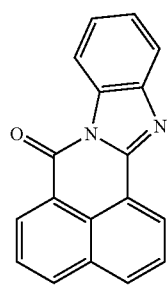

(I)

where the structural unit may be mono- or polysubstituted by identical or different substituents and where one or more CH groups of the six-membered ring of the benzimidazole structure shown may be replaced by nitrogen.

The invention further provides polymer mixtures comprising suitable fluorescent dyes.

The invention further provides novel organic fluorescent dyes.

20% of global electrical energy consumption is required for lighting purposes.

Lighting equipment is the subject of further technical development with regard to the energy efficiency, color reproduction, service life, manufacturing costs and usability thereof.

Incandescent lamps and halogen lamps, being thermal radiators, produce light with very good color reproduction since a broad spectrum is emitted with radiation characteristics approaching Planck's law of black body radiation and closely resembling sunlight. One disadvantage of incandescent lamps is the high power consumption thereof, since a very large amount of electrical energy is converted to heat.

A higher efficiency is possessed by compact fluorescent tubes, which produce a linear emission spectrum of mercury by discharge of an electrically excited mercury vapour. On the inside of these compact fluorescent tubes are phosphors comprising rare earths, which absorb some of the mercury emission spectrum and emit it as green and red light. The emission spectrum of a compact fluorescent tube is composed of different lines, which results in much poorer color reproduction. The light of a compact fluorescent tube is found by many humans to be less natural and less pleasant than sunlight or light from incandescent lamps.

A longer lifetime and a very good energy efficiency are exhibited by most light-emitting diodes (LEDs). The light emission is based on the recombination of electron-hole pairs (excitons) in the junction area of a forward-biased semiconductor pn junction. The size of the band gap of this semiconductor determines the approximate wavelength. LEDs can be produced in different colors.

Stable and energy-efficient blue LEDs can produce white light by color conversion. According to a known method for this purpose, a polymeric material comprising a radiation conversion phosphor is applied directly to the LED light source (LED chip). Frequently, the polymeric material is applied to the LED chip in approximately droplet or hemispherical form, as a result of which particular optical effects contribute to the emission of light. Such structures in which radiation conversion phosphor in a polymeric matrix is applied directly and without intervening space to an LED chip are also referred to as "phosphor on a chip". In phosphor on a chip LEDs, the radiation conversion phosphors used are generally inorganic materials. The radiation conversion phosphors, which may consist, for example, of cerium-doped yttrium aluminium garnet, absorb a certain proportion of the blue light and emit longer-wave light with a broad emission band, such that the mixing of the transmitted blue light and of the emitted light gives rise to white light.

In phosphor on a chip LEDs, the polymeric material and the radiation conversion phosphor (also referred to as fluorescent colorant or fluorescent dye) are subject to relatively high thermal and radiative stress. For this reason, organic radiation conversion phosphors have not been suitable to date for use in phosphor on a chip LEDs.

In order to produce white light from blue light by color conversion, there is a further concept in which the color converter (also referred to as "converter" or "light converter"), which generally comprises a carrier and a polymer layer, is at a certain distance from the LED chip. Such a structure is referred to as "remote phosphor".

The spatial distance between the primary light source, the LED, and the color converter reduces the stress resulting from heat and radiation to such an extent that the requirements on the stability can be achieved by suitable organic fluorescent dyes. Furthermore, LEDs according to the "remote phosphor" concept are even more energy-efficient than those according to the "phosphor on a chip" concept. The use of organic fluorescent dyes in these converters offers various advantages. They enable good color reproduction and are capable of producing pleasant light. Furthermore, they do not require any materials comprising rare earths, which have to be mined and provided in a costly and inconvenient manner and are only available to a limited degree. It is therefore desirable to provide color converters for LEDs which comprise suitable organic fluorescent dyes.

The number of dyes which absorb blue light is virtually unlimited. The number of dye classes which absorb blue light and exhibit fluorescence is also immense.

In order that organic fluorescent dyes are suitable for use in color converters, however, they must additionally have a high fluorescence quantum yield in particular.

Appl. Phys. Letters 92, 143309 (2008) describes the production of white light from blue LED light according to remote phosphor and phosphor on a chip structures using particular perylene dyes.

DE 10 2008 057 720 A1 describes the concept of remote phosphor LEDs and discloses, in addition to a conversion layer comprising inorganic radiation conversion phosphors, the use of organic radiation conversion phosphors embedded into a polymeric matrix.

WO 03/038915 A, US 20080252198 describe the use of perylene dyes as radiation conversion phosphors for phosphor on a chip LEDs.

JP 2001-240733 A discloses the use of substituted naphthalenebenzimidazoles for coloring polybutylene terephthalate in order to obtain a hue of maximum blackness.

It was an object of the present invention to provide color converters, illumination devices, polymer mixtures and organic fluorescent dyes which do not have the disadvantages of the prior art and which especially have a high fluorescence quantum yield. They should additionally have a high stability and a long lifetime.

The object was achieved by the color converters, illumination devices, polymer mixtures and organic fluorescent dyes specified at the outset.

BRIEF DESCRIPTION OF THE DRAWINGS

FIG. 1 shows emission spectra of color converters plaques on illumination with 450 nm LEDs.

Color converters in the context of this invention are understood to mean all physical devices which are capable of absorbing light of particular wavelengths and converting it to light of other wavelengths. Color converters are, for example, part of illumination devices, especially those illumination devices which utilize LEDs or OLEDs as a light source, or of fluorescence conversion solar cells.

As used herein, the term "organic fluorescent dye comprising at least one structural unit of the formula (I)" refers to an organic fluorescent dye which consists of one structural unit of the formula (I) or comprises one or more, e.g. 2, 3, 4 or more than 4 structural unit of the formula I. If the organic fluorescent dye consists of one structural unit of the formula (I), the organic fluorescent dye is synonymous with the structural unit of the formula (I).

The organic moieties mentioned in the above definitions of the variables are—like the term halogen—collective terms for individual listings of the individual group members. The prefix $C_n$-$C_m$ indicates in each case the possible number of carbon atoms in the group.

The term halogen denotes in each case fluorine, bromine, chlorine or iodine.

The term "aliphatic radical" refers to an acyclic saturated or unsaturated, straight-chain or branched hydrocarbon radical. Usually the aliphatic radical has 1 to 100 carbon atoms. Examples for an aliphatic radical are alkyl, alkenyl and alkynyl.

The term "cycloaliphatic radical" refers to a cyclic, non-aromatic saturated or unsaturated hydrocarbon radical having usually 3 to 20 ring carbon atoms. Examples are cycloalkanes, cycloalkenes, and cycloalkynes. The cycloaliphatic radical may also heteroatoms or heteroatom groups.

The term "alkyl" as used herein and in the alkyl moieties of alkoxy, alkylthio, alkylsulfinyl, alkylsulfonyl, alkylcarbonyl, alkoxycarbonyl and the like refers to saturated straight-chain or branched hydrocarbon radicals having 1 to 100 ("$C_1$-$C_{100}$-alkyl"), 1 to 30 ("$C_1$-$C_{30}$-alkyl"), 1 to 18 ("$C_1$-$C_{18}$-alkyl"), 1 to 12 ("$C_1$-$C_{12}$-alkyl"), 1 to 8 ("$C_1$-$C_8$-alkyl") or 1 to 16 ("$C_1$-$C_6$-alkyl") carbon atoms.

The term "alkenyl" as used herein (also referred to as alkyl whose carbon chain may comprise one or more double bonds) refers to straight-chain or branched hydrocarbon groups having 2 to 100 ("$C_2$-$C_{100}$-alkenyl"), 2 to 18 ("$C_2$-$C_{18}$-alkenyl"), 2 to 10 ("$C_2$-$C_{10}$-alkenyl"), 2 to 8 ("$C_2$-$C_8$-alkenyl"), or 2 to 6 ("$C_2$-$C_6$-alkenyl") carbon atoms and one or more, e.g. 2 or 3, double bonds in any position.

The term "alkynyl" as used herein (also referred to as alkyl whose carbon chain may comprise one or more triple bonds) refers to straight-chain or branched hydrocarbon groups having 2 to 100 ("$C_2$-$C_{100}$-alkynyl"), 2 to 18 ("$C_2$-$C_{18}$-alknyl"), 2 to 10 ("$C_2$-$C_{10}$-alkynyl"), 2 to 8 ("$C_2$-$C_8$-alkynyl"), or 2 to 6 ("$C_2$-$C_6$-alkynyl") carbon atoms and one or more, e.g. 2 or 3, triple bonds in any position.

The term "cycloalkyl" as used herein refers to mono- or bi- or polycyclic saturated hydrocarbon radicals having 3 to 20 ("$C_3$-$C_{20}$-cycloalkyl") atoms, preferably 3 to 8 ("$C_3$-$C_8$-cycloalkyl") or 3 to 6 carbon atoms ("$C_3$-$C_6$-cycloalkyl"). Examples of monocyclic radicals having 3 to 6 carbon atoms comprise cyclopropyl, cyclobutyl, cyclopentyl and cyclohexyl. Examples of monocyclic radicals having 3 to 8 carbon atoms comprise cyclopropyl, cyclobutyl, cyclopentyl, cyclohexyl, cycloheptyl and cyclooctyl. Examples of bicyclic radicals having 7 or 8 carbon atoms comprise bicyclo[2.2.1]heptyl, bicyclo[3.1.1]heptyl, bicyclo[2.2.2]octyl and bicyclo[3.2.1]octyl.

A cycloalkyl ring, wherein the cycloalkyl ring may contain heteroatoms or heteroatom groups is also referred to as heterocyclic ring. The heterocyclic ring usually contains besides carbon atoms as ring members 1, 2, 3 or 4 heteroatoms selected from O, S and N as ring members.

The term "aryl" as used herein refers to a mono-, or polycyclic, e.g. bi-, tri-, tetra- or pentacyclic, aromatic hydrocarbon radical having 6 to 22, preferably 6 to 10, 6 to 13, 6 to 14, 6 to 16, 6 to 18, 6 to 20 or 6 to 22 carbon atoms as ring members. Examples are phenyl, naphthyl, fluorenyl, anthranyl, tetracenyl, pentacenyl, pyrenyl or benzopyrenyl.

The term "alkaryl" refers to aryl as defined above substituted by at least one alkyl group as defined above. Alkaryl groups may, depending on the size of the aromatic ring system, have one or more (e.g. 1, 2, 3, 4, 5, 6, 7, 8, 9 or more than 9) alkyl substituents.

The term "aralkyl" refers to alkyl as defined above substituted by at least one aryl group as defined above. Aralkyl groups may, depending on the size of the aromatic ring system, have one or more (e.g. 1, 2, 3, 4, 5, 6, 7, 8, 9 or more than 9) aryl substituents.

The term "het(ero)aryl" as used herein refers to a mono- or polycyclic, e.g. bi-, or tricyclic, heteroaromatic hydrocarbon radical, preferably to a monocyclic or bicyclic heteroaromatic radical. Hetaryl usually is a 5-, 6-, 7-, 8-, 9-, 10-, 11-, 12-, 13-, 14- or 15-membered cyclic radical having besides carbon atoms as ring members 1, 2, 3 or 4 heteroatoms selected from O, S and N as ring members.

The term "aryl or hetaryl, to each of which may be fused further saturated or unsaturated 5- to 7-membered rings whose carbon skeleton may comprise one or more —O—, —S—, —CO— and/or —SO₂— moieties" refers to aryl or hetaryl that is adjoined at two consecutive positions with the saturated or unsaturated 5- to 7-membered rings in such a way that both rings share the ring atoms at said two positions.

Inventive color converters comprise at least one polymer and at least one organic fluorescent dye comprising at least one structural unit of the formula (I)

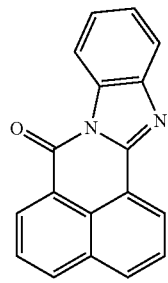

(I)

where the structural unit may be mono- or polysubstituted by identical or different substituents and.

Examples for structural units of the formula (I) where one or more CH groups of the six-membered ring of the benzimidazole structure are replaced by nitrogen are structural units of the formula (I'),

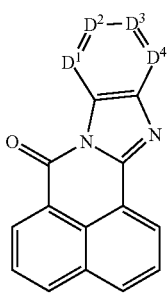

(I')

in which at least one of the variables $D^1$ to $D^4$ is N and the other variables $D^1$ to $D^4$ are CH.

Suitable polymers are in principle all polymers which are capable of dissolving or of homogeneously distributing the at least one organic fluorescent dye in a sufficient amount.

Suitable polymers may be inorganic polymers or organic polymers.

Suitable inorganic polymers are, for example, silicates or silicon dioxide. A prerequisite for the use of inorganic polymers is that the at least one organic fluorescent dye can be dissolved or homogeneously distributed therein without decomposition. In the case of silicates or silicon dioxide, this can be accomplished, for example, by deposition of the polymer from a waterglass solution.

Suitable organic polymers are, for example, polystyrene, polycarbonate, polymethyl methacrylate, polyvinylpyrrolidone, polymethacrylate, polyvinyl acetate, polyvinyl chloride, polybutene, polyethylene glycol, silicone, polyacrylate, epoxy resin, polyvinyl alcohol, polyacrylonitrile, polvinylidene chloride (PVDC), polystyrene-acrylonitrile (SAN), polybutylene terephthalate (PBT), polyethylene terephthalate (PET), polyvinyl butyrate (PVB), polyvinyl chloride (PVC), polyamides, polyoxymethylenes, polyimides, polyether imide or mixtures thereof.

According to a preferred embodiment, the at least one organic polymer consists essentially of polystyrene, polycarbonate, polymethyl methacrylate, polyvinylpyrrolidone, polymethacrylate, polyvinyl acetate, polyvinyl chloride, polybutene, polyethylene glycol, silicone, polyacrylate, epoxy resin, polyvinyl alcohol, polyacrylonitrile, polvinylidene chloride (PVDC), polystyrene-acrylonitrile (SAN), polybutylene terephthalate (PBT), polyethylene terephthalate (PET), polyvinyl butyrate (PVB), polyvinyl chloride (PVC), polyamides, polyoxymethylenes, polyimides, polyether imide or mixtures thereof.

Preferably, the at least one polymer consists essentially of polystyrene, polycarbonate, polymethyl methacrylate or mixtures thereof.

Most preferably, the at least one polymer consists essentially of polystyrene or polycarbonate.

Polystyrene is understood here to include all homo- or copolymers which result from polymerization of styrene and/or derivatives of styrene. Derivatives of styrene are, for example, alkylstyrenes such as alpha-methylstyrene, ortho-, meta-, para-methylstyrene, para-butylstyrene, especially para-tert-butylstyrene, alkoxystyrene such as para-methoxystyrene, para-butoxystyrene, para-tert-butoxystyrene.

In general, suitable polystyrenes have a mean molar mass $M_n$ of 10 000 to 1 000 000 g/mol (determined by GPC), preferably 20 000 to 750 000 g/mol, more preferably 30 000 to 500 000 g/mol.

In a preferred embodiment, the matrix of the color converter consists essentially or completely of a homopolymer of styrene or styrene derivatives.

In a further preferred embodiment of the invention, the matrix consists essentially or completely of a styrene copolymer which is likewise considered to be a polystyrene in the context of this application. Styrene copolymers may comprise, as further constituents, for example, butadiene, acrylonitrile, maleic anhydride, vinylcarbazole, or esters of acrylic acid, methacrylic acid or itaconic acid, as monomers. Suitable styrene copolymers comprise generally at least 20% by weight of styrene, preferably at least 40% and more preferably at least 60% by weight of styrene. In another embodiment, they comprise at least 90% by weight of styrene. Preferred styrene copolymers are styrene-acrylonitrile copolymers (SAN) and acrylonitrile-butadiene-styrene copolymers (ABS), styrene-1,1'-diphenylethene copolymers, acrylic ester-styrene-acrylonitrile copolymers (ASA), methyl methacrylate-acrylonitrile-butadiene-styrene copolymers (MABS). A further preferred polymer is alpha-methylstyrene-acrylonitrile copolymer (AMSAN).

The styrene homo- or copolymers can be prepared, for example, by free-radical polymerization, cationic polymerization, anionic polymerization, or under the influence of organometallic catalysts (for example Ziegler-Natta catalysis). This can lead to isotactic, syndiotactic, atactic polystyrene or copolymers. They are preferably prepared by free-radical polymerization. The polymerization can be performed as a suspension polymerization, emulsion polymerization, solution polymerization or bulk polymerization.

The preparation of suitable polystyrenes is described, for example, in Oscar Nuyken, Polystyrenes and Other Aromatic Polyvinyl Compounds, in Kricheldorf, Nuyken, Swift, New York 2005, p. 73-150 and literature cited therein; and in Elias, Macromolecules, Weinheim 2007, p. 269-275.

Polycarbonates are polyesters of carbonic acid with aromatic or aliphatic dihydroxyl compounds. Preferred dihydroxyl compounds are, for example, methylenediphenyldihydroxyl compounds, for example bisphenol A.

One means of preparing polycarbonates is the reaction of suitable dihydroxyl compounds with phosgene in an interfacial polymerization. Another means is the reaction with diesters of carbonic acid, such as diphenyl carbonate, in a condensation polymerization.

The preparation of suitable polycarbonates is described, for example, in Elias, Macromolecules, Weinheim 2007, p. 343-347.

In a preferred embodiment, polymers which have been polymerized with exclusion of oxygen are used. The monomers preferably comprised, during the polymerization, a total of at most 1000 ppm of oxygen, more preferably at most 100 ppm and especially preferably at most 10 ppm.

Suitable polymers may comprise, as further constituents, additives such as flame retardants, antioxidants, light stabilizers, UV absorbers, free-radical scavengers, antistats. Such stabilizers are known to those skilled in the art.

Suitable antioxidants or free-radical scavengers are, for example, phenols, especially sterically hindered phenols such as butylhydroxyanisole (BHA) or butylhydroxytoluene (BHT), or sterically hindered amines (HALS). Such stabilizers are sold, for example, by BASF under the Irganox® trade name. In some cases, antioxidants and free-radical scavengers can be supplemented by secondary stabilizers such as phosphites or phosphonates, as sold, for example, by BASF under the Irgafos® trade name.

Suitable UV absorbers are, for example, benzotriazoles such as 2-(2-hydroxyphenyl)-2H-benzotriazoles (BTZ), triazines such as (2-hydroxyphenyl)-s-triazines (HPT), hydroxybenzophenones (BP) or oxalanilides. Such UV absorbers are sold, for example by BASF under the Uvinul® trade name.

In a preferred embodiment of the invention, suitable polymers do not comprise any antioxidants or free-radical scavengers.

In one embodiment of the invention, suitable polymers are transparent polymers.

In another embodiment, suitable polymers are opaque polymers.

The polymers mentioned serve as matrix material for suitable organic fluorescent dyes.

It has now been found that, surprisingly, particularly suitable organic fluorescent dyes for use in color converters are those which comprise at least one structural unit of the formula (I)

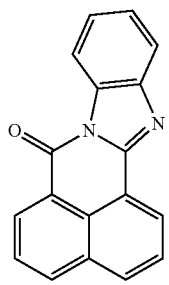

(I)

where the structural unit may be mono- or polysubstituted by identical or different substituents and where one or more CH groups of the six-membered ring of the benzimidazole structure shown may be replaced by nitrogen.

Preferably, suitable organic fluorescent dyes comprise at least one structural unit (II)

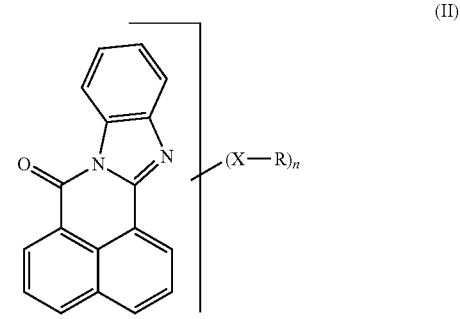

(II)

where one or more CH groups of the six-membered ring of the benzimidazole structure shown may be replaced by nitrogen and where the symbols are each defined as follows:

n is a number from 0 to (10-p) for each structural unit of the formula (II); where p is the number of CH units which have been replaced by nitrogen in the six-membered ring of the benzimidazole structure shown; X is a chemical bond, O, S, SO, $SO_2$, $NR^1$;

R is an aliphatic radical, cycloaliphatic radical, aryl, hetaryl, each of which may bear any desired substituents,
an aromatic or heteroaromatic ring or ring system, each of which is fused to other aromatic rings of the structural unit of the formula (II),
is F, Cl, Br, CN, H when X is not a chemical bond;
where two R radicals may be joined to give one cyclic radical and
where X and R, when n>one, may be the same or different;

$R^1$ is each independently hydrogen, $C_1$-$C_{18}$-alkyl or cycloalkyl, the carbon chain of which may comprise one or more —O—, —S—, —CO—, —SO— and/or —$SO_2$— moieties and which may be mono- or polysubstituted;
aryl or hetaryl which may be mono- or polysubstituted.

Bromine is less preferred as an R radical since it weakens the fluorescence.

Where two R radicals are joined to give one cyclic radical, the two radical R together with the atoms to which they are bonded may form a fused ring system having one or more, e.g. 1, 2, 3, 4 or more than 4, rings. The fused ring system may be saturated or partially unsaturated. In addition, the fused ring system may comprise besides carbon atoms as ring members one or more heteroatoms or heteroatomic groups selected from CO, SO, O, S and N as ring members.

Examples for structural units of the formula (II) where one or more CH groups of the six-membered ring of the benzimidazole structure are replaced by nitrogen are structural units of the formula (II'),

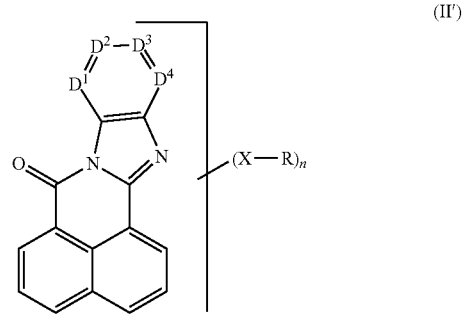

(II')

in which at least one of the variables $D^1$ to $D^4$ is N and the other variables $D^1$ to $D^4$ are CH.

In one embodiment, up to two CH groups of the six-membered ring of the benzimidazole group ("of the benzimidazole ring") of the structural unit (II) are replaced by nitrogen atoms. In this embodiment, two variables $D^1$ to $D^4$ are N and the other variables $D^1$ to $D^4$ are CH. In this case, the maximum value for n is reduced by the number of nitrogen atoms which replace a CH group. In the case of two additional nitrogen atoms, the maximum possible number of (X—R) radicals in the structural unit (II) is no longer 10 but rather eight. The preferred values for n remain unaffected by the number of nitrogen atoms in the structural unit (II), provided that the preferred upper limit is not above the maximum possible number of (X—R) radicals. According to a further embodiment, one variable $D^1$ to $D^4$ is N and the other variables $D^1$ to $D^4$ are CH. More preferably, the number of nitrogen atoms p in the six-membered ring of the benzimidazole structure shown in formula (II) is 0 or 1.

Preferably, the structural unit (II) and (II') is substituted by at least one substituent. It preferably bears 1 to 8, e.g. 1, 2, 3, 4, 5, 6, 7 or 8, substituents (X—R), including 1 to 6 and 1 to 5, more preferably 2, 3, 4, 5 or 6. In one embodiment, it bears 3, 4 or 5 substituents. In a preferred embodiment, n is 1 to 4, e.g. 1, 2, 3, 4.

In one embodiment, the X—R radicals are selected such that they increase the electron density in the aromatic system to which they are bonded directly.

In another, less preferred embodiment, the X—R radicals are selected such that they reduce the electron density in the aromatic system to which they are bonded directly.

In another embodiment, one or some X—R radicals are selected such that they reduce the electron density in the aromatic system to which they are bonded directly, and one or some X—R radicals are selected such that they increase the electron density in the aromatic system to which they are bonded directly.

In one embodiment of the invention, the at least one organic fluorescent dye comprises at least one structural unit of the formulae (III), (IV), (V), (VI), (VII), (VIII), (IX), (X), (XX), (XXI), (XXII), (XXIII), (XIV), (XXV) or (XXVI):

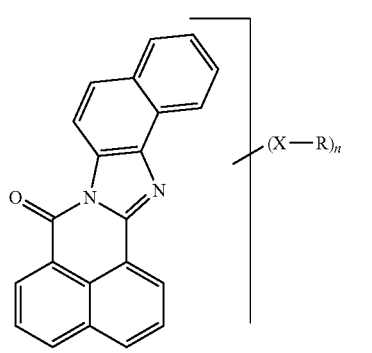
(III)

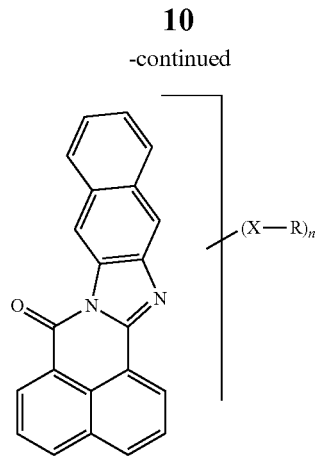
(IV)

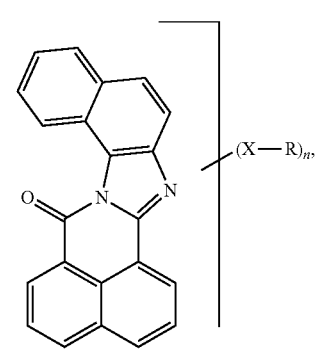
(V)

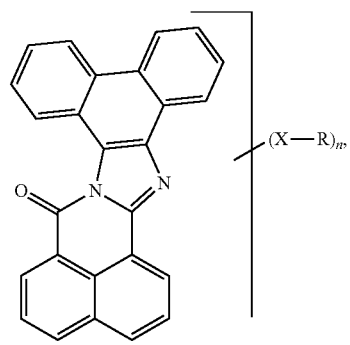
(VI)

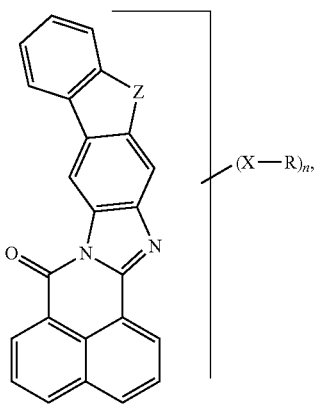
(VII)

(VIII)
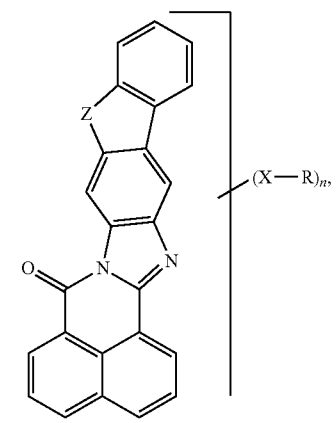 (X—R)_n,
(IX)
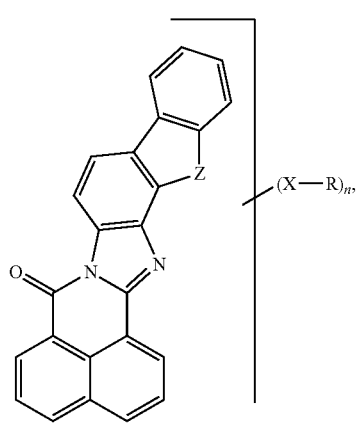 (X—R)_n,
(X)
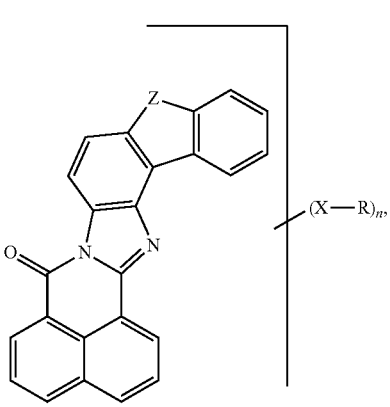 (X—R)_n,
(XX)
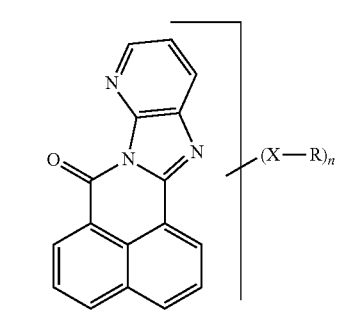 (X—R)_n
(XXI)
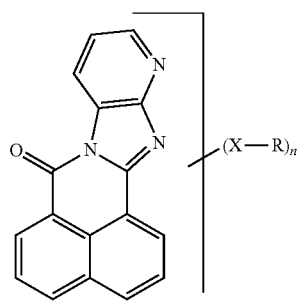 (X—R)_n
(XXII)
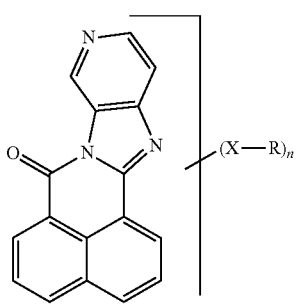 (X—R)_n
(XXIII)
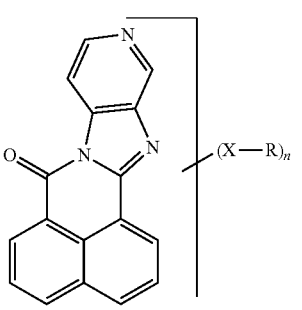 (X—R)_n
(XXIV)
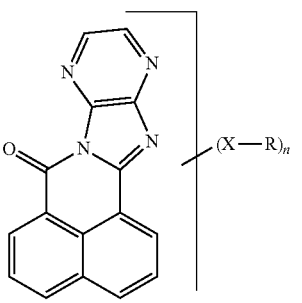 (X—R)_n
(XXV)
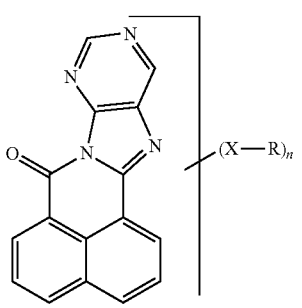 (X—R)_n

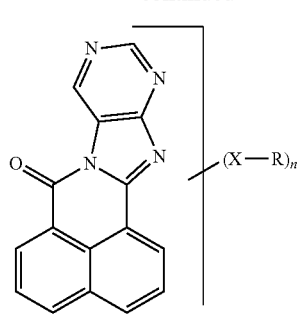

(XXVI)

where Z is $CR^1R^2$, $NR^1$ or O.

More preferably, the symbols in the formulae (II) to (X) and (XX) to (XXVI) are each as follows:

X is a chemical bond, O, S, SO, $SO_2$ or $NR^1$;

R is an aliphatic or cycloaliphatic radical selected from $C_1$ to $C_{100}$, more preferably $C_2$ to $C_{30}$, alkyl or cycloalkyl, whose carbon chain may comprise one or more —O—, —S—, —$NR^1$—, —N=$CR^1$—, —C≡C—, —$CR^1$=$CR^1$—, —CO—, —SO— and/or —$SO_2$— moieties, may have one or more double or triple bonds and may be mono- or polysubstituted by: $C_1$-$C_{12}$-alkoxy, $C_1$-$C_6$-alkylthio, —C≡$CR^1$, —$CR^1$=$CR^1{}_2$, hydroxyl, mercapto, halogen, cyano, nitro, —$NR^2R^3$, —$NR^2COR^3$, —$CONR^2R^3$, —$SO_2NR^2R^3$, —$COOR^2$, —$SO_3R^2$, aryl and/or saturated or unsaturated $C_4$-$C_7$-cycloalkyl whose carbon skeleton may comprise one or more —O—, —S—, —$NR^1$—, —N=$CR^1$—, —$CR^1$=$CR^1$—, —CO—, —SO— and/or —$SO_2$— moieties, where the aryl and cycloalkyl radicals may each be mono- or polysubstituted by $C_1$-$C_{18}$-alkyl and/or the above radicals mentioned as substituents for alkyl;

aryl or hetaryl, to each of which may be fused further saturated or unsaturated 5-, 6- or 7-membered rings whose carbon skeleton may comprise one or more —O—, —S—, —$NR^1$—, —N=$CR^1$—, —CO—, —SO— and/or —$SO_2$— moieties, where the entire aryl or hetaryl ring system may be mono- or polysubstituted by the radicals (i), (ii), (iii), (iv) and/or (v):

(i) $C_1$-$C_{30}$-alkyl whose carbon chain may comprise one or more —O—, —S—, —$NR^1$—, —N=$CR^1$, —C≡C—, —$CR^1$=$CR^1$—, —CO—, —SO— and/or —$SO_2$— moieties and which may be mono- or polysubstituted by: $C_1$-$C_{12}$-alkoxy, $C_1$-$C_6$-alkylthio, —C≡$CR^1$, —$CR^1$=$CR^1{}_2$, hydroxyl, mercapto, halogen, cyano, nitro, —$NR^2R^3$, —$NR^2COR^3$, —$CONR^2R^3$, —$SO_2NR^2R^3$, —$COOR^2$, —$SO_3R_2$, aryl and/or saturated or unsaturated $C_4$-$C_7$-cycloalkyl, whose carbon skeleton may comprise one or more —O—, —S—, —$NR^1$—, —N=$CR^1$—, —$CR^1CR^1$—, —CO, —SO— and/or —$SO_2$— moieties, where the aryl and cycloalkyl radicals may each be mono- or polysubstituted by $C_1$-$C_{18}$-alkyl and/or the above radicals mentioned as substituents for alkyl;

(ii) $C_3$-$C_8$-cycloalkyl whose carbon skeleton may comprise one or more —O—, —S—, —$NR^1$—, —N=$CR^1$—, —$CR^1$=$CR^1$—, —CO—, —SO— and/or —$SO_2$— moieties and to which may be fused further saturated or unsaturated 5- to 7-membered rings whose carbon skeleton may comprise one or more —O—, —S—, —$NR^1$—, —N=$CR^1$—, —$CR^1$=$CR^1$—, —CO—, —SO— and/or —$SO_2$-moieties, where the overall ring system may be mono- or polysubstituted by: $C_1$-$C_{18}$-alkyl, $C_1$-$C_{12}$-alkoxy, $C_1$-$C_6$-alkylthio, —C≡$CR^1$, —$CR^1$=$CR^1{}_2$, hydroxyl, mercapto, halogen, cyano, nitro, —$NR^2R^3$, —$NR^2COR^3$, —$CONR^2R^3$, —$SO_2NR^2R^3$, —$COOR^2$ and/or —$SO_3R^2$;

(iii) aryl or hetaryl, to each of which may be fused further saturated or unsaturated 5- to 7-membered rings whose carbon skeleton may comprise one or more —O—, —S—, —$NR^1$—, —N=$CR^1$—, —$CR^1$=$CR^1$—, —CO—, —SO— and/or —$SO_2$— moieties, where the overall ring system may be mono- or polysubstituted by: $C_1$-$C_{18}$-alkyl, $C_1$-$C_{12}$-alkoxy, $C_1$-$C_6$-alkylthio, —C≡$CR^1$, —$CR^1$=$CR^1{}_2$, hydroxyl, mercapto, halogen, cyano, nitro, —$NR^2R^3$, —$NR^2COR^3$, —$CONR^2R^3$, —$SO_2NR^2R^3$, —$COOR^2$, —$SO_3R^2$, aryl and/or hetaryl, each of which may be mono- or polysubstituted by $C_1$-$C_{18}$-alkyl, $C_1$-$C_{12}$-alkoxy, hydroxyl, mercapto, halogen, cyano, nitro, —$NR^2R^3$, —$NR^2COR^3$, —$CONR^2R^3$, —$SO_2NR^2R^3$, —$COOR^2$ and/or —$SO_3R^2$;

(iv) a —U-aryl radical which may be mono- or polysubstituted by the above radicals mentioned as substituents for the aryl radicals (iii), where U is a —O—, —S—, —$NR^1$—, —CO—, —SO— or —$SO_2$— moiety;

(v) $C_1$-$C_{12}$-alkoxy, $C_1$-$C_6$-alkylthio, —C≡$CR^1$, —$CR^1$=$CR^1{}_2$, hydroxyl, mercapto, halogen, cyano, nitro, —$NR^2R^3$, —$NR^2COR^3$, —$CONR^2R^3$, —$SO_2NR^2R^3$, —$COOR^2$ and/or —$SO_3R^2$; aromatic or heteroaromatic ring or ring system, each of which is fused to other aromatic rings of the structural unit of the formula (II) to (X) or (XX) to (XXVI), and to each of which may be fused further saturated or unsaturated 5-, 6- or 7-membered rings whose carbon skeleton may comprise one or more —O—, —S—, —$NR^1$—, —N=$CR^1$—, —CO—, —SO— and/or —$SO_2$— moieties, where the overall ring system may be mono- or polysubstituted by the radicals (i), (ii), (iii), (iv) and/or (v);

F, Cl, Br, CN, H when X is not a chemical bond;

where two R radicals may be joined to form one cyclic radical, where X and R, when n>1, may be the same or different;

$R^1$, $R^2$, $R^3$ are each independently hydrogen;

$C_1$-$C_{18}$-alkyl whose carbon chain may comprise one or more —O—, —S—, —CO—, —SO— and/or —$SO_2$— moieties and which may be mono- or polysubstituted by $C_1$-$C_{12}$-alkoxy, $C_1$-$C_6$-alkylthio, hydroxyl, mercapto, halogen, cyano, nitro and/or —$COOR^1$;

aryl or hetaryl, to each of which may be fused further saturated or unsaturated 5- to 7-membered rings whose carbon skeleton may comprise one or more —O—, —S—, —CO— and/or —$SO_2$— moieties, where the overall ring system may be mono- or polysubstituted by $C_1$-$C_{12}$-alkyl and/or the above radicals mentioned as substituents for alkyl.

Especially preferably,

X is a chemical bond, O, S, $NR^1$ and

R is an aliphatic or cycloaliphatic radical selected from $C_1$ to $C_{100}$ alkyl or cycloalkyl;

$C_6$ to $C_{22}$ aryl or $C_6$ to $C_{15}$ hetaryl, where the ring system thereof may be mono- or polysubstituted by the radicals (i), (ii), (iii), (iv) and/or (v):

(i) $C_1$-$C_{30}$-alkyl whose carbon chain may comprise one or more —O—, —S—, —NR$^1$—, C≡C—, —CR$^1$=CR$^1$— moieties, and which may be mono- or polysubstituted by: $C_1$-$C_{12}$-alkoxy, $C_1$-$C_6$-alkylthio, hydroxyl, halogen, cyano, nitro, —NR$^2$R$^3$;

(ii) $C_3$-$C_8$-cycloalkyl whose carbon skeleton may comprise one or more —O—, —S—, —NR$^1$—, —CR$^1$=CR$^1$— moieties and which may be mono- or polysubstituted by: $C_1$-$C_{18}$-alkyl, $C_1$-$C_{12}$-alkoxy;

(iii) aryl or hetaryl, where the ring system may be mono- or polysubstituted by: $C_1$-$C_{18}$-alkyl, $C_1$-$C_{12}$-alkoxy;

(iv) a —U-aryl radical which may be mono- or polysubstituted by the above radicals mentioned as substituents for the aryl radicals (iii), where U is a —O—, —S—, —NR$^1$—, —CO—, —SO— or —SO$_2$— moiety;

(v) $C_1$-$C_{12}$-alkoxy, hydroxyl, halogen, cyano, nitro, —NR$^2$R$^3$, —NR$^2$COR$^3$, —CONR$^2$R$^3$, —SO$_2$NR$^2$R$^3$, —COOR$^2$ or —SO$_3$R$^2$;

$C_6$ to $C_{22}$ aromatic or $C_6$ to $C_{15}$ heteroaromatic ring or ring system, each of which is fused to other aromatic rings of the structural unit of the formula (II) to (X) or (XX) to (XXVI), where the aromatic ring or aromatic ring system may be mono- or polysubstituted by the radicals (i), (ii), (iii), (iv) and/or (v);

H when X is not a chemical bond;

R$^1$, R$^2$, R$^3$ are each independently hydrogen; $C_1$-$C_{18}$-alkyl whose carbon chain may comprise one or more —O—, —S—, —CO—, —SO— and/or —SO$_2$— moieties and which may be mono- or polysubstituted by $C_1$-$C_{12}$-alkoxy, $C_1$-$C_6$-alkylthio, hydroxyl, mercapto, halogen, cyano, nitro and/or —COOR$^1$;

aryl or hetaryl, to each of which may be fused further saturated or unsaturated 5- to 7-membered rings whose carbon skeleton may comprise one or more —O—, —S—, —CO— and/or —SO$_2$— moieties, where the overall ring system may be mono- or polysubstituted by $C_1$-$C_{12}$-alkyl and/or the above radicals mentioned as substituents for alkyl In one embodiment, R comprises compounds with what is called swallowtail substitution, as specified in WO 2009/037283 A1 at page 16 line 19 to page 25 line 8. Accordingly, R may be selected, for example, from:

1-ethylpropyl, 1-methylpropyl, 1-propylbutyl, 1-ethylbutyl, 1-methylbutyl, 1-butylpentyl, 1-propylpentyl, 1-ethylpentyl, 1-methylpentyl, 1-pentylhexyl, 1-butylhexyl, 1-propylhexyl, 1-ethylhexyl, 1-methylhexyl, 1-hexylheptyl, 1-pentylheptyl, 1-butylheptyl, 1-propylheptyl, 1-ethylheptyl, 1-methylheptyl, 1-heptyloctyl, 1-hexyloctyl, 1-pentyloctyl, 1-butyloctyl, 1-propyloctyl, 1-ethyloctyl, 1-methyloctyl, 1-octylnonyl, 1-heptylnonyl, 1-hexylnonyl, 1-pentylnonyl, 1-butylnonyl, 1-propylnonyl, 1-ethylnonyl, 1-methylnonyl, 1-nonyldecyl, 1-octyldecyl, 1-heptyldecyl, 1-hexyldecyl, 1-pentyldecyl, 1-butyldecyl, 1-propyldecyl, 1-ethyldecyl, 1-methyldecyl, 1-decylundecyl, 1-nonylundecyl, 1-octylundecyl, 1-heptylundecyl, 1-hexylundecyl, 1-pentylundecyl, 1-butylundecyl, 1-propylundecyl, 1-ethylundecyl, 1-methylundecyl, 1-undecyldodecyl, 1-decyldodecyl, 1-nonyldodecyl, 1-octyldodecyl, 1-heptyldodecyl, 1-hexyldodecyl, 1-pentyldodecyl, 1-butyldodecyl, 1-propyldodecyl, 1-ethyldodecyl, 1-methyldodecyl, 1-dodecyltridecyl, 1-undecyltridecyl, 1-decyltridecyl, 1-nonyltridecyl, 1-octyltridecyl, 1-heptyltridecyl, 1-hexyltridecyl, 1-pentyltridecyl, 1-butyltridecyl, 1-propyltridecyl, 1-ethyltridecyl, 1-methyltridecyl, 1-tridecyltetradecyl, 1-undecyltetradecyl, 1-decyltetradecyl, 1-nonyltetradecyl, 1-octyltetradecyl, 1-heptyltetradecyl, 1-hexyltetradecyl, 1-pentytetradecyl, 1-butyltetradecyl, 1-propyltetradecyl, 1-ethyltetradecyl, 1-methyltetradecyl, 1-pentadecylhexadecyl, 1-tetradecylhexadecyl, 1-tridecylhexadecyl, 1-dodecylhexadecyl, 1-undecylhexadecyl, 1-decylhexadecyl, 1-nonylhexadecyl, 1-octylhexadecyl, 1-heptylhexadecyl, 1-hexylhexadecyl, 1-pentylhexadecyl, 1-butylhexadecyl, 1-propylhexadecyl, 1-ethylhexadecyl, 1-methylhexadecyl, 1-hexadecyloctadecyl, 1-pentadecyloctadecyl, 1-tetradecyloctadecyl, 1-tridecyloctadecyl, 1-dodecyloctadecyl, 1-undecyloctadecyl, 1-decyloctadecyl, 1-nonyloctadecyl, 1-octylocatedecyl, 1-heptyloctadecyl, 1-hexyloctadecyl, 1-pentyloctadecyl, 1-butyloctadecyl, 1-propyloctadecyl, 1-ethyloctadecyl, 1-methyloctadecyl 1-nonadecyleicosanyl, 1-octadecyleicosanyl, 1-heptadecyleicosanyl, 1-hexadecyleicosanyl, 1-pentadecyleicosanyl, 1-tetradecyleicosanyl, 1-tridecyleicosanyl, 1-dodecyleicosanyl, 1-undecyleicosanyl, 1-decyleicosanyl, 1-nonyleicosanyl, 1-octyleicosanyl, 1-heptyleicosanyl, 1-hexyleicosanyl, 1-pentyleicosanyl, 1-butyleicosanyl, 1-propyleicosanyl, 1-ethyleicosanyl, 1-methyeicosanyl, 1-eicosanyldocosanyl, 1-nonadecyldocosanyl, 1-octadecyldocosanyl, 1-heptadecyldocosanyl, 1-hexadecyldocosanyl, 1-pentadecyldocosanyl, 1-tetradecyldocosanyl, 1-tridecyldocosanyl, 1-undecyldocosanyl, 1-decyldocosanyl, 1-nonyldocosanyl, 1-octyldocosanyl, 1-heptyldocosanyl, 1-hexyldocosanyl, 1-pentyldocosanyl, 1-butyldocosanyl, 1-propyldocosanyl, 1-ethyldocosanyl, 1-methyldocosanyl 1-tricosanyltetracosanyl, 1-docosanyltetracosanyl, 1-nonadecyltetracosanyl, 1-octadecyltetracosanyl, 1-heptadecyltetracosanyl, 1-hexadecyltetracosanyl, 1-pentadecyltetracosanyl, 1-pentadecyltetracosanyl, 1-tetradecyltetracosanyl, 1-tridecyltetracosanyl, 1-dodecyltetracosanyl, 1-undecyltetracosanyl, 1-decyltetracosanyl, 1-nonyltetracosanyl, 1-octyltetracosanyl, 1-heptyltetracosanyl, 1-hexyltetracosanyl, 1-pentyltetracosanyl, 1-butyltetracosanyl, 1-propyltetracosanyl, 1-ethyltetracosanyl, 1-methyltetracosanyl, 1-heptacosanyloctacosanyl, 1-hexacosanyloctacosanyl, 1-pentacosanyloctacosanyl, 1-tetracosanyloctacosanyl, 1-tricosanyloctacosanyl, 1-docosanyloctacosanyl, 1-nonadecyloctacosanyl, 1-octadecyloctacosanyl, 1-heptadecyloctacosanyl, 1-hexadecyloctacosanyl, 1-hexadecyloctacosanyl, 1-pentadecyloctacosanyl, 1-tetradecyloctacosanyl, 1-tridecyloctacosanyl, 1-dodecyloctacosanyl, 1-undecyloctacosanyl, 1-decyloctacosanyl, 1-nonyloctacosanyl, 1-octyloctacosanyl, 1-heptyloctacosanyl, 1-hexyloctacosanyl, 1-pentyloctacosanyl, 1-butyloctacosanyl, 1-propyloctacosanyl, 1-ethyloctacosanyl, 1-methyloctacosanyl and homologs thereof.

Particularly preferred examples for the R radical specified in the compounds of the formula (II) are 1,2,2'-tribranched alkyl radicals. These are specifically:

1-(1-methylethyl)-2-methylpropyl, 1-(1-methylethyl)-2-methylbutyl, 1-(1-methylpropyl)-2-methylbutyl, 1-(1-ethylpropyl)-2-methylbutyl, 1-(1-methylpropyl)-2-ethylbutyl, 1-(1-ethylpropyl)-2-ethylbutyl, 1-(1-methylethyl)-2-methylpentyl, 1-(1-methylpropyl)-2-methylpentyl, 1-(1-ethylpropyl)-2-methylpentyl, 1-(1-methylpropyl)-2-ethylpentyl, 1-(1-ethylpropyl)-2-ethylpentyl, 1-(1-methylbutyl)-2-methylpentyl, 1-(1-ethylbutyl)-2-methylpentyl, 1-(1-propylbutyl)-2-methylpentyl, 1-(1-methylbutyl)-2-ethylpentyl, 1-(1-ethylbutyl)-2-ethylpentyl, 1-(1-propylbutyl)-2-ethylpentyl, 1-(1-methylbutyl)-2-propylpentyl, 1-(1-ethylbutyl)-2-propylpentyl, 1-(1-propylbutyl)-2-propylpentyl, 1-(1-methylethyl)-2-methylhexyl, 1-(1-methylpropyl)-2-methylhexyl, 1-(1-ethylpropyl)-2-methylhexyl, 1-(1-methylpropyl)-2-ethylhexyl, 1-(1-ethylpropyl)-2-ethylhexyl, 1-(1-methylbutyl)-2-methylhexyl, 1-(1-ethylbutyl)-2-methylhexyl, 1-(1-propylbutyl)-2-methylhexyl, 1-(1-methylbutyl)-2-ethylhexyl, 1-(1-ethylbutyl)-2-ethylhexyl, 1-(1-propylbutyl)-2-ethylhexyl, 1-(1-methylbutyl)-2-propylhexyl, 1-(1-ethylbutyl)-2-propylhexyl, 1-(1-propylbutyl)-2-propylhexyl, 1-(1-methylpentyl)-2-methylhexyl, 1-(1-ethylpentyl)-2-methylhexyl, 1-(1-propylpentyl)-2-methylhexyl, 1-(1-butylpentyl)-2-methylhexyl, 1-(1-methylpentyl)-2-ethylhexyl, 1-(1-ethylpentyl)-2-ethylhexyl, 1-(1-propylpentyl)-2-ethylhexyl, 1-(1-butylpentyl)-2-ethylhexyl, 1-(1-methylpentyl)-2-propylhexyl, 1-(1-ethylpentyl)-2-propylhexyl, 1-(1-propylpentyl)-2-propylhexyl, 1-(1-butylpentyl)-2-propylhexyl, 1-(1-methylpentyl)-2-butylhexyl, 1-(1-ethylpentyl)-2-butylhexyl, 1-(1-propylpentyl)-2-butylhexyl, 1-(1-butylpentyl)-2-butylhexyl, 1-(1-methylethyl)-2-methylheptyl, 1-(1-methylpropyl)-2-methylheptyl, 1-(1-ethylpropyl)-2-methylheptyl, 1-(1-methylpropyl)-2-ethylheptyl, 1-(1-ethylpropyl)-2-ethylheptyl, 1-(1-methylbutyl)-2-methylheptyl, 1-(1-ethylbutyl)-2-methylheptyl, 1-(1-propylbutyl)-2-methylheptyl, 1-(1-methylbutyl)-2-ethylheptyl, 1-(1-ethylbutyl)-2-ethylheptyl, 1-(1-propylbutyl)-2-ethylheptyl, 1-(1-methylbutyl)-2-propylheptyl, 1-(1-ethylbutyl)-2-propylheptyl, 1-(1-propylbutyl)-2-propylheptyl, 1-(1-methylpentyl)-2-methylheptyl, 1-(1-ethylpentyl)-2-methylheptyl, 1-(1-propylpentyl)-2-methylheptyl, 1-(1-butylpentyl)-2-methylheptyl, 1-(1-methylpentyl)-2-ethylheptyl, 1-(1-ethylpentyl)-2-ethylheptyl, 1-(1-propylpentyl)-2-ethylheptyl, 1-(1-butylpentyl)-2-ethylheptyl, 1-(1-methylpentyl)-2-propylheptyl, 1-(1-ethylpentyl)-2-propylheptyl, 1-(1-propylpentyl)-2-propylheptyl, 1-(1-butylpentyl)-2-propylheptyl, 1-(1-methylpentyl)-2-butylheptyl, 1-(1-ethylpentyl)-2-butylheptyl, 1-(1-propylpentyl)-2-butylheptyl, 1-(1-butylpentyl)-2-butylheptyl, 1-(1-methylhexyl)-2-methylheptyl, 1-(1-ethylhexyl)-2-methylheptyl, 1-(1-propylhexyl)-2-methylheptyl, 1-(1-butylhexyl)-2-methylheptyl, 1-(1-pentylhexyl)-2-methylheptyl, 1-(1-methylhexyl)-2-ethylheptyl, 1-(1-ethylhexyl)-2-ethylheptyl, 1-(1-propylhexyl)-2-ethylheptyl, 1-(1-butylhexyl)-2-ethylheptyl, 1-(1-pentylhexyl)-2-ethylheptyl, 1-(1-methylhexyl)-2-propylheptyl, 1-(1-ethylhexyl)-2-propylheptyl, 1-(1-propylhexyl)-2-propylheptyl, 1-(1-butylhexyl)-2-propylheptyl, 1-(1-pentylhexyl)-2-propylheptyl, 1-(1-methylhexyl)-2-butylheptyl, 1-(1-ethylhexyl)-2-butylheptyl, 1-(1-propylhexyl)-2-butylheptyl, 1-(1-butylhexyl)-2-butylheptyl, 1-(1-pentylhexyl)-2-butylheptyl, 1-(1-methylhexyl)-2-pentylheptyl, 1-(1-ethylhexyl)-2-pentylheptyl, 1-(1-propylhexyl)-2-pentylheptyl, 1-(1-butylhexyl)-2-pentylheptyl, 1-(1-pentylhexyl)-2-pentylheptyl, 1-(1-methylethyl)-2-methyloctyl, 1-(1-methylpropyl)-2-methyloctyl, 1-(1-ethylpropyl)-2-methyloctyl, 1-(1-methylpropyl)-2-ethyloctyl, 1-(1-ethylpropyl)-2-ethyloctyl, 1-(1-methylbutyl)-2-methyloctyl, 1-(1-ethylbutyl)-2-methyloctyl, 1-(1-propylbutyl)-2-methyloctyl, 1-(1-methylbutyl)-2-ethyloctyl, 1-(1-ethylbutyl)-2-ethyloctyl, 1-(1-propylbutyl)-2-ethyloctyl, 1-(1-methylbutyl)-2-propyloctyl, 1-(1-ethylbutyl)-2-propyloctyl, 1-(1-propylbutyl)-2-propyloctyl, 1-(1-methylpentyl)-2-methyloctyl, 1-(1-ethylpentyl)-2-methyloctyl, 1-(1-propylpentyl)-2-methyloctyl, 1-(1-butylpentyl)-2-methyloctyl, 1-(1-methylpentyl)-2-ethyloctyl, 1-(1-ethylpentyl)-2-ethyloctyl, 1-(1-propylpentyl)-2-ethyloctyl, 1-(1-butylpentyl)-2-ethyloctyl, 1-(1-methylpentyl)-2-propyloctyl, 1-(1-ethylpentyl)-2-propyloctyl, 1-(1-propylpentyl)-2-propyloctyl, 1-(1-butylpentyl)-2-propyloctyl, 1-(1-methylpentyl)-2-butyloctyl, 1-(1-ethylpentyl)-2-butyloctyl, 1-(1-propylpentyl)-2-butyloctyl, 1-(1-butylpentyl)-2-butyloctyl, 1-(1-methylhexyl)-2-methyloctyl, 1-(1-ethylhexyl)-2-methyloctyl, 1-(1-propylhexyl)-2-methyloctyl, 1-(1-butylhexyl)-2-methyloctyl, 1-(1-pentylhexyl)-2-methyloctyl, 1-(1-methylhexyl)-2-ethyloctyl, 1-(1-ethylhexyl)-2-ethyloctyl, 1-(1-propylhexyl)-2-ethyloctyl, 1-(1-butylhexyl)-2-ethyloctyl, 1-(1-pentylhexyl)-2-ethyloctyl, 1-(1-methylhexyl)-2-propyloctyl, 1-(1-ethylhexyl)-2-propyloctyl, 1-(1-propylhexyl)-2-propyloctyl, 1-(1-butylhexyl)-2-propyloctyl, 1-(1-pentylhexyl)-2-propyloctyl, 1-(1-methylhexyl)-2-butyloctyl, 1-(1-ethylhexyl)-2-butyloctyl, 1-(1-propylhexyl)-2-butyloctyl, 1-(1-butylhexyl)-2-butyloctyl, 1-(1-pentylhexyl)-2-butyloctyl, 1-(1-methylhexyl)-2-pentyloctyl, 1-(1-ethylhexyl)-2-pentyloctyl, 1-(1-propylhexyl)-2-pentyloctyl, 1-(1-butylhexyl)-2-pentyloctyl, 1-(1-pentylhexyl)-2-pentyloctyl, 1-(1-methylheptyl)-2-methyloctyl, 1-(1-ethylheptyl)-2-methyloctyl, 1-(1-propylheptyl)-2-methyloctyl, 1-(1-butylheptyl)-2-methyloctyl, 1-(1-pentylheptyl)-2-methyloctyl, 1-(1-hexylheptyl)-2-methyloctyl, 1-(1-methylheptyl)-2-ethyloctyl, 1-(1-ethylheptyl)-2-ethyloctyl, 1-(1-propylheptyl)-2-ethyloctyl, 1-(1-butylheptyl)-2-ethyloctyl, 1-(1-pentylheptyl)-2-ethyloctyl, 1-(1-hexylheptyl)-2-ethyloctyl, 1-(1-methylheptyl)-2-propyloctyl, 1-(1-ethylheptyl)-2-propyloctyl, 1-(1-propylheptyl)-2-propyloctyl, 1-(1-butylheptyl)-2-propyloctyl, 1-(1-pentylheptyl)-2-propyloctyl, 1-(1-hexylheptyl)-2-propyloctyl, 1-(1-methylheptyl)-2-butyloctyl, 1-(1-ethylheptyl)-2-butyloctyl, 1-(1-propylheptyl)-2-butyloctyl, 1-(1-butylheptyl)-2-butyloctyl, 1-(1-pentylheptyl)-2-butyloctyl, 1-(1-hexylheptyl)-2-butyloctyl, 1-(1-methylheptyl)-2-pentyloctyl, 1-(1-ethylheptyl)-2-pentyloctyl, 1-(1-propylheptyl)-2-pentyloctyl, 1-(1-butylheptyl)-2-pentyloctyl, 1-(1-pentylheptyl)-2-pentyloctyl, 1-(1-hexylheptyl)-2-pentyloctyl, 1-(1-methylheptyl)-2-hexyloctyl, 1-(1-ethylheptyl)-2-hexyloctyl, 1-(1-propylheptyl)-2-hexyloctyl, 1-(1-butylheptyl)-2-hexyloctyl, 1-(1-pentylheptyl)-2-hexyloctyl, 1-(1-hexylheptyl)-2-hexyloctyl, 1-(1-methylethyl)-2-methylnonyl, 1-(1-methylpropyl)-2-methylnonyl, 1-(1-ethylpropyl)-2-methylnonyl, 1-(1-methylpropyl)-2-ethylnonyl, 1-(1-ethylpropyl)-2-ethylnonyl, 1-(1-methylbutyl)-2-methylnonyl, 1-(1-ethylbutyl)-2-methylnonyl, 1-(1-propylbutyl)-2-methylnonyl, 1-(1-methylbutyl)-2-ethylnonyl, 1-(1-ethylbutyl)-2-ethylnonyl, 1-(1-propylbutyl)-2-ethylnonyl, 1-(1-methylbutyl)-2-propylnonyl, 1-(1-ethylbutyl)-2-propylnonyl, 1-(1-propylbutyl)-2-propylnonyl, 1-(1-methylpentyl)-2-methylnonyl, 1-(1-ethylpentyl)-2-methylnonyl, 1-(1-propylpentyl)-2-methylnonyl, 1-(1-butylpentyl)-2-methylnonyl, 1-(1-methylpentyl)-2-ethylnonyl, 1-(1-ethylpentyl)-2-ethylnonyl, 1-(1-propylpentyl)-2-ethylnonyl, 1-(1-butylpentyl)-2-ethylnonyl, 1-(1-methylpentyl)-2-propylnonyl, 1-(1-ethylpentyl)-2-propylnonyl, 1-(1-propylpentyl)-2-propylnonyl, 1-(1-butylpentyl)-2-propylnonyl, 1-(1-methylpentyl)-2-butylnonyl, 1-(1-ethylpentyl)-2-butylnonyl, 1-(1-propylpentyl)-2-butylnonyl, 1-(1-butylpentyl)-2-butylnonyl, 1-(1-methylhexyl)-2-methylnonyl, 1-(1-ethylhexyl)-2-methylnonyl, 1-(1-propylhexyl)-2-methylnonyl, 1-(1-butylhexyl)-2-methylnonyl, 1-(1-pentylhexyl)-2-methylnonyl, 1-(1-methylhexyl)-2-ethylnonyl, 1-(1-ethylhexyl)-2-ethylnonyl, 1-(1-propylhexyl)-2-ethylnonyl, 1-(1-butylhexyl)-2-ethylnonyl, 1-(1-pentylhexyl)-2-ethylnonyl, 1-(1-methylhexyl)-2-propylnonyl, 1-(1-ethylhexyl)-2-propylnonyl, 1-(1-propylhexyl)-2-propylnonyl, 1-(1-butylhexyl)-2-propylnonyl, 1-(1-pentylhexyl)-2-propylnonyl, 1-(1-methylhexyl)-2-butylnonyl, 1-(1-ethylhexyl)-2-butylnonyl, 1-(1-propylhexyl)-2-butylnonyl, 1-(1-butylhexyl)-2-butylnonyl, 1-(1-pentylhexyl)-2-butylnonyl, 1-(1-methylhexyl)-2-pentylnonyl, 1-(1-ethylhexyl)-2-pentylnonyl, 1-(1-propylhexyl)-2-pentylnonyl, 1-(1-butylhexyl)-2-pentylnonyl, 1-(1-pentylhexyl)-2-pentylnonyl, 1-(1-methylheptyl)-2-methylnonyl, 1-(1-ethylheptyl)-2-methylnonyl, 1-(1-propylheptyl)-2-methylnonyl, 1-(1-butylheptyl)-2-methylnonyl, 1-(1-pentylheptyl)-2-methylnonyl, 1-(1-hexylheptyl)-2-methylnonyl, 1-(1-methylheptyl)-2-ethylnonyl, 1-(1-ethylheptyl)-2-ethylnonyl, 1-(1-propylheptyl)-2-ethylnonyl, 1-(1-butylheptyl)-2-ethylnonyl, 1-(1-pentylheptyl)-2-ethylnonyl, 1-(1-hexylheptyl)-2-ethylnonyl, 1-(1-methylheptyl)-2-propylnonyl, 1-(1-ethylheptyl)-2-propylnonyl, 1-(1-propylheptyl)-2-propylnonyl, 1-(1-butylheptyl)-2-propylnonyl, 1-(1-pentylheptyl)-2-propylnonyl, 1-(1-hexylheptyl)-2-propylnonyl, 1-(1-methylheptyl)-2-butylnonyl, 1-(1-ethylheptyl)-2-butylnonyl, 1-(1-propylheptyl)-2-butylnonyl, 1-(1-butylheptyl)-2-butylnonyl, 1-(1-pentylheptyl)-2-butylnonyl, 1-(1-hexylheptyl)-2-butylnonyl, 1-(1-methylheptyl)-2-pentylnonyl, 1-(1-ethylheptyl)-2-pentylnonyl, 1-(1-propylheptyl)-2-pentylnonyl, 1-(1-butylheptyl)-2-pentylnonyl, 1-(1-pentylheptyl)-2-pentylnonyl, 1-(1-hexylheptyl)-2-pentylnonyl, 1-(1-methylheptyl)-2-hexylnonyl, 1-(1-ethylheptyl)-2-hexylnonyl, 1-(1-propylheptyl)-2-hexylnonyl, 1-(1-butylheptyl)-2-hexylnonyl, 1-(1-pentylheptyl)-2-hexylnonyl, 1-(1-hexylheptyl)-2-hexylnonyl, 1-(1-methyloctyl)-2-methylnonyl, 1-(1-ethyloctyl)-2-methylnonyl, 1-(1-propyloctyl)-2-methylnonyl, 1-(1-butyloctyl)-2-methylnonyl, 1-(1-pentyloctyl)-2-methylnonyl, 1-(1-hexyloctyl)-2-methylnonyl, 1-(1-heptyloctyl)-2-methylnonyl, 1-(1-methyloctyl)-2-ethylnonyl, 1-(1-ethyloctyl)-2-ethylnonyl, 1-(1-propyloctyl)-2-ethylnonyl, 1-(1-butyloctyl)-2-ethylnonyl, 1-(1-pentyloctyl)-2-ethylnonyl, 1-(1-hexyloctyl)-2-ethylnonyl, 1-(1-heptyloctyl)-2-ethylnonyl, 1-(1-methyloctyl)-2-propylnonyl, 1-(1-ethyloctyl)-2-propylnonyl, 1-(1-propyloctyl)-2-propylnonyl, 1-(1-butyloctyl)-2-propylnonyl, 1-(1-pentyloctyl)-2-propylnonyl, 1-(1-hexyloctyl)-2-propylnonyl, 1-(1-heptyloctyl)-2-propylnonyl, 1-(1-methyloctyl)-2-butylnonyl, 1-(1-ethyloctyl)-2-butylnonyl, 1-(1-propyloctyl)-2-butylnonyl, 1-(1-butyloctyl)-2-butylnonyl, 1-(1-pentyloctyl)-2-butylnonyl, 1-(1-hexyloctyl)-2-butylnonyl, 1-(1-heptyloctyl)-2-butylnonyl, 1-(1-methyloctyl)-2-pentylnonyl, 1-(1-ethyloctyl)-2-pentylnonyl, 1-(1-propyloctyl)-2-pentylnonyl, 1-(1-butyloctyl)-2-pentylnonyl, 1-(1-pentyloctyl)-2-pentylnonyl, 1-(1-hexyloctyl)-2-pentylnonyl, 1-(1-heptyloctyl)-2-pentylnonyl, 1-(1-methyloctyl)-2-hexylnonyl, 1-(1-ethyloctyl)-2-hexylnonyl, 1-(1-propyloctyl)-2-hexylnonyl, 1-(1-butyloctyl)-2-hexylnonyl, 1-(1-pentyloctyl)-2-hexylnonyl, 1-(1-hexyloctyl)-2-hexylnonyl, 1-(1-heptyloctyl)-2-heptylnonyl, 1-(1-methyloctyl)-2-heptylnonyl, 1-(1-ethyloctyl)-2-heptylnonyl, 1-(1-propyloctyl)-2-heptylnonyl, 1-(1-butyloctyl)-2-heptylnonyl, 1-(1-pentyloctyl)-2-heptylnonyl, 1-(1-hexyloctyl)-2-heptylnonyl, 1-(1-heptyloctyl)-2-heptylnonyl, 1-(1-methylethyl)-2-methyldecyl, 1-(1-methylpropyl)-2-methyldecyl, 1-(1-ethylpropyl)-2-methyldecyl, 1-(1-methylpropyl)-2-ethyldecyl, 1-(1-ethylpropyl)-2-ethyldecyl, 1-(1-methylbutyl)-2-methyldecyl, 1-(1-ethylbutyl)-2-methyldecyl, 1-(1-propylbutyl)-2-methyldecyl, 1-(1-methylbutyl)-2-ethyldecyl, 1-(1-ethylbutyl)-2-ethyldecyl, 1-(1-propylbutyl)-2-ethyldecyl, 1-(1-methylbutyl)-2-propyldecyl, 1-(1-ethylbutyl)-2-propyldecyl, 1-(1-propylbutyl)-2-propyldecyl, 1-(1-methylpentyl)-2-methyldecyl, 1-(1-ethylpentyl)-2-methyldecyl, 1-(1-propylpentyl)-2-methyldecyl, 1-(1-butylpentyl)-2-methyldecyl, 1-(1-methylpentyl)-2-ethyldecyl, 1-(1-ethylpentyl)-2-ethyldecyl, 1-(1-propylpentyl)-2-ethyldecyl, 1-(1-butylpentyl)-2-ethyldecyl, 1-(1-methylpentyl)-2-propyldecyl, 1-(1-ethylpentyl)-2-propyldecyl, 1-(1-propylpentyl)-2-propyldecyl, 1-(1-butylpentyl)-2-propyldecyl, 1-(1-methylpentyl)-2-butyldecyl, 1-(1-ethylpentyl)-2-butyldecyl, 1-(1-propylpentyl)-2-butyldecyl, 1-(1-butylpentyl)-2-butyldecyl, 1-(1-methylhexyl)-2-methyldecyl, 1-(1-ethylhexyl)-2-methyldecyl, 1-(1-propylhexyl)-2-methyldecyl, 1-(1-butylhexyl)-2-methyldecyl, 1-(1-pentylhexyl)-2-methyldecyl, 1-(1-methylhexyl)-2-ethyldecyl, 1-(1-ethylhexyl)-2-ethyldecyl, 1-(1-propylhexyl)-2-ethyldecyl, 1-(1-butylhexyl)-2-ethyldecyl, 1-(1-pentylhexyl)-2-ethyldecyl, 1-(1-methylhexyl)-2-propyldecyl, 1-(1-ethylhexyl)-2-propyldecyl, 1-(1-propylhexyl)-2-propyldecyl, 1-(1-butylhexyl)-2-propyldecyl, 1-(1-pentylhexyl)-2-propyldecyl, 1-(1-methylhexyl)-2-butyldecyl, 1-(1-ethylhexyl)-2-butyldecyl, 1-(1-propylhexyl)-2-butyldecyl, 1-(1-butylhexyl)-2-butyldecyl, 1-(1-pentylhexyl)-2-butyldecyl, 1-(1-methylhexyl)-2-pentyldecyl, 1-(1-ethylhexyl)-2-pentyldecyl, 1-(1-propylhexyl)-2-pentyldecyl, 1-(1-butylhexyl)-2-pentyldecyl, 1-(1-pentylhexyl)-2-pentyldecyl, 1-(1-methylheptyl)-2-methyldecyl, 1-(1-ethylheptyl)-2-methyldecyl, 1-(1-propylheptyl)-2-methyldecyl, 1-(1-butylheptyl)-2-methyldecyl, 1-(1-pentylheptyl)-2-methyldecyl, 1-(1-hexylheptyl)-2-methyldecyl, 1-(1-methylheptyl)-2-ethyldecyl, 1-(1-ethylheptyl)-2-ethyldecyl, 1-(1-propylheptyl)-2-ethyldecyl, 1-(1-butylheptyl)-2-ethyldecyl, 1-(1-pentylheptyl)-2-ethyldecyl, 1-(1-hexylheptyl)-2-ethyldecyl, 1-(1-methylheptyl)-2-propyldecyl, 1-(1-ethylheptyl)-2-propyldecyl, 1-(1-propylheptyl)-2-propyldecyl, 1-(1-butylheptyl)-2-propyldecyl, 1-(1-pentylheptyl)-2-propyldecyl, 1-(1-hexylheptyl)-2-propyldecyl, 1-(1-methylheptyl)-2-butyldecyl, 1-(1-ethylheptyl)-2-butyldecyl, 1-(1-propylheptyl)-2-butyldecyl, 1-(1-butylheptyl)-2-butyldecyl, 1-(1-pentylheptyl)-2-butyldecyl, 1-(1-hexylheptyl)-2-butyldecyl, 1-(1-methylheptyl)-2-pentyldecyl, 1-(1-ethylheptyl)-2-pentyldecyl, 1-(1-propylheptyl)-2-pentyldecyl, 1-(1-butylheptyl)-2-pentyldecyl, 1-(1-pentylheptyl)-2-pentyldecyl, 1-(1-hexylheptyl)-2-pentyldecyl, 1-(1-methylheptyl)-2-hexyldecyl, 1-(1-ethylheptyl)-2-hexyldecyl, 1-(1-propylheptyl)-2-hexyldecyl, 1-(1-butylheptyl)-2-hexyldecyl, 1-(1-pentylheptyl)-2-hexyldecyl, 1-(1-hexylheptyl)-2-hexyldecyl, 1-(1-methyloctyl)-2-methyldecyl, 1-(1-ethyloctyl)-2-methyldecyl, 1-(1-propyloctyl)-2-methyldecyl, 1-(1-butyloctyl)-2-methyldecyl, 1-(1-pentyloctyl)-2-methyldecyl, 1-(1-hexyloctyl)-2-methyldecyl, 1-(1-heptyloctyl)-2-methyldecyl, 1-(1-methyloctyl)-2-ethyldecyl, 1-(1-ethyloctyl)-2-ethyldecyl, 1-(1-propyloctyl)-2-ethyldecyl, 1-(1-butyloctyl)-2-ethyldecyl, 1-(1-pentyloctyl)-2-ethyldecyl, 1-(1-hexyloctyl)-2-ethyldecyl, 1-(1-heptyloctyl)-2-ethyldecyl, 1-(1-methyloctyl)-2-propyldecyl, 1-(1-ethyloctyl)-2-propyldecyl, 1-(1-propyloctyl)-2-propyldecyl, 1-(1-butyloctyl)-2-propyldecyl, 1-(1-pentyloctyl)-2-propyldecyl, 1-(1-hexyloctyl)-2-propyldecyl, 1-(1-heptyloctyl)-2-propyldecyl, 1-(1-methyloctyl)-2-butyldecyl, 1-(1-ethyloctyl)-2-butyldecyl, 1-(1-propyloctyl)-2-butyldecyl, 1-(1-butyloctyl)-2-butyldecyl, 1-(1-pentyloctyl)-2-butyldecyl, 1-(1-hexyloctyl)-2-butyldecyl, 1-(1-heptyloctyl)-2-butyldecyl, 1-(1-methyloctyl)-2-pentyldecyl, 1-(1-ethyloctyl)-2-pentyldecyl, 1-(1-propyloctyl)-2-pentyldecyl, 1-(1-butyloctyl)-2-pentyldecyl, 1-(1-pentyloctyl)-2-pentyldecyl, 1-(1-hexyloctyl)-2-pentyldecyl, 1-(1-heptyloctyl)-2-pentyldecyl, 1-(1-methyloctyl)-2-hexyldecyl, 1-(1-ethyloctyl)-2-hexyldecyl, 1-(1-propyloctyl)-2-hexyldecyl, 1-(1-butyloctyl)-2-hexyldecyl, 1-(1-pentyloctyl)-2-hexyldecyl, 1-(1-hexyloctyl)-2-hexyldecyl, 1-(1-heptyloctyl)-2-heptyldecyl, 1-(1-methyloctyl)-2-heptyldecyl, 1-(1-ethyloctyl)-2-heptyldecyl, 1-(1-propyloctyl)-2-heptyldecyl, 1-(1-butyloctyl)-2-heptyldecyl, 1-(1-pentyloctyl)-2-heptyldecyl, 1-(1-hexyloctyl)-2-heptyldecyl, 1-(1-heptyloctyl)-2-heptyldecyl, 1-(1-methylnonyl)-2-methyldecyl, 1-(1-ethylnonyl)-2-methyldecyl, 1-(1-propylnonyl)-2-methyldecyl, 1-(1-butylnonyl)-2-methyldecyl, 1-(1-pentylnonyl)-2-methyldecyl, 1-(1-hexylnonyl)-2-methyldecyl, 1-(1-heptylnonyl)-2-methyldecyl, 1-(1-octylnonyl)-2-methyldecyl, 1-(1-methylnonyl)-2-ethyldecyl, 1-(1-ethylnonyl)-2-ethyldecyl, 1-(1-propylnonyl)-2-ethyldecyl, 1-(1-butylnonyl)-2-ethyldecyl, 1-(1-pentylnonyl)-2-ethyldecyl, 1-(1-hexylnonyl)-2-ethyldecyl, 1-(1-heptylnonyl)-2-ethyldecyl, 1-(1-octylnonyl)-2-ethyldecyl, 1-(1-methylnonyl)-2-propyldecyl, 1-(1-ethylnonyl)-2-propyldecyl, 1-(1-propylnonyl)-2-propyldecyl, 1-(1-butylnonyl)-2-propyldecyl, 1-(1-pentylnonyl)-2-propyldecyl, 1-(1-hexylnonyl)-2-propyldecyl, 1-(1-heptylnonyl)-2-propyldecyl, 1-(1-octylnonyl)-2-propyldecyl, 1-(1-methylnonyl)-2-butyldecyl, 1-(1-ethylnonyl)-2-butyldecyl, 1-(1-propylnonyl)-2-butyldecyl, 1-(1-butylnonyl)-2-butyldecyl, 1-(1-pentylnonyl)-2-butyldecyl, 1-(1-hexylnonyl)-2-butyldecyl, 1-(1-heptylnonyl)-2-butyldecyl, 1-(1-octylnonyl)-2-butyldecyl, 1-(1-methylnonyl)-2-pentyldecyl, 1-(1-ethylnonyl)-2-pentyldecyl, 1-(1-propylnonyl)-2-pentyldecyl, 1-(1-butylnonyl)-2-pentyldecyl, 1-(1-pentylnonyl)-2-pentyldecyl, 1-(1-hexylnonyl)-2-pentyldecyl, 1-(1-heptylnonyl)-2-pentyldecyl, 1-(1-octylnonyl)-2-pentyldecyl, 1-(1-methylnonyl)-2-hexyldecyl, 1-(1-ethylnonyl)-2-hexyldecyl, 1-(1-propylnonyl)-2-hexyldecyl, 1-(1-butylnonyl)-2-hexyldecyl, 1-(1-pentylnonyl)-2-hexyldecyl, 1-(1-hexylnonyl)-2-hexyldecyl, 1-(1-heptylnonyl)-2-hexyldecyl, 1-(1-octylnonyl)-2-hexyldecyl, 1-(1-methylnonyl)-2-heptyldecyl, 1-(1-ethylnonyl)-2-heptyldecyl, 1-(1-propylnonyl)-2-heptyldecyl, 1-(1-butylnonyl)-2-heptyldecyl, 1-(1-pentylnonyl)-2-heptyldecyl, 1-(1-hexylnonyl)-2-heptyldecyl, 1-(1-heptylnonyl)-2-heptyldecyl, 1-(1-octylnonyl)-2-heptyldecyl, 1-(1-methylnonyl)-2-octyldecyl, 1-(1-ethylnonyl)-2-octyldecyl, 1-(1-propylnonyl)-2-octyldecyl, 1-(1-butylnonyl)-2-octyldecyl, 1-(1-pentylnonyl)-2-octyldecyl, 1-(1-hexylnonyl)-2-octyldecyl, 1-(1-heptylnonyl)-2-octyldecyl, 1-(1-octylnonyl)-2-octyldecyl, 1-(1-nonyldecyl)-2-nonylundecyl, 1-(1-decylundecyl)-2-decyldodecyl, 1-(1-undecyldodecyl)-2-undecyltridecyl, 1-(1-dodecyltridecyl)-2-dodecyltetradecyl and homologs thereof.

Very particularly preferred R radicals are 1-(1-methylethyl)-2-methylpropyl, 1-(1-ethylpropyl)-2-ethylbutyl, 1-(1-propylbutyl)-2-propylpentyl, 1-(1-butylpentyl)-2-butylhexyl, 1-(1-pentylhexyl)-2-pentylheptyl, 1-(1-hexylheptyl)-2-hexyloctyl, 1-(1-heptyloctyl)-2-heptylnonyl, 1-(1-octylnonyl)-2-octyldecyl, 1-(1-nonyldecyl)-2-nonylundecyl, 1-(1-decylundecyl)-2-decyldodecyl, 1-(1-undecyldodecyl)-2-undecyltridecyl und 1-(1-dodecyltridecyl)-2-dodecyltetradecyl.

In a preferred embodiment, R is a 1-alkylalkyl, for example 1-ethylpropyl, 1-propylbutyl, 1-butylpentyl, 1-pentylhexyl or 1-hexylheptyl.

Further examples of preferred (X—R) radicals are:
methyl, ethyl, propyl, isopropyl, butyl, isobutyl, tert-butyl, pentyl, isopentyl, neopentyl, tert-pentyl, hexyl, 2-methylpentyl, heptyl, 1-ethylpentyl, octyl, 2-ethylhexyl, isooctyl, nonyl, isononyl, decyl, isodecyl, undecyl, dodecyl, tridecyl, isotridecyl, tetradecyl, pentadecyl, hexadecyl, heptadecyl, octadecyl, nonadecyl and eicosyl (the above terms isooctyl, isononyl, isodecyl and isotridecyl are trivial terms and stem from the alcohols obtained by the oxo process);
2-methoxyethyl, 2-ethoxyethyl, 2-propoxyethyl, 2-isopropoxyethyl, 2-butoxyethyl, 2- and 3-methoxypropyl, 2- and 3-ethoxypropyl, 2- and 3-propoxypropyl, 2- and 3-butoxypropyl, 2- and 4-methoxybutyl, 2- and 4-ethoxybutyl, 2- and 4-propoxybutyl, 3,6-dioxaheptyl, 3,6-dioxaoctyl, 4,8-dioxanonyl, 3,7-dioxaoctyl, 3,7-dioxanonyl, 4,7-dioxaoctyl, 4,7-dioxanonyl, 2- and 4-butoxy-butyl, 4,8-dioxadecyl, 3,6,9-trioxadecyl, 3,6,9-trioxaundecyl, 3,6,9-trioxadodecyl, 3,6,9,12-tetra-oxatridecyl and 3,6,9,12-tetraoxatetradecyl;

2-methylthioethyl, 2-ethylthioethyl, 2-propylthioethyl, 2-isopropylthioethyl, 2-butylthioethyl, 2- and 3-methylthiopropyl, 2- and 3-ethylthiopropyl, 2- and 3-propylthiopropyl, 2- and 3-butyl-thiopropyl, 2- and 4-methylthiobutyl, 2- and 4-ethylthiobutyl, 2- and 4-propylthiobutyl, 3,6-dithia-heptyl, 3,6-dithiaoctyl, 4,8-dithianonyl, 3,7-dithiaoctyl, 3,7-dithianonyl, 2- and 4-butylthiobutyl, 4,8-dithiadecyl, 3,6,9-trithiadecyl, 3,6,9-trithiaundecyl, 3,6,9-trithiadodecyl, 3,6,9,12-tetra-thiatridecyl and 3,6,9,12-tetrathiatetradecyl;
2-monomethyl- and 2-monoethylaminoethyl, 2-dimethylaminoethyl, 2- and 3-dimethylamino-propyl, 3-monoisopropylaminopropyl, 2- and 4-monopropylaminobutyl, 2- and 4-dimethyl-aminobutyl, 6-methyl-3,6-diazaheptyl, 3,6-dimethyl-3,6-diazaheptyl, 3,6-diazaoctyl, 3,6-dimethyl-3,6-diazaoctyl, 9-methyl-3,6,9-triazadecyl, 3,6,9-trimethyl-3,6,9-triazadecyl, 3,6,9-triazaundecyl, 3,6,9-trimethyl-3,6,9-triazaundecyl, 12-methyl-3,6,9,12-tetraazatridecyl and 3,6,9,12-tetramethyl-3,6,9,12-tetraazatridecyl;
(1-ethylethylidene)aminoethylene, (1-ethylethylidene)aminopropylene, (1-ethylethylidene)-aminobutylene, (1-ethylethylidene)aminodecylene and (1-ethylethylidene)aminododecylene;
propan-2-on-1-yl, butan-3-on-1-yl, butan-3-on-2-yl and 2-ethylpentan-3-on-1-yl;
2-methylsulphoxidoethyl, 2-ethylsulphoxidoethyl, 2-propylsulphoxidoethyl, 2-isopropylsulph-oxidoethyl, 2-butylsulphoxidoethyl, 2- and 3-methylsulphoxidopropyl, 2- and 3-ethylsulph-oxidopropyl, 2- and 3-propylsulphoxidopropyl, 2- and 3-butylsulphoxidopropyl, 2- and 4-methyl-sulphoxidobutyl, 2- and 4-ethylsulphoxidobutyl, 2- and 4-propylsulphoxidobutyl and 4-butyl-sulphoxidobutyl;
2-methylsulphonylethyl, 2-ethylsulphonylethyl, 2-propylsulphonylethyl, 2-isopropylsulphonyl-ethyl, 2-butylsulphonylethyl, 2- and 3-methylsulphonylpropyl, 2- and 3-ethylsulphonylpropyl, 2- and 3-propylsulphonylpropyl, 2- and 3-butylsulphonylpropyl, 2- and 4-methylsulphonylbutyl, 2- and 4-ethylsulphonylbutyl, 2- and 4-propylsulphonylbutyl and 4-butylsulphonylbutyl;
carboxymethyl, 2-carboxyethyl, 3-carboxypropyl, 4-carboxybutyl, 5-carboxypentyl, 6-carboxyhexyl, 8-carboxyoctyl, 10-carboxydecyl, 12-carboxydodecyl and 14-carboxytetradecyl;
sulphomethyl, 2-sulphoethyl, 3-sulphopropyl, 4-sulphobutyl, 5-sulphopentyl, 6-sulphohexyl, 8-sulphooctyl, 10-sulphodecyl, 12-sulphododecyl and 14-sulphotetradecyl;
2-hydroxyethyl, 2- and 3-hydroxypropyl, 1-hydroxyprop-2-yl, 3- and 4-hydroxybutyl, 1-hydroxy-but-2-yl and 8-hydroxy-4-oxaoctyl;
2-cyanoethyl, 3-cyanopropyl, 3- and 4-cyanobutyl, 2-methyl-3-ethyl-3-cyanopropyl, 7-cyano-7-ethylheptyl and 4,7-dimethyl-7-cyanoheptyl;
2-chloroethyl, 2- and 3-chloropropyl, 2-, 3- and 4-chlorobutyl, 2-bromoethyl, 2- and 3-bromo-propyl and 2-, 3- and 4-bromobutyl;
2-nitroethyl, 2- and 3-nitropropyl and 2-, 3- and 4-nitrobutyl;
methoxy, ethoxy, propoxy, isopropoxy, butoxy, isobutoxy, sec-butoxy, tert-butoxy, pentoxy, isopentoxy, neopentoxy, tert-pentoxy and hexoxy;
methylthio, ethylthio, propylthio, isopropylthio, butylthio, isobutylthio, sec-butylthio, tert-butylthio, pentylthio, isopentylthio, neopentylthio, tert-pentylthio and hexylthio;
ethynyl, 1- and 2-propynyl, 1-, 2- and 3-butynyl, 1-, 2-, 3- and 4-pentynyl, 1-, 2-, 3-, 4- and 5-hexynyl, 1-, 2-, 3-, 4-, 5-, 6-, 7-, 8- and 9-decynyl, 1-, 2-, 3-, 4-, 5-, 6-, 7-, 8-, 9-, 10- and 11-dodecynyl and 1-, 2-, 3-, 4-, 5-, 6-, 7-, 8-, 9-, 10-, 11-, 12-, 13-, 14-, 15-, 16- and 17-octadecynyl;

ethenyl, 1- and 2-propenyl, 1-, 2- and 3-butenyl, 1-, 2-, 3- and 4-pentenyl, 1-, 2-, 3-, 4- and 5-hexenyl, 1-, 2-, 3-, 4-, 5-, 6-, 7-, 8- and 9-decenyl, 1-, 2-, 3-, 4-, 5-, 6-, 7-, 8-, 9-, 10- and 11-dodecenyl and 1-, 2-, 3-, 4-, 5-, 6-, 7-, 8-, 9-, 10-, 11-, 12-, 13-, 14-, 15-, 16- and 17-octadecenyl;

methylamino, ethylamino, propylamino, isopropylamino, butylamino, isobutylamino, pentylamino, hexylamino, dimethylamino, methylethylamino, diethylamino, dipropylamino, diisopropylamino, dibutylamino, diisobutylamino, dipentylamino, dihexylamino, dicyclopentyl-amino, dicyclohexylamino, dicycloheptylamino, diphenylamino and dibenzylamino;

formylamino, acetylamino, propionylamino and benzoylamino;

carbamoyl, methylaminocarbonyl, ethylaminocarbonyl, propylaminocarbonyl, butylamino-carbonyl, pentylaminocarbonyl, hexylaminocarbonyl, heptylaminocarbonyl, octylaminocarbonyl, nonylaminocarbonyl, decylaminocarbonyl and phenylaminocarbonyl;

aminosulphonyl, N,N-dimethylaminosulphonyl, N,N-diethylaminosulphonyl, N-methyl-N-ethylaminosulphonyl, N-methyl-N-dodecylaminosulphonyl, N-dodecylaminosulphonyl, (N,N-dimethyl-amino)ethylaminosulphonyl, N-(propoxyethyl)dodecylaminosulphonyl, N,N-diphenylamino-sulphonyl, N,N-(4-tert-butylphenyl)octadecylaminosulphonyl and N,N-bis(4-chlorophenyl)-aminosulphonyl;

methoxycarbonyl, ethoxycarbonyl, propoxycarbonyl, isopropoxycarbonyl, hexoxycarbonyl, dodecyloxycarbonyl, octadecyloxycarbonyl, phenoxycarbonyl, (4-tert-butyl-phenoxy)carbonyl and (4-chlorophenoxy)carbonyl;

methoxysulphonyl, ethoxysulphonyl, propoxysulphonyl, isopropoxysulphonyl, butoxysulphonyl, isobutoxysulphonyl, tert-butoxysulphonyl, hexoxysulphonyl, dodecyloxysulphonyl, octadecyl-oxysulphonyl, phenoxysulphonyl, 1- and 2-naphthyloxysulphonyl, (4-tert-butylphenoxy)sulphonyl and (4-chlorophenoxy)sulphonyl;

diphenylphosphino, di(o-tolyl)phosphino and diphenylphosphinoxido;

chlorine, bromine;

phenylazo, 2-naphthylazo, 2-pyridylazo and 2-pyrimidylazo;

cyclopropyl, cyclobutyl, cyclopentyl, 2- and 3-methylcyclopentyl, 2- and 3-ethylcyclopentyl, cyclohexyl, 2-, 3- and 4-methylcyclohexyl, 2-, 3- and 4-ethylcyclohexyl, 3- and 4-propylcyclo-hexyl, 3- and 4-isopropylcyclohexyl, 3- and 4-butylcyclohexyl, 3- and 4-sec-butylcyclohexyl, 3- and 4-tert-butylcyclohexyl, cycloheptyl, 2-, 3- and 4-methylcycloheptyl, 2-, 3- and 4-ethylcyclo-heptyl, 3- and 4-propylcycloheptyl, 3- and 4-isopropylcycloheptyl, 3- and 4-butylcycloheptyl, 3- and 4-sec-butylcycloheptyl, 3- and 4-tert-butylcycloheptyl, cyclooctyl, 2-, 3-, 4- and 5-methylcyclooctyl, 2-, 3-, 4- and 5-ethylcyclooctyl and 3-, 4- and 5-propylcyclooctyl; 3- and 4-hydroxy-cyclohexyl, 3- and 4-nitrocyclohexyl and 3- and 4-chlorocyclohexyl;

1-, 2- and 3-cyclopentenyl, 1-, 2-, 3- and 4-cyclohexenyl, 1-, 2- and 3-cycloheptenyl and 1-, 2-, 3- and 4-cyclooctenyl;

2-dioxanyl, 1-morpholinyl, 1-thiomorpholinyl, 2- and 3-tetrahydrofuryl, 1-, 2- and 3-pyrrolidinyl, 1-piperazyl, 1-diketopiperazyl and 1-, 2-, 3- and 4-piperidyl;

phenyl, 2-naphthyl, 2- and 3-pyrryl, 2-, 3- and 4-pyridyl, 2-, 4- and 5-pyrimidyl, 3-, 4- and 5-pyrazolyl, 2-, 4- and 5-imidazolyl, 2-, 4- and 5-thiazolyl, 3-(1,2,4-triazyl), 2-(1,3,5-triazyl), 6-quinaldyl, 3-, 5-, 6- and 8-quinolinyl, 2-benzoxazolyl, 2-benzothiazolyl, 5-benzothiadiazolyl, 2- and 5-benzimidazolyl and 1- and 5-isoquinolyl;

1-, 2-, 3-, 4-, 5-, 6- and 7-indolyl, 1-, 2-, 3-, 4-, 5-, 6- and 7-isoindolyl, 5-(4-methylisoindolyl), 5-(4-phenylisoindolyl), 1-, 2-, 4-, 6-, 7- and 8-(1,2,3,4-tetrahydroisoquinolinyl), 3-(5-phenyl)-(1,2,3,4-tetrahydroisoquinolinyl), 5-(3-dodecyl-(1,2,3,4-tetrahydroisoquinolinyl), 1-, 2-, 3-, 4-, 5-, 6-, 7- and 8-(1,2,3,4-tetrahydroquinolinyl) and 2-, 3-, 4-, 5-, 6-, 7- and 8-chromanyl, 2-, 4- and 7-quinolinyl, 2-(4-phenylquinolinyl) and 2-(5-ethylquinolinyl);

2-, 3- and 4-methylphenyl, 2,4-, 3,5- and 2,6-dimethylphenyl, 2,4,6-trimethylphenyl, 2-, 3- and 4-ethylphenyl, 2,4-, 3,5- and 2,6-diethylphenyl, 2,4,6-triethylphenyl, 2-, 3- and 4-propylphenyl, 2,4-, 3,5- and 2,6-dipropylphenyl, 2,4,6-tripropylphenyl, 2-, 3- and 4-isopropylphenyl, 2,4-, 3,5- and 2,6-diisopropylphenyl, 2,4,6-triisopropylphenyl, 2-, 3- and 4-butylphenyl, 2,4-, 3,5- and 2,6-dibutylphenyl, 2,4,6-tributylphenyl, 2-, 3- and 4-isobutylphenyl, 2,4-, 3,5- and 2,6-diisobutyl-phenyl, 2,4,6-triisobutylphenyl, 2-, 3- and 4-sec-butylphenyl, 2,4-, 3,5- and 2,6-di-sec-butylphenyl and 2,4,6-tri-sec-butylphenyl; 2-, 3- and 4-methoxyphenyl, 2,4-, 3,5- and 2,6-dimethoxy-phenyl, 2,4,6-trimethoxyphenyl, 2-, 3- and 4-ethoxyphenyl, 2,4-, 3,5- and 2,6-diethoxyphenyl, 2,4,6-triethoxyphenyl, 2-, 3- and 4-propoxyphenyl, 2,4-, 3,5- and 2,6-dipropoxyphenyl, 2-, 3- and 4-isopropoxyphenyl, 2,4- and 2,6-diisopropoxyphenyl and 2-, 3- and 4-butoxyphenyl; 2-, 3- and 4-chlorophenyl, 2,4-, 3,5- and 2,6-dichlorophenyl; 2-, 3- and 4-hydroxyphenyl and 2,4-, 3,5- and 2,6-dihydroxyphenyl; 2-, 3- and 4-cyanophenyl; 3- and 4-carboxyphenyl; 3- and 4-carboxamidophenyl, 3- and 4-N-methylcarboxamidophenyl and 3- and 4-N-ethylcarboxamido-phenyl; 3- and 4-acetylaminophenyl, 3- and 4-propionylaminophenyl and 3- and 4-butyryl-aminophenyl; 3- and 4-N-phenylaminophenyl, 3- and 4-N-(o-tolyl)aminophenyl, 3- and 4-N-(m-tolyl)aminophenyl and 3- and 4-(p-tolyl)aminophenyl; 3- and 4-(2-pyridyl)aminophenyl, 3- and 4-(3-pyridyl)aminophenyl, 3- and 4-(4-pyridyl)aminophenyl, 3- and 4-(2-pyrimidyl)aminophenyl and 4-(4-pyrimidyl)aminophenyl;

4-phenylazophenyl, 4-(1-naphthylazo)phenyl, 4-(2-naphthylazo)phenyl, 4-(4-naphthylazo)-phenyl, 4-(2-pyridylazo)phenyl, 4-(3-pyridylazo)phenyl, 4-(4-pyridylazo)phenyl, 4-(2-pyrimidylazo)phenyl, 4-(4-pyrimidylazo)phenyl and 4-(5-pyrimidylazo)phenyl;

phenoxy, phenylthio, 2-naphthoxy, 2-naphthylthio, 2-, 3- and 4-pyridyloxy, 2-, 3- and 4-pyridyl-thio, 2-, 4- and 5-pyrimidyloxy and 2-, 4- and 5-pyrimidylthio, 2,6-dimethylphenoxy, 2,6-diethyl-phenoxy, 2,6-diisopropylphenoxy, 2,6-di(2-butyl)phenoxy, 2,6-di(n-butyl)phenoxy, 2,6-di(2-hexyl)phenoxy, 2,6-di(n-hexyl)phenoxy, 2,6-di(2-dodecyl)phenoxy, 2,6-di(n-dodecyl)-phenoxy, 2,6-dicyclohexylphenoxy, 2,6-diphenylphenoxy, 2,6-dimethyl-4-(n-butyl)phenoxy, 2,6-diethyl-4-(n-butyl)phenoxy, 2,6-diisopropyl-4-(n-butyl)phenoxy, 2,6-di(2-butyl)-4-(n-butyl)-phenoxy, 2,4,6-tri(n-butyl)phenoxy, 2,6-di(2-hexyl)-4-(n-butyl)phenoxy, 2,6-di(n-hexyl)-4-(n-butyl)phenoxy, 2,6-di(2-dodecyl)-4-(n-butyl)phenoxy, 2,6-di(n-dodecyl)-4-(n-butyl)phenoxy, 2,6-dicyclohexyl-4-(n-butyl)phenoxy, 2,6-diphenyl-4-(n-butyl)phenoxy, 2,6-dimethyl-4-(n-nonyl)-phenoxy, 2,6-diethyl-4-(n-nonyl)phenoxy, 2,6-diisopropyl-4-(n-nonyl)phenoxy, 2,6-di(2-butyl)-4-(n-nonyl)phenoxy, 2,6-di(2-butyl)-4-(n-nonyl)phenoxy, 2,6-di(2-hexyl)-4-(n-nonyl)phenoxy, 2,6-di(n-hexyl)-4-(n-nonyl)phenoxy, 2,6-di(2-dodecyl)-4-(n-nonyl)phenoxy, 2,6-di(n-dodecyl)-4-(n-nonyl)phenoxy, 2,6-dicyclohexyl-4-(n-nonyl)phenoxy, 2,6-diphenyl-4-(n-nonyl)phenoxy, 2,6-dimethyl-4-(n-octadecyl)phenoxy, 2,6-diethyl-4-(n-octadecyl)phenoxy, 2,6-diisopropyl-4-(n-octadecyl)phenoxy, 2,6-di(2-butyl)-4-(n-octadecyl)phenoxy, 2,6-di(2-butyl)-4-(n-octadecyl)- phenoxy, 2,6-di(2-hexyl)-4-(n-octadecyl)phenoxy, 2,6-di(n-hexyl)-4-(n-octadecyl)phenoxy, 2,6-di(2-dodecyl)-4-(n-octadecyl)phenoxy, 2,6-di(n-dodecyl)-4-(n-octadecyl)phenoxy, 2,6-dicyclohexyl-4-(n-octadecyl)phenoxy, 2,6-dimethyl-4-(tert-butyl)phenoxy, 2,6-diethyl-4-(tert-butyl)phenoxy, 2,6-diisopropyl-4-(tert-butyl)phenoxy, 2,6-di(2-butyl)-4-(tert-butyl)phenoxy, 2,6-di-(n-butyl)-4-(tert-butyl)phenoxy, 2,6-di(2-hexyl)-4-(tert-butyl)phenoxy, 2,6-di(n-hexyl)-4-(tert-butyl)phenoxy, 2,6-di(2-dodecyl)-4-(tert-butyl)phenoxy, 2,6-di(n-dodecyl)-4-(tert-butyl)phenoxy, 2,6-dicyclohexyl-4-(tert-butyl)phenoxy, 2,6-diphenyl-4-(n-tert-butyl)phenoxy, 2,6-dimethyl-4-(tert-octyl)phenoxy, 2,6-diethyl-4-(tert-octyl)phenoxy, 2,6-diisopropyl-4-(tert-octyl)phenoxy, 2,6-di(2-butyl)-4-(tert-octyl)phenoxy, 2,6-di(n-butyl)-4-(tert-octyl)phenoxy, 2,6-di(2-hexyl)-4-(tert-octyl)phenoxy, 2,6-di(n-hexyl)-4-(tert-octyl)phenoxy, 2,6-di(2-dodecyl)-4-(tert-octyl)phenoxy, 2,6-di(n-dodecyl)-4-(tert-octyl)phenoxy, 2,6-dicyclohexyl-4-(tert-octyl)phenoxy and 2,6-diphenyl-4-(tert-octyl)phenoxy;

2,6-dimethylthiophenoxy, 2,6-diethylthiophenoxy, 2,6-diisopropylthiophenoxy, 2,6-di(2-butyl)-thiophenoxy, 2,6-di(n-butyl)thiophenoxy, 2,6-di(2-hexyl)thiophenoxy, 2,6-di(n-hexyl)thiophenoxy, 2,6-di(2-dodecyl)thiophenoxy, 2,6-di(n-dodecyl)thiophenoxy, 2,6-dicyclohexyithiophenoxy, 2,6-diphenylthiophenoxy, 2,6-dimethyl-4-(n-butyl)thiophenoxy, 2,6-diethyl-4-(n-butyl)-thiophenoxy, 2,6-diisopropyl-4-(n-butyl)thiophenoxy, 2,6-di(2-butyl)-4-(n-butyl)thiophenoxy, 2,4,6-tri(n-butyl)thiophenoxy, 2,6-di(2-hexyl)-4-(n-butyl)thiophenoxy, 2,6-di(n-hexyl)-4-(n-butyl)thiophenoxy, 2,6-di(2-dodecyl)-4-(n-butyl)thiophenoxy, 2,6-di(n-dodecyl)-4-(n-butyl)thiophenoxy, 2,6-dicyclohexyl-4-(n-butyl)thiophenoxy, 2,6-diphenyl-4-(n-butyl)-thiophenoxy, 2,6-dimethyl-4-(n-nonyl)thiophenoxy, 2,6-diethyl-4-(n-nonyl)thiophenoxy, 2,6-diisopropyl-4-(n-nonyl)thiophenoxy, 2,6-di(2-butyl)-4-(n-nonyl)thiophenoxy, 2,6-di(2-butyl)-4-(n-nonyl)thiophenoxy, 2,6-di(2-hexyl)-4-(n-nonyl)thiophenoxy, 2,6-di(n-hexyl)-4-(n-nonyl)-thiophenoxy, 2,6-di(2-dodecyl)-4-(n-nonyl)thiophenoxy, 2,6-di(n-dodecyl)-4-(n-nonyl)-thiophenoxy, 2,6-dicyclohexyl-4-(n-nonyl)thiophenoxy, 2,6-diphenyl-4-(n-nonyl)thiophenoxy, 2,6-(dimethyl)-4-(n-octadecyl)thiophenoxy, 2,6-(diethyl)-4-(n-octadecyl)thiophenoxy, 2,6-diisopropyl-4-(n-octadecyl)thiophenoxy, 2,6-di(2-butyl)-4-(n-octadecyl)thiophenoxy, 2,6-di(2-butyl)-4-(n-octadecyl)thiophenoxy, 2,6-di(2-hexyl)-4-(n-octadecyl)thiophenoxy, 2,6-di(n-hexyl)-4-(n-octadecyl)thiophenoxy, 2,6-di(2-dodecyl)-4-(n-octadecyl)thiophenoxy, 2,6-di(n-dodecyl)-4-(n-octadecyl)thiophenoxy, 2,6-dicyclohexyl-4-(n-octadecyl)thiophenoxy, 2,6-dimethyl-4-(tert-butyl)thiophenoxy, 2,6-diethyl-4-(tert-butyl)thiophenoxy, 2,6-diisopropyl-4-(tert-butyl)thiophenoxy, 2,6-di(2-butyl)-4-(tert-butyl)thiophenoxy, 2,6-di(n-butyl)-4-(tert-butyl)thiophenoxy, 2,6-di(2-hexyl)-4-(tert-butyl)thiophenoxy, 2,6-di(n-hexyl)-4-(tert-butyl)-thiophenoxy, 2,6-di(2-dodecyl)-4-(tert-butyl)thiophenoxy, 2,6-di(n-dodecyl)-4-(tert-butyl)-thiophenoxy, 2,6-dicyclohexyl-4-(tert-butyl)thiophenoxy, 2,6-diphenyl-4-(tert-butyl)thiophenoxy, 2,6-dimethyl-4-(tert-octyl)thiophenoxy, 2,6-diethyl-4-(tert-octyl)thiophenoxy, 2,6-diisopropyl-4-(tert-octyl)thiophenoxy, 2,6-di(2-butyl)-4-(tert-octyl)thiophenoxy, 2,6-di(n-butyl)-4-(tert-octyl)-thiophenoxy, 2,6-di(2-hexyl)-4-(tert-octyl)thiophenoxy, 2,6-di(n-hexyl)-4-(tert-octyl)thiophenoxy, 2,6-di(2-dodecyl)-4-(tert-octyl)thiophenoxy, 2,6-di(n-dodecyl)-4-(tert-octyl)thiophenoxy, 2,6-dicyclohexyl-4-(tert-octyl)thiophenoxy and 2,6-diphenyl-4-(tert-octyl)thiophenoxy.

In a preferred embodiment of this invention, X is a single bond.

In a very particularly preferred embodiment of the invention, (X—R) is phenyl, naphthyl, anthranyl, phenanthrenyl, pyrenyl, benzopyrenyl, fluorenyl, indanyl, indenyl, tetralinyl, phenoxy, thiophenoxy, $C_1$-$C_{12}$ alkoxyphenyl, each of which may be mono- or polysubstituted by identical or different radicals (i), (ii), (iii), (iv) and/or (v):

(i) $C_1$-$C_{30}$-alkyl whose carbon chain may comprise one or more —O—, —S—, —NR$^1$—, —C≡C—, —CR$^1$═CR$^1$— and/or —CO— moieties and which may be mono- or polysubstituted by: $C_1$-$C_{12}$-alkoxy, hydroxyl, halogen, cyano and/or aryl which may be mono- or polysubstituted by $C_1$-$C_{18}$-alkyl and/or $C_1$-$C_6$-alkoxy;

(ii) $C_3$-$C_8$-cycloalkyl whose carbon skeleton may comprise one or more —O—, —S—, —NR$^1$—, —CR$^1$═CR$^1$— and/or —CO— moieties and which may be mono- or polysubstituted by $C_1$-$C_{18}$-alkyl, $C_1$-$C_{12}$-alkoxy and/or $C_1$-$C_6$-alkylthio;

(iii) aryl or hetaryl, to each of which may be fused further 5- to 7-membered saturated or unsaturated rings whose carbon skeleton may comprise one or more —O—, —S—, —NR$^1$—, —N═CR$^1$—, —CR$^1$═CR$^1$—, —CO—, —SO— and/or —SO$_2$— moieties, where the overall ring system may be mono- or polysubstituted by: $C_1$-$C_{18}$-alkyl, $C_1$-$C_{12}$-alkoxy, —C≡CR$^1$—, —CR$^1$═CR$^1$—, hydroxyl, halogen, cyano, —NR$^2$R$^3$, —NR$^2$COR$^3$, —CONR$^2$R$^3$, —SO$_2$NR$^2$R$^3$, —COOR$^2$ and/or —SO$_3$R$^2$;

(iv) a —U-aryl radical which may be mono- or polysubstituted by the above radicals mentioned as substituents for the aryl radicals (iii), where U is a —O—, —S—, —NR$^1$—, —CO—, —SO— or —SO$_2$— moiety;

(v) $C_1$-$C_{12}$-alkoxy, $C_1$-$C_6$-alkylthio, —C≡CR$^1$, —CR$^1$═CR$^1{}_2$, hydroxyl, mercapto, halogen, cyano, nitro, —NR$^2$R$^3$, —NR$^2$COR$^3$, —CONR$^2$R$^3$, —SO$_2$NR$^2$R$^3$, —COOR$^2$ or —SO$_3$R$^2$;

R$^1$, R$^2$, R$^3$ are each independently hydrogen;

$C_1$-$C_{18}$-alkyl whose carbon chain may comprise one or more —O—, —S—, —CO—, —SO— and/or —SO$_2$— moieties and which may be mono- or polysubstituted by $C_1$-$C_{12}$-alkoxy, $C_1$-$C_6$-alkylthio, hydroxyl, mercapto, halogen, cyano, nitro and/or —COOR$^1$;

aryl or hetaryl, to each of which may be fused further saturated or unsaturated 5- to 7-membered rings whose carbon skeleton may comprise one or more —O—, —S—, —CO— and/or —SO$_2$— moieties, where the overall ring system may be mono- or polysubstituted by $C_1$-$C_{12}$-alkyl and/or the above radicals mentioned as substituents for alkyl.

Most preferably, (X—R) is phenyl, naphthyl, anthranyl, phenanthrenyl, pyrenyl, benzopyrenyl, fluorenyl, indanyl, indenyl, tetralinyl, phenoxy, thiophenoxy, $C_1$-$C_{12}$ alkoxyphenyl, each of which may be mono- or polysubstituted by identical or different radicals (i), (ii), (iii), (iv) and/or (v):

(i) $C_1$-$C_{30}$-alkyl whose carbon chain may comprise one or more —O—, —S—, —NR$^1$—, —C≡C—, —CR¹=CR¹— and/or —CO— moieties and which may be mono- or polysubstituted by: $C_1$-$C_{12}$-alkoxy, hydroxyl, halogen, cyano and/or aryl which may be mono- or polysubstituted by $C_1$-$C_{18}$-alkyl and/or $C_1$-$C_6$-alkoxy;

(ii) $C_3$-$C_8$-cycloalkyl whose carbon skeleton may comprise one or more —O—, —S—, —NR¹—, —CR¹=CR¹— and/or —CO— moieties and which may be mono- or polysubstituted by $C_1$-$C_{18}$-alkyl, $C_1$-$C_{12}$-alkoxy and/or $C_1$-$C_6$-alkylthio;

(iii) aryl or hetaryl, to each of which may be fused further 5- to 7-membered saturated or unsaturated rings whose carbon skeleton may comprise one or more —O—, —S—, —NR¹—, —N=CR¹—, —CR¹=CR¹—, —CO—, —SO— and/or —SO₂— moieties, where the overall ring system may be mono- or polysubstituted by: $C_1$-$C_{18}$-alkyl, $C_1$-$C_{12}$-alkoxy, —C=CR¹—, —CR¹=CR¹—, hydroxyl, halogen, cyano, —NR²R³, —NR²COR³, —CONR²R³, —SO₂NR²R³, —COOR² and/or —SO₃R²;

(iv) a —U-aryl radical which may be mono- or polysubstituted by the above radicals mentioned as substituents for the aryl radicals (iii), where U is a —O—, —S—, —NR¹—, —CO—, —SO— or —SO₂— moiety;

(v) $C_1$-$C_{12}$-alkoxy, $C_1$-$C_6$-alkylthio, —C≡CR¹, —CR¹=CR¹², hydroxyl, mercapto, halogen, cyano, nitro, —NR²R³, —NR²COR³, —CONR²R³, —SO₂NR²R³, —COOR² or —SO₃R²;

R¹, R², R³ are each independently hydrogen;

$C_1$-$C_{18}$-alkyl whose carbon chain may comprise one or more —O—, —S—, —CO—, —SO— and/or —SO₂— moieties and which may be mono- or polysubstituted by $C_1$-$C_{12}$-alkoxy, $C_1$-$C_6$-alkylthio, hydroxyl, mercapto, halogen, cyano, nitro and/or —COOR¹;

aryl or hetaryl, to each of which may be fused further saturated or unsaturated 5- to 7-membered rings whose carbon skeleton may comprise one or more —O—, —S—, —CO— and/or —SO₂— moieties, where the overall ring system may be mono- or polysubstituted by $C_1$-$C_{12}$-alkyl and/or the above radicals mentioned as substituents for alkyl.

In an especially preferred embodiment (X—R) is phenyl, tolyl, ethylphenyl, ortho-xylyl, meta-xylyl, para xylyl, mesityl, naphthyl, anthranyl, phenanthrenyl, pyrenyl, benzopyrenyl, fluorenyl, indanyl, indenyl, tetralinyl, phenoxy, thiophenoxy, 4-ethoxyphenyl.

In a preferred embodiment of the invention, the at least one organic fluorescent dye consists of at least one structural unit of the formulae (II), (III), (IV), (V), (VI), (VII), (VIII), (IX), (X), (XX), (XXI), (XXII), (XXIII), (XIV), (XXV) or (XXVI). In this embodiment, the organic fluorescent dye has a structure which is identical with the structural unit of the formulae (II), (III), (IV), (V), (VI), (VII), (VIII), (IX), (X), (XX), (XXI), (XXII), (XXIII), (XIV), (XXV) or (XXVI). More preferably, the organic fluorescent dye has a structure of the formula (II), where none of the CH groups of the six-membered ring of the benzimidazole structure are replaced by nitrogen. According to this specific aspect, n is 2, 3, 4 or 5, preferably 3 or 4. According to this specific aspect, X—R is phenyl. According to a more specific aspect, the organic dye is selected from

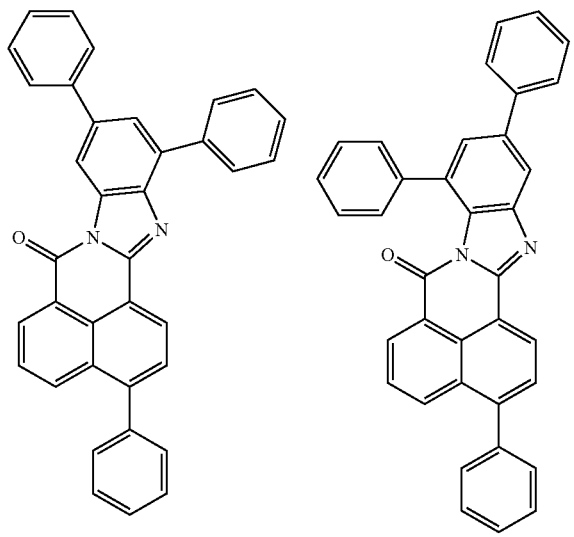

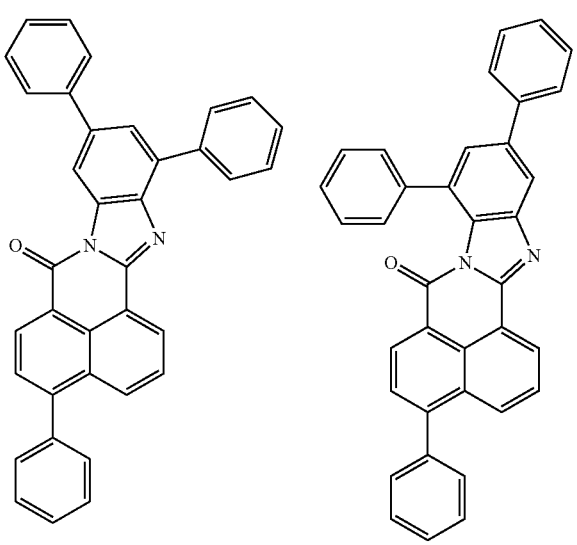

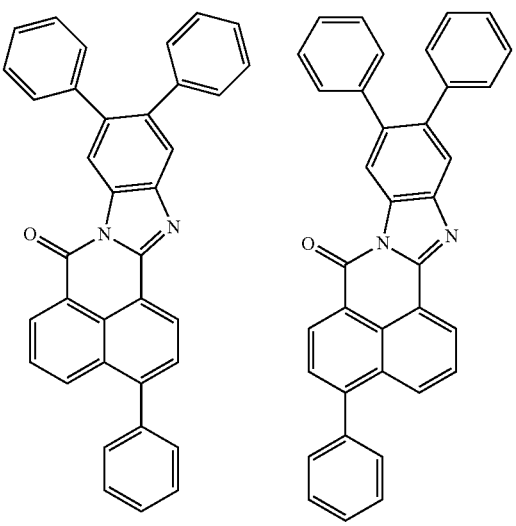

29
-continued
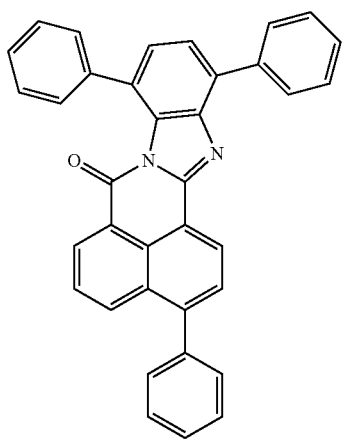
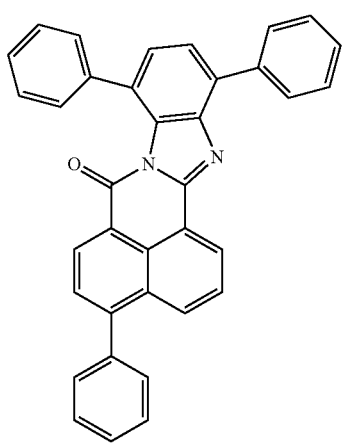
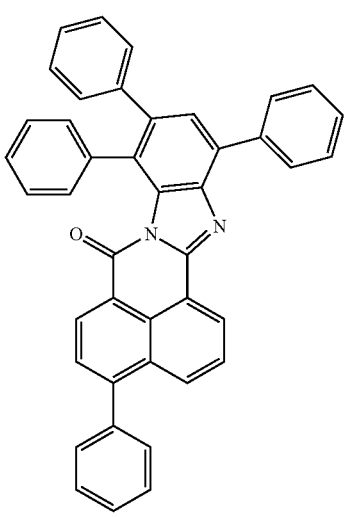
30
-continued
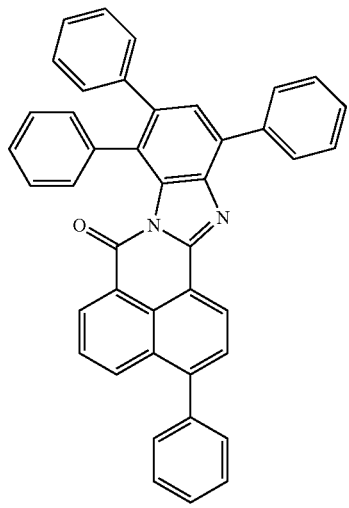
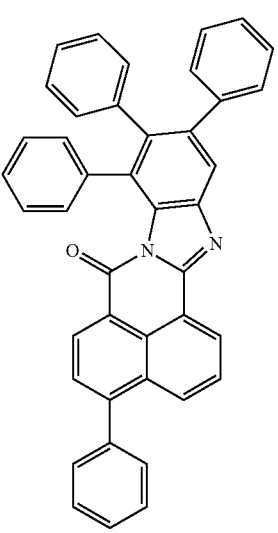 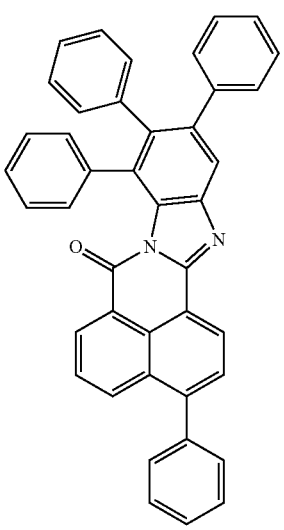
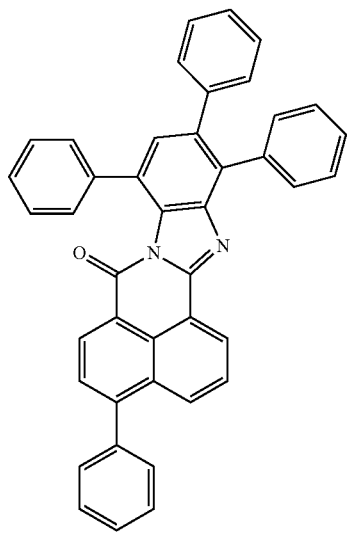

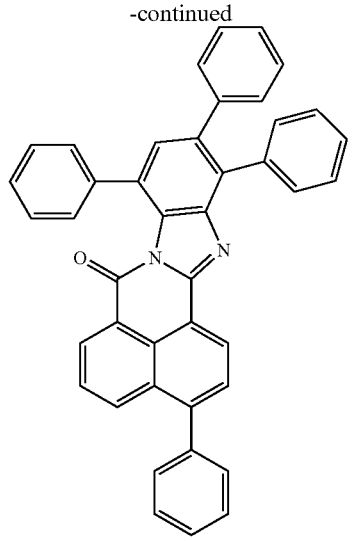

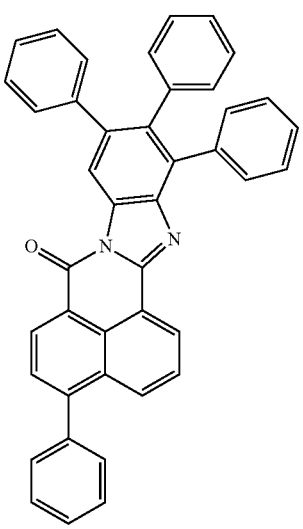 [SMILES: O=c1c2ccc(-c3ccccc3)c3cccc(c32)c2nc3c(-c4ccccc4)c(-c4ccccc4)c(-c4ccccc4)cc3n12]

and mixtures thereof.

In a further embodiment of the invention, the at least one organic fluorescent dye has a structure as shown in formula (XV)

$$A-F_m \quad (XV)$$

where m is a number with a value of at least 2,

F represents identical or different structural units (I) to (X) or (XX) to (XXVI) as defined above, and A is any organic radical to which F is chemically bonded.

When m=2 and 3, this is shown by way of example in the formulae (X) to (XII) below.

(X)

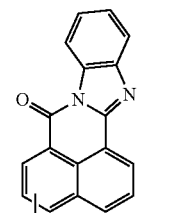

$(X-R)_{3*(n-1)}$ (XI)

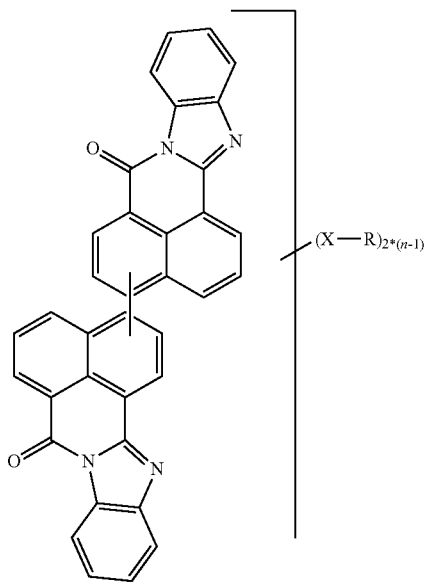

(XII)

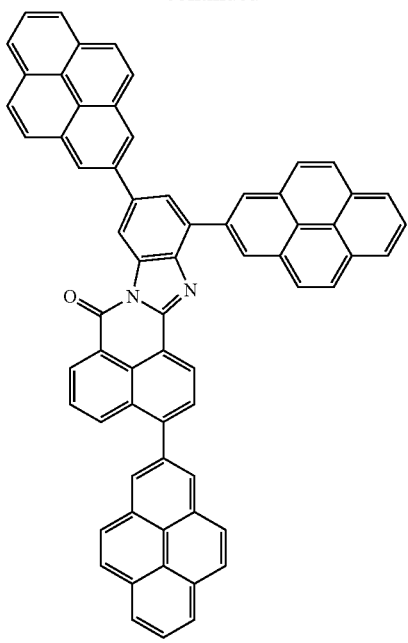

Preferably, A is selected from a polymer P, an aromatic ring system, a molecule with a plurality of aromatic ring systems, a polyhydric alcohol, a polyfunctional amine.

Examples of polyhydric alcohols are sugars, glycerol, trimethylolpropane, pentaerythritol or alkoxylates thereof.

The polymer P may be the polymer which is present in accordance with the invention in the color converters, to which the organic fluorescent dye is chemically bound in this case. However, it may also be another substance which consists of at least 10 monomer units and comprises at least two groups to which the organic fluorescent dye may be chemically bound. Examples of polymers are, for example, polyetherols, polyesterols, polycarbonates. In a particular embodiment, polymers P are dendritic or hyperbranched polymers.

Especially preferably, organic fluorescent dyes are selected from

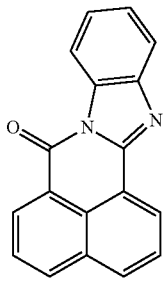

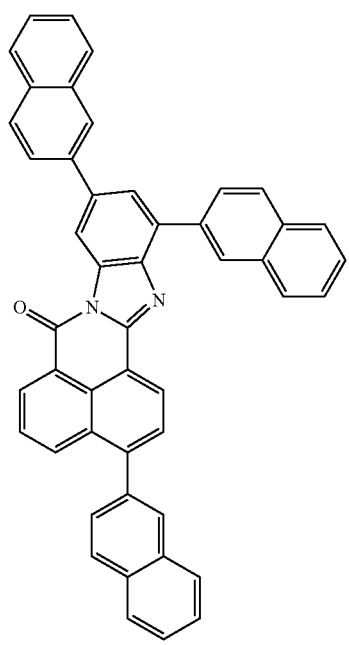

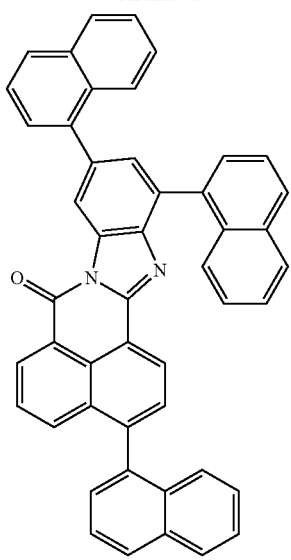 [SMILES: O=c1c2cccc3c(-c4cccc5ccccc45)ccc(c32)c2nc3c(-c4cccc5ccccc45)cc(-c4cccc5ccccc45)cc3n12]
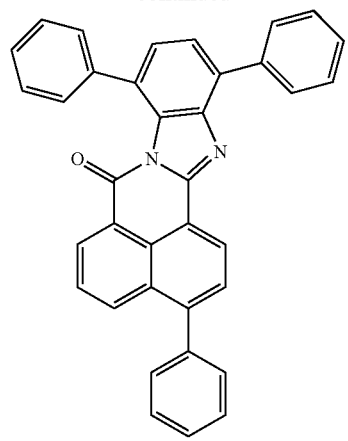
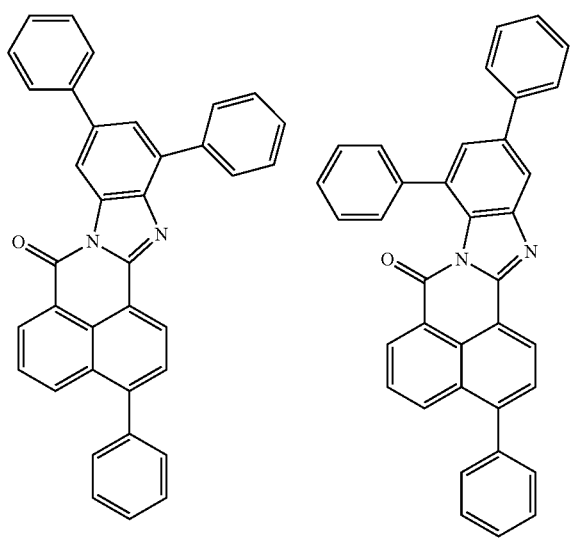
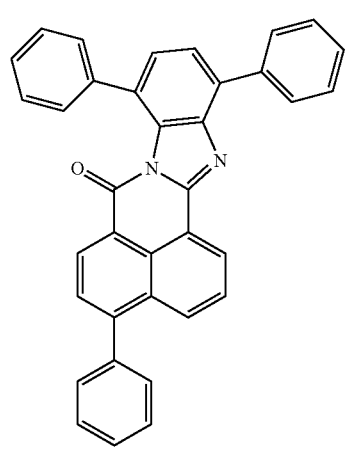
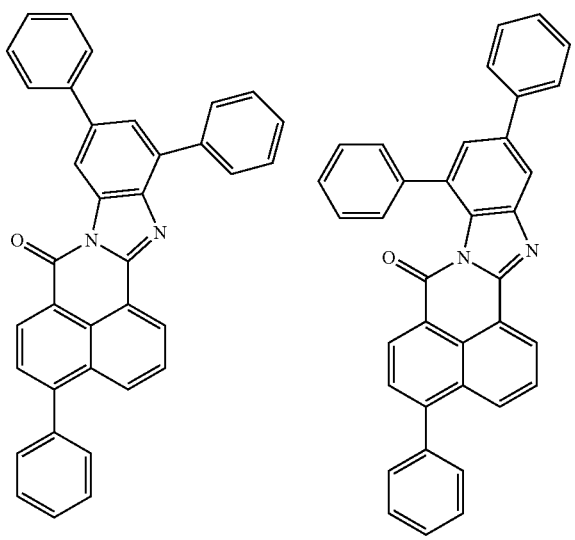
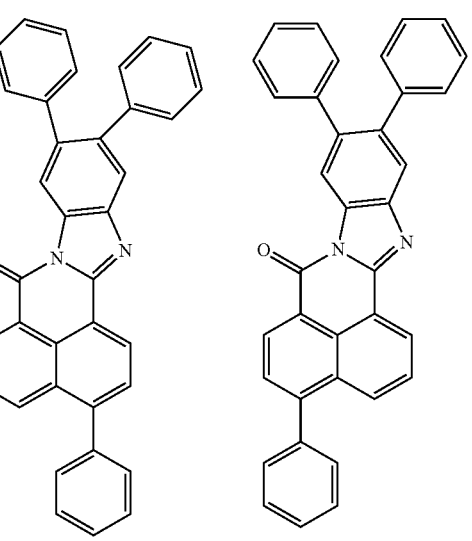

37
-continued
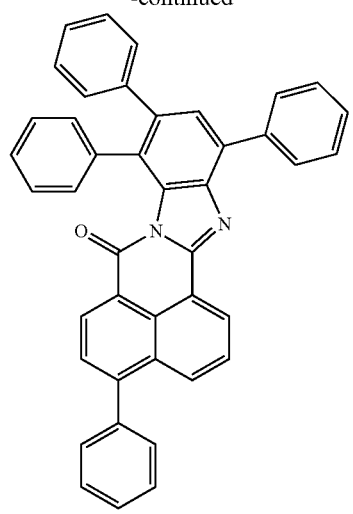
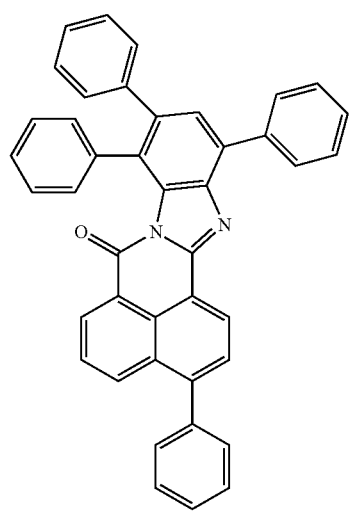
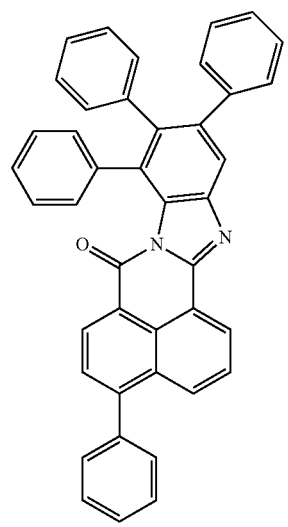
38
-continued
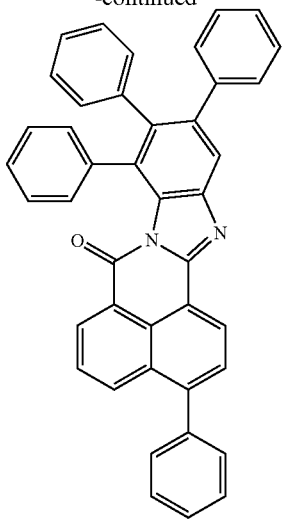
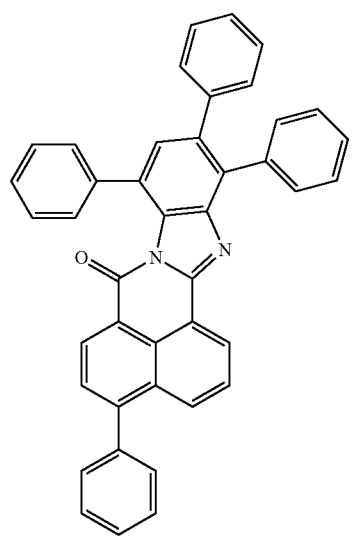
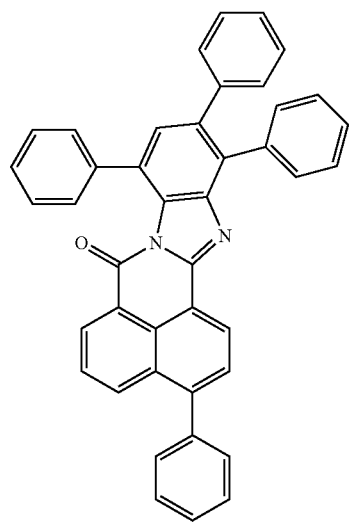

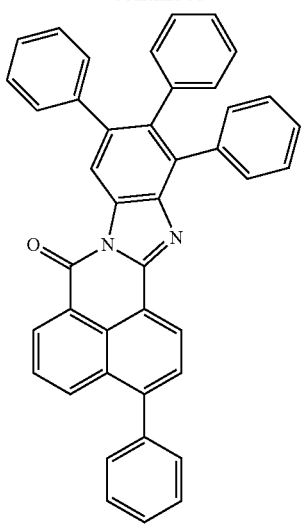 [SMILES: O=c1c2cccc3c(-c4ccccc4)ccc(c32)c2nc3c(-c4ccccc4)c(-c4ccccc4)c(-c4ccccc4)cc3n12]
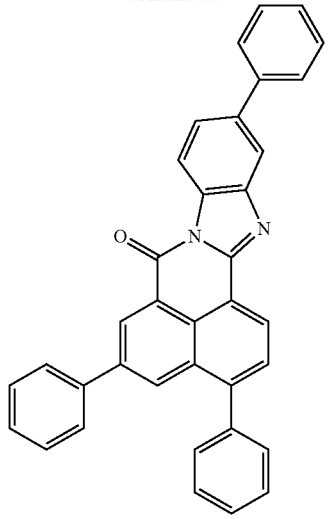
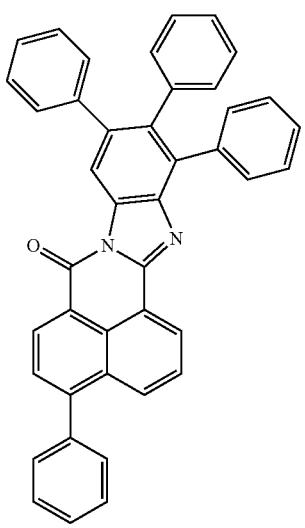
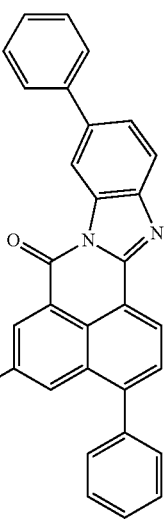
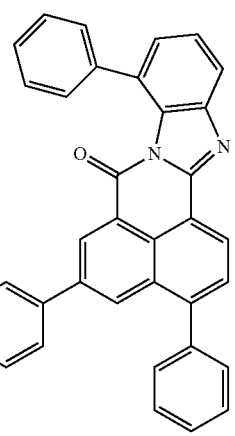
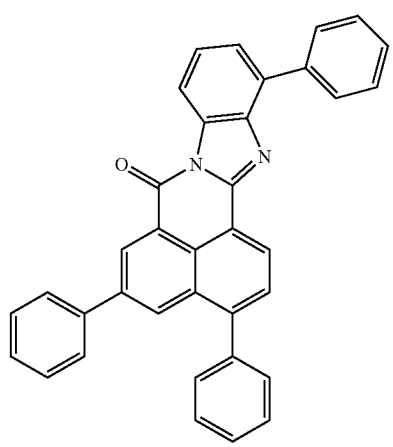
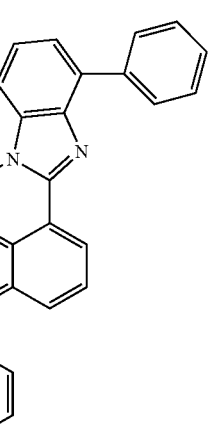
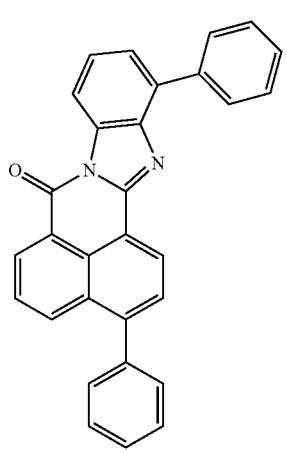

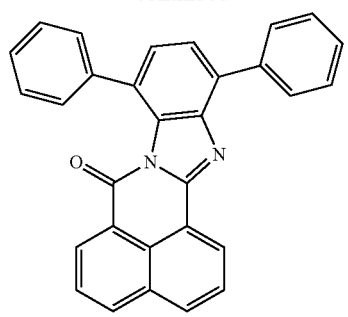
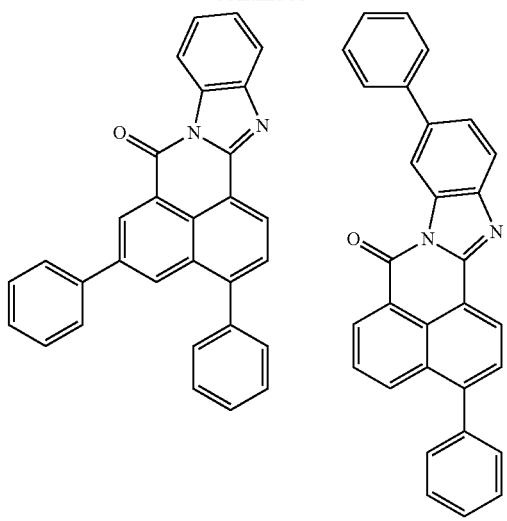
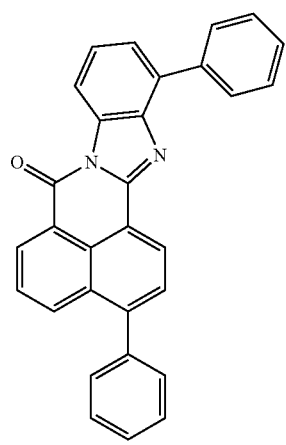
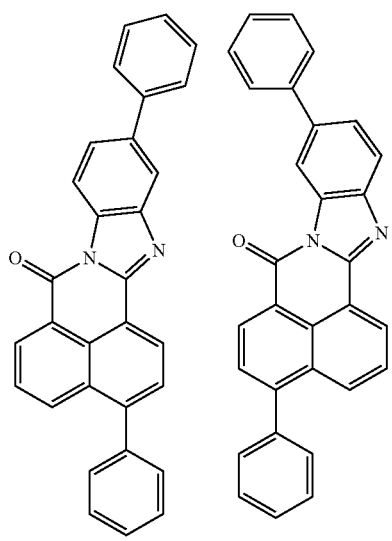
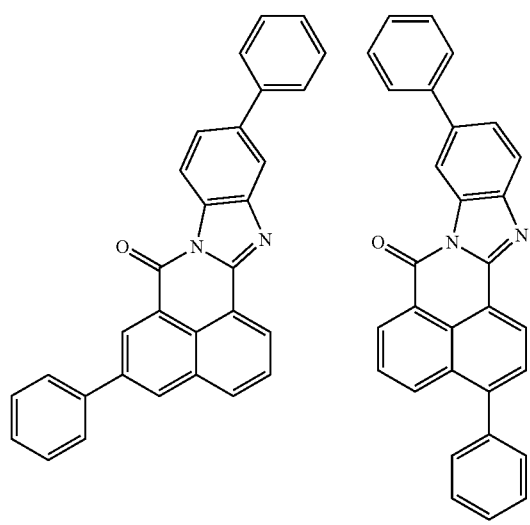
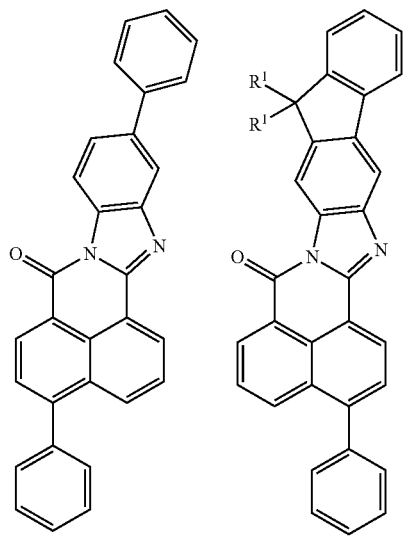

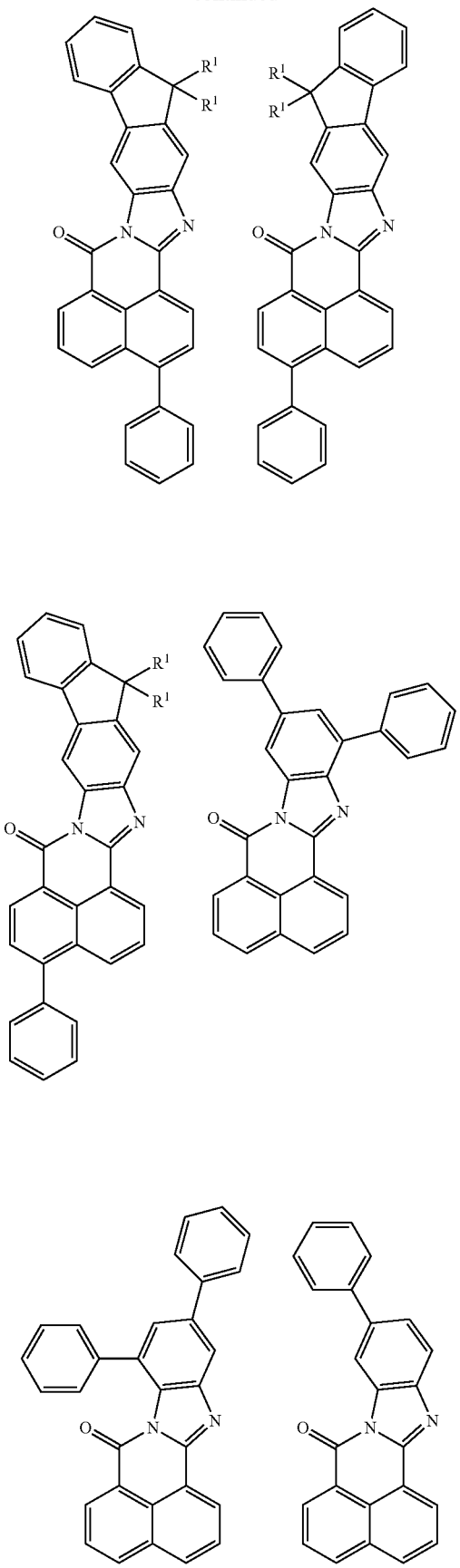
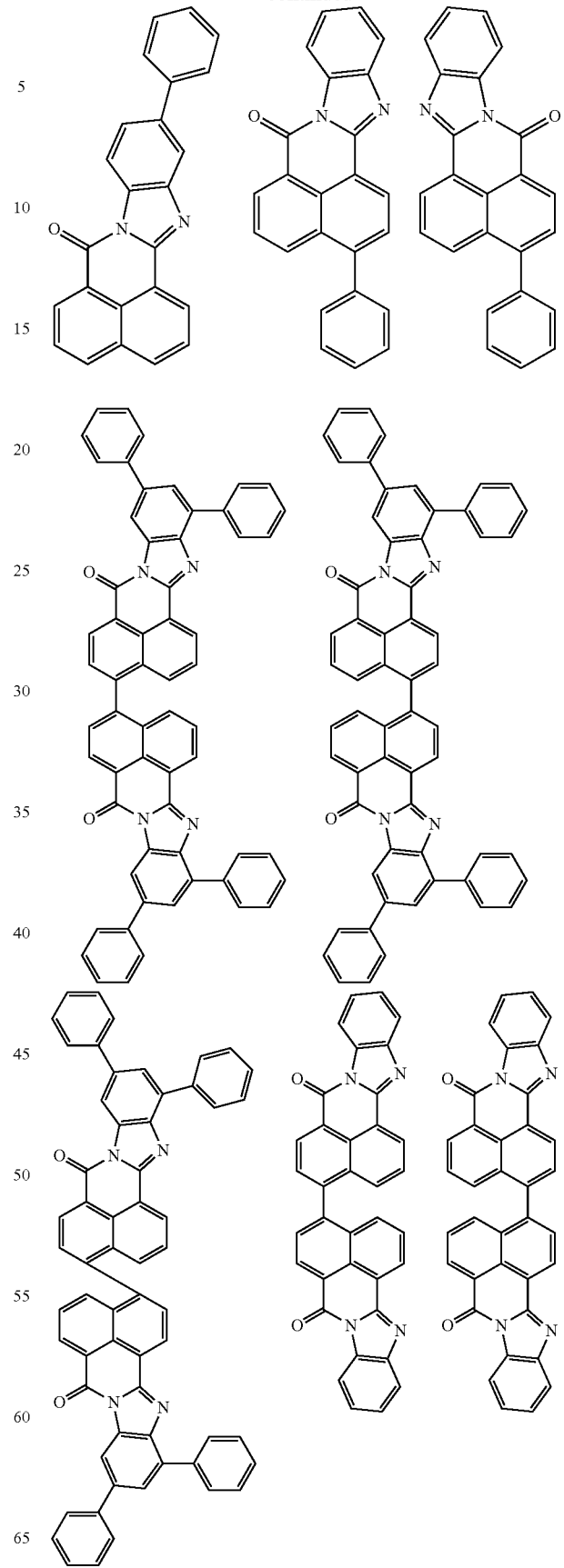

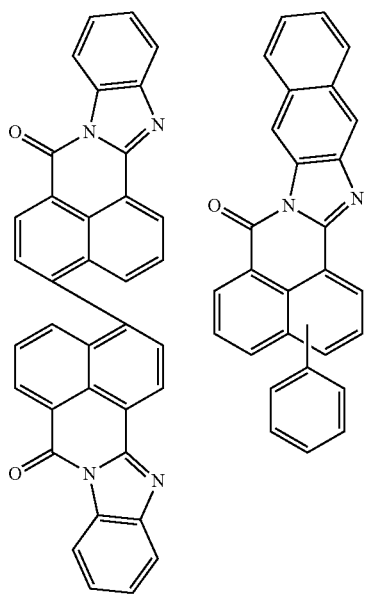
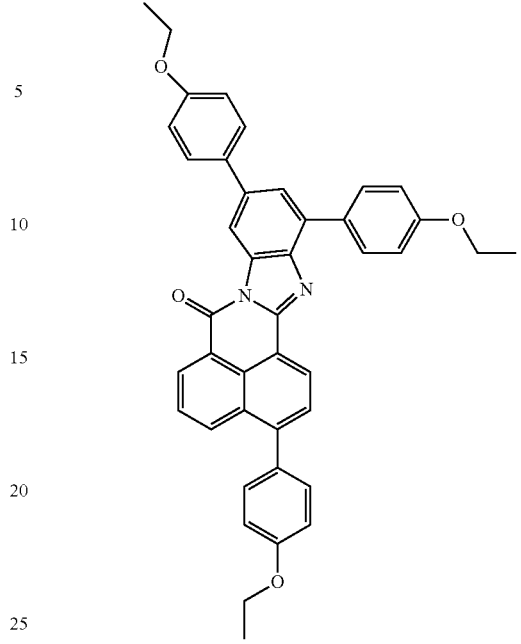
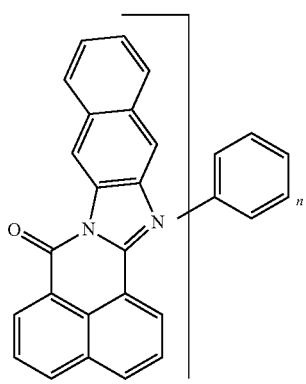
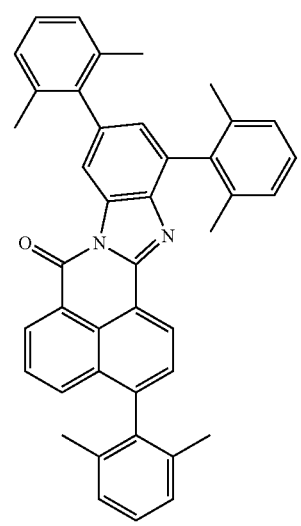

or mixtures thereof, where n is a number from 0, 1, 2, 3, 4, 5, 6, 7, 8, 9 or 10;
$R^1$ is independently hydrogen, $C_1$-$C_{18}$-alkyl or cycloalkyl, the carbon chain of which may comprise one or more —O—, —S—, —CO—, —SO— and/or —$SO_2$— moieties and which may be mono- or polysubstituted;
aryl or hetaryl which may be mono- or polysubstituted.

Suitable organic fluorescent dyes may be present either dissolved in the polymer or as a homogeneously distributed mixture. The organic fluorescent dyes are preferably present dissolved in the polymer.

The organic fluorescent dye can be prepared according to standard methods or as described in the experimental part of this application.

In a preferred embodiment, color converters comprise, in addition to the at least one inventive organic fluorescent dye, also further fluorescent colorants. For example, the at least one inventive organic fluorescent dye can be combined with a red-fluorescing fluorescent colorant. In many cases, fluorescent colorants are combined with one another so as to obtain color converters which can convert blue to white light with good color reproduction.

Suitable further fluorescent colorants are, for example, those specified in "Luminescence—from Theory to Applications" Cees Ronda [eds.], Wiley-VCH, 2008, Chapter 7, "Luminescent Materials for Phosphor-Converted LEDs", Th. Jüstel, pages 179-190.

Especially suitable further fluorescent colorants are, for example, inorganic fluorescent colorants based on cerium-doped yttrium aluminium garnet (Ce-YAG), or fluorescent colorants comprising $Eu^{3+}$, $Eu^{2+}$ or $Tb^{3+}$. In addition, all organic red or pink fluorescent dyes are particularly suitable. In another embodiment, further fluorescent colorants comprise further orange- or yellow-fluorescing fluorescent dyes.

Suitable fluorescent red dyes have, for example, the general formula

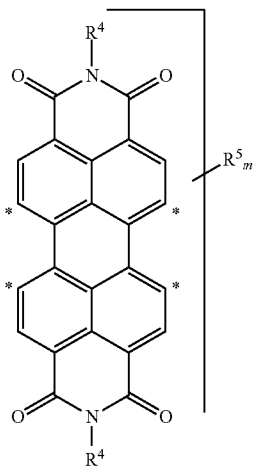

(XXX)

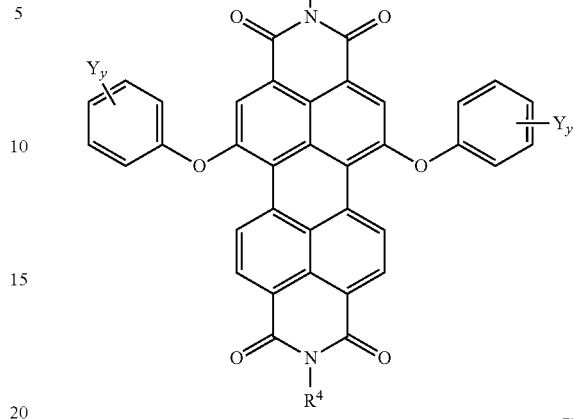

XXX-2 where the symbols are each defined as follows:

m=1 to 4, e.g. 1, 2, 3, or 4;

$R^4$=$C_1$ to $C_{30}$ alkyl or cycloalkyl, aryl, hetaryl, alkaryl, aralkyl, $R^5$=aryloxy, $C_1$ to $C_{10}$ alkyl-substituted aryloxy, $C_1$ to $C_{30}$ alkoxy, where the $R^5$ radicals are at one or more positions identified by *.

Preferably, $R^4$ is $C_1$ to $C_{10}$ alkyl, 2,6-dialkylaryl, 2,4-dialkylaryl.

More preferably, $R^4$ is 2,6-diisopropylphenyl, 2,4-di-tert-butylphenyl.

$R^5$ is preferably phenoxy, or $C_1$ to $C_{10}$ alkylphenoxy, more preferably 2,6-dialkylphenoxy, 2,4-dialkylphenoxy. Especially preferably, $R^5$ is phenoxy, 2,6-diisopropylphenoxy, 2,4-di-tert-butylphenoxy.

In a more preferred embodiment, suitable organic fluorescent dyes are perylene derivatives selected from the formulae XXX-1 XXX-2 and XXX-3,

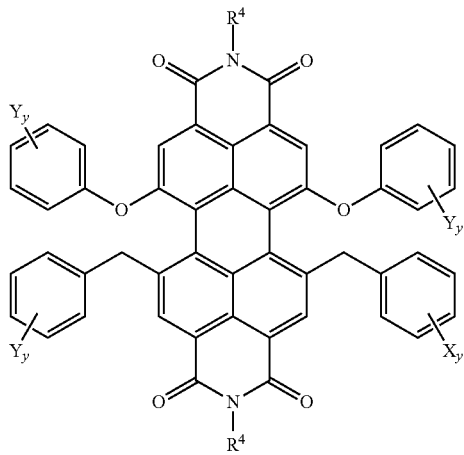

XXX-3 where $R^4$ is as defined above and preferably has one of the preferred meanings, Y is linear or branched $C_1$ to $C_{10}$ alkyl; and y is 0, 1, 2, or 3.

Further examples of particularly suitable further organic fluorescent dyes are the perylene derivatives specified in WO2007/006717 at page 1 line 5 to page 22 line 6.

Particularly suitable further organic fluorescent dyes are N,N'-bis(2,6-diisopropylphenyl)-1,6,7,12-tetraphenoxyperylene-3,4; 9,10-tetracarboximide, N,N'-bis(2,6-diisopropylphenyl)-1,7-di(2,6-diisopropylphenoxy)perylene-3,4; 9,10-tetracarboximide or N,N'-bis(2,6-diisopropylphenyl)-1,6-di(2,6-diisopropylphenoxy)perylene-3,4; 9,10-tetracarboximide. The further organic fluorescent dye is preferably selected from N,N'-bis(2,6-diisopropylphenyl)-1,7-di(2,6-diisopropylphenoxy)perylene-3,4; 9,10-tetracarboximide, N,N'-bis(2,6-diisopropylphenyl)-1,6-di(2,6-diisopropylphenoxy)perylene-3,4; 9,10-tetracarboximide and mixtures thereof.

In a further embodiment, inventive color converters additionally comprise at least one further organic fluorescent dye of the formula

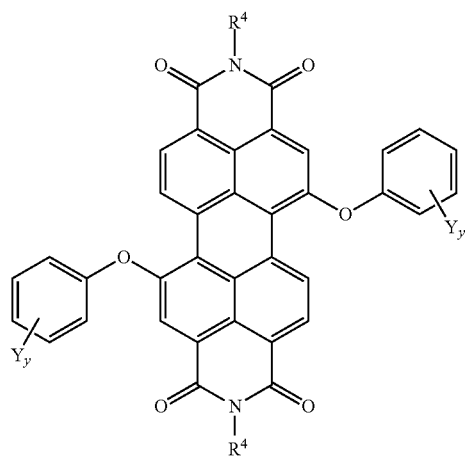

XXX-1

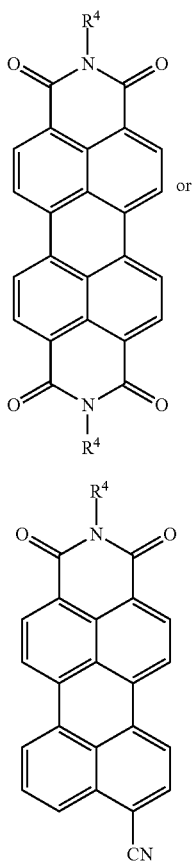

(XXXI)

(XXXII)

where R⁴ is as defined above.

In one embodiment of the invention, the inventive color converters have a layer structure. They may have either a single-layer structure or a multilayer structure, generally composed of several polymer layers comprising one or more fluorescent colorants and/or scattering bodies.

In one embodiment, the color converters consist of several polymer layers which have been laminated together to form a composite, and wherein the different fluorescent colorants and/or scattering bodies may be present in different polymer layers.

When inventive color converters comprise more than one fluorescent colorant, it is possible in one embodiment of the invention for several fluorescent colorants to be present alongside one another in one layer.

In another embodiment, the different fluorescent colorants are present in different layers.

In a preferred embodiment, inventive color converters comprise, in addition to the at least one organic fluorescent dye present in accordance with the invention, at least one further organic fluorescent dye according to formula (XXX), scattering bodies based on $TiO_2$ and at least one polymer consisting essentially of polystyrene or polycarbonate.

In a further preferred embodiment, inventive color converters comprise, in addition to the at least one organic fluorescent dye present in accordance with the invention, at least one further organic fluorescent dye according to formula (XXX) and at least one further organic fluorescent dye according to formula (XXXI) or (XXXII), scattering bodies based on $TiO_2$ and at least one polymer consisting essentially of polystyrene or polycarbonate.

In a particularly preferred embodiment, inventive color converters comprise, in addition to the at least one organic fluorescent dye present in accordance with the invention, at least one further red organic fluorescent dye selected from N,N'-bis(2,6-diisopropylphenyl)-1,6,7,12-tetraphenoxyperylene-3,4; 9,10-tetracarboximide or N,N'-bis(2,6-diisopropylphenyl)-1,7-di(2,6-diisopropylphenoxy)perylene-3,4; 9,10-tetracarboximide or N,N'-bis(2,6-diisopropylphenyl)-1,6-di(2,6-diisopropylphenoxy)perylene-3,4; 9,10-tetracarboximide, and at least one further organic fluorescent dye selected from N,N'-bis(2,6-diisopropylphenyl)perylene-3,4; 9,10-tetracarboximide or N'-(2,6-diisopropylphenyl)perylene-9-cyano-3,4-dicarboximide, a scattering body based on $TiO_2$ and at least one polymer consisting essentially of polystyrene or polycarbonate.

Typically, the concentration of inventive organic fluorescent dyes is 0.0001 to 0.5% by weight, preferably 0.002 to 0.1% by weight, most preferably 0.005 to 0.05% by weight, based in each case on the amount of polymer used. The concentration of the red organic fluorescent dye is typically 0.001 to 0.5% by weight, preferably 0.002 to 0.1% by weight, most preferably 0.005 to 0.05% by weight, based on the amount of the polymer used.

The ratio of at least one inventive organic fluorescent dye to at least one further red organic fluorescent dye is typically in the range from 4:1 to 12:1, preferably 5:1 to 10:1, especially 6:1 to 8:1.

In a very particularly preferred embodiment, inventive color converters comprise 3,10,12-triphenylbenzo[de]benzo[4,5]imidazo[2,1-a]isoquinolin-7-one as the inventive organic fluorescent dye, N,N'-bis(2,6-diisopropylphenyl)-1,6,7,12-tetraphenoxyperylene-3,4; 9,10-tetracarboximide as the red organic fluorescent dye, scattering bodies based on $TiO_2$ and at least one polymer consisting essentially of polystyrene. In a further very particularly preferred embodiment, inventive color converters comprise 3,10,12-triphenylbenzo[de]benzo[4,5]imidazo[2,1-a]isoquinolin-7-one as the inventive organic fluorescent dye, a red organic fluorescent dye selected from N,N'-bis(2,6-diisopropylphenyl)-1,7-di(2,6-diisopropylphenoxy)perylene-3,4; 9,10-tetracarboximide and N,N'-bis(2,6-diisopropylphenyl)-1,6-di(2,6-diisopropylphenoxy)perylene-3,4; 9,10-tetracarboximide, scattering bodies based on $TiO_2$ and at least one polymer consisting essentially of polystyrene.

In a very particularly preferred embodiment, inventive color converters comprise 3,10,12-triphenylbenzo[de]benzo[4,5]imidazo[2,1-a]isoquinolin-7-one as the inventive organic fluorescent dye, N,N'-bis(2,6-diisopropylphenyl)-1,6,7,12-tetraphenoxyperylene-3,4; 9,10-tetracarboximide as the red organic fluorescent dye, scattering bodies based on $TiO_2$ and at least one polymer consisting essentially of polycarbonate. In a further very particularly preferred embodiment, inventive color converters comprise 3,10,12-triphenylbenzo[de]benzo[4,5]imidazo[2,1-a]isoquinolin-7-one as the inventive organic fluorescent dye, a red organic fluorescent dye selected from N,N'-bis(2,6-diisopropylphenyl)-1,7-di(2,6-diisopropylphenoxy)perylene-3,4; 9,10-tetracarboximide and N,N'-bis(2,6-diisopropylphenyl)-1,6-di(2,6-diisopropylphenoxy)perylene-3,4; 9,10-tetracarboximide, scattering bodies based on $TiO_2$ and at least one polymer consisting of polycarbonate.

In a very particularly preferred embodiment, inventive color converters comprise at least one compound selected from 51
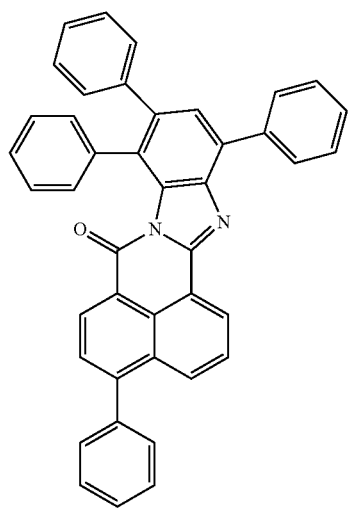
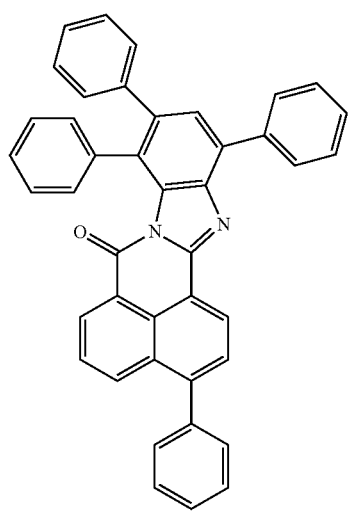
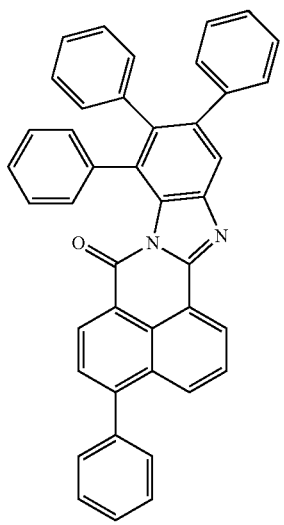
52
-continued
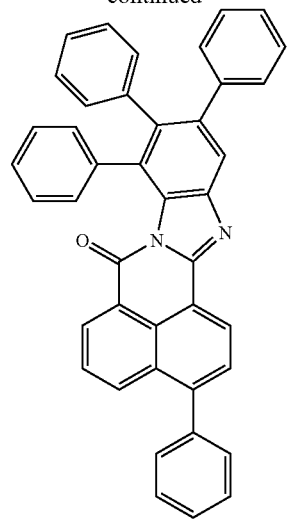
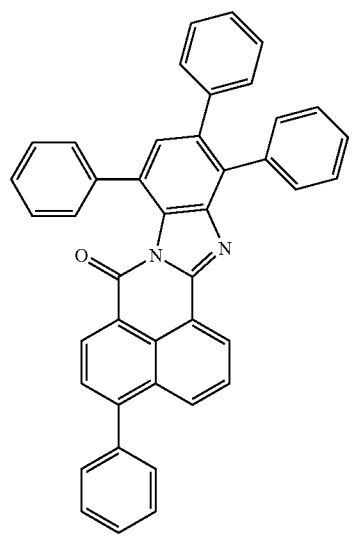
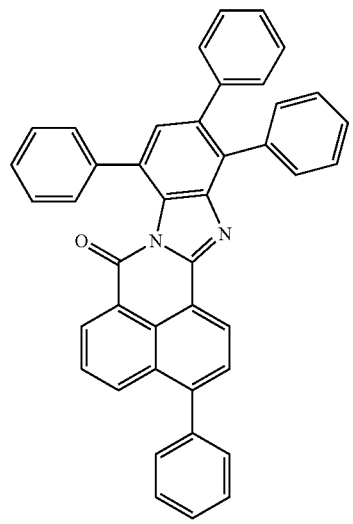

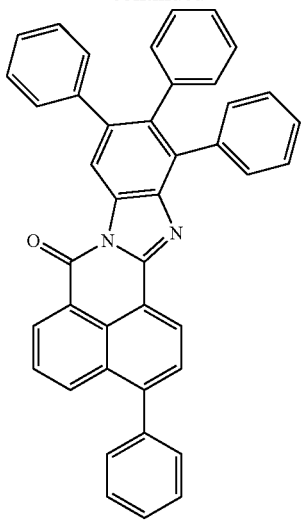 [SMILES: O=c1c2cccc3c(-c4ccccc4)ccc(c32)c2nc3c(-c4ccccc4)c(-c4ccccc4)c(-c4ccccc4)cc3n12]
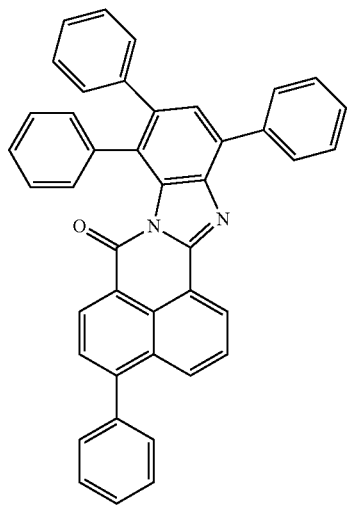 [SMILES: O=c1c2ccc(-c3ccccc3)c3cccc(c32)c2nc3c(-c4ccccc4)cc(-c4ccccc4)c(-c4ccccc4)c3n12]
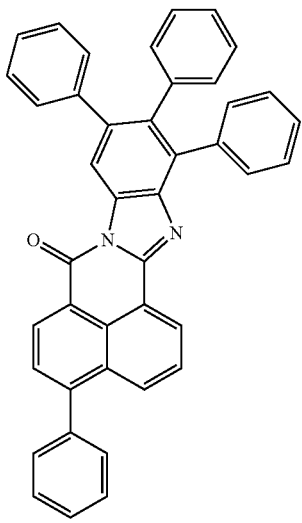
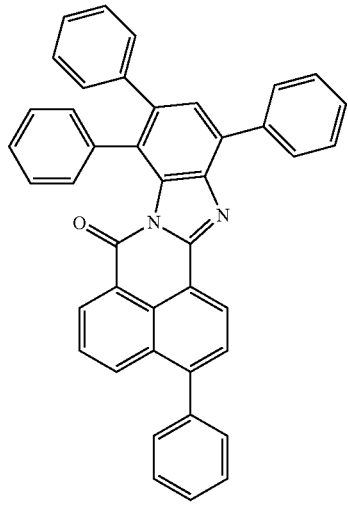
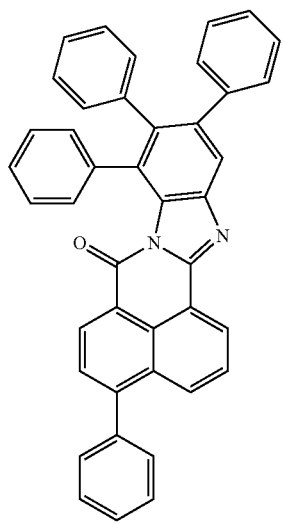

as the inventive organic fluorescent dye, scattering bodies based on $TiO_2$ and at least one polymer consisting essentially of polystyrene. According to a specific aspect of this embodiment, the inventive color converter additionally comprises N,N'-bis(2,6-diisopropylphenyl)-1,6,7,12-tetraphenoxyperylene-3,4; 9,10-tetracarboximide as the red organic fluorescent dye. According to a further specific aspect of this embodiment, the inventive color converter additionally comprises a red organic fluorescent dye selected from N,N'-bis(2,6-diisopropylphenyl)-1,7-di(2,6-diisopropylphenoxy)perylene-3,4; 9,10-tetracarboximide and N,N'-bis(2,6-diisopropylphenyl)-1,6-di(2,6-diisopropylphenoxy)perylene-3,4; 9,10-tetracarboximide.

In a very particularly preferred embodiment, inventive color converters comprise at least one compound selected from

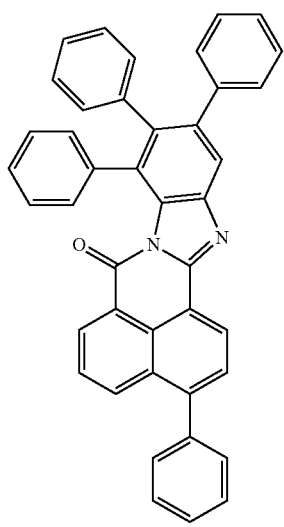

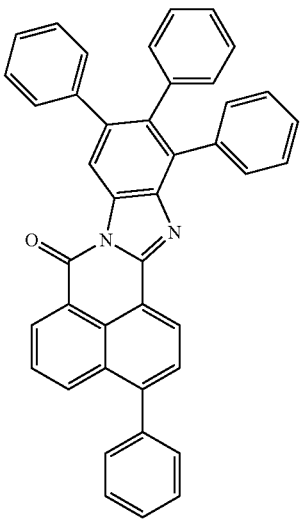

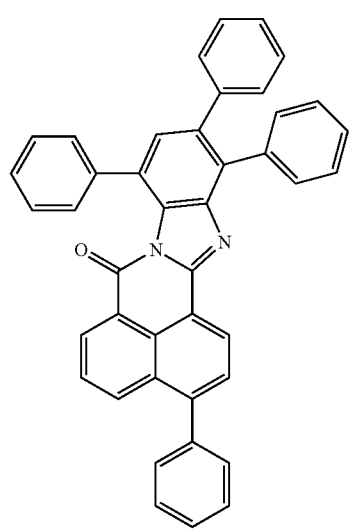

as the inventive organic fluorescent dye, scattering bodies based on TiO$_2$ and at least one polymer consisting essentially of polycarbonate. According to a specific aspect of this embodiment, the inventive color converter additionally comprises N,N'-bis(2,6-diisopropylphenyl)-1,6,7,12-tetraphenoxyperylene-3,4; 9,10-tetracarboximide as the red organic fluorescent dye. According to a further specific aspect of this embodiment, the inventive color converter additionally comprises a red organic fluorescent dye selected from N,N'-bis(2,6-diisopropylphenyl)-1,7-di(2,6-diisopropylphenoxy)perylene-3,4; 9,10-tetracarboximide and N,N'-bis(2,6-diisopropylphenyl)-1,6-di(2,6-diisopropylphenoxy)perylene-3,4; 9,10-tetracarboximide.

In a special embodiment, inventive color converters comprise

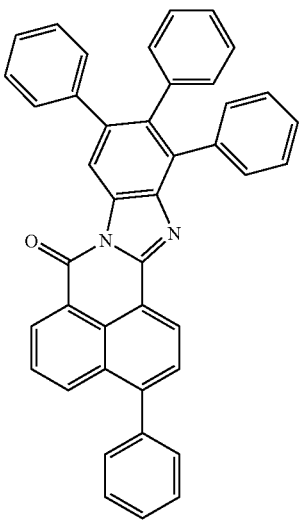

as the inventive organic fluorescent dye, scattering bodies based on $TiO_2$ and at least one polymer consisting essentially of polycarbonate. According to a specific aspect of this embodiment, the inventive color converter additionally comprises N,N'-bis(2,6-diisopropylphenyl)-1,6,7,12-tetraphenoxyperylene-3,4; 9,10-tetracarboximide as the red organic fluorescent dye. According to a further specific aspect of this embodiment, the inventive color converter additionally comprises a red organic fluorescent dye selected from N,N'-bis(2,6-diisopropylphenyl)-1,7-di(2,6-diisopropylphenoxy)perylene-3,4; 9,10-tetracarboximide and N,N'-bis(2,6-diisopropylphenyl)-1,6-di(2,6-diisopropylphenoxy)perylene-3,4; 9,10-tetracarboximide.

In a further special embodiment, inventive color converters comprise

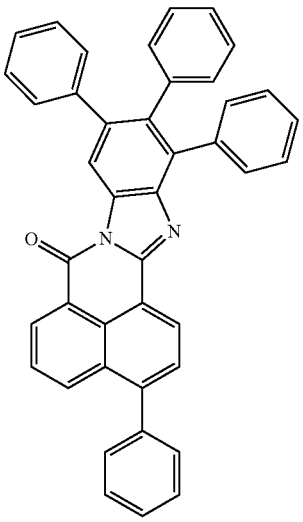

as the inventive organic fluorescent dye, scattering bodies based on $TiO_2$ and at least one polymer consisting essentially of polystyrene. According to a specific aspect of this embodiment, the inventive color converter additionally comprises N,N'-bis(2,6-diisopropylphenyl)-1,6,7,12-tetraphenoxyperylene-3,4; 9,10-tetracarboximide as the red organic fluorescent dye. According to a further specific aspect of this embodiment, the inventive color converter additionally comprises a red organic fluorescent dye selected from N,N'-bis(2,6-diisopropylphenyl)-1,7-di(2,6-diisopropylphenoxy)perylene-3,4; 9,10-tetracarboximide and N,N'-bis(2,6-diisopropylphenyl)-1,6-di(2,6-diisopropylphenoxy)perylene-3,4; 9,10-tetracarboximide.

If the color converter has a multilayer structure, in one embodiment, one layer comprises at least one red fluorescent dye and another layer at least one fluorescent dye encompassed by the invention.

In one embodiment, the at least one red organic fluorescent dye is present in the layer of the color converter facing the LED. In another embodiment, the at least one green or green-yellow fluorescent dye is present in the layer of the color converter facing the LED.

In a preferred embodiment, the color converter has a two-layer structure with a red-fluorescing layer and a green-yellow-fluorescing layer comprising at least one fluorescent dye present in accordance with the invention, with the red layer facing the blue light source. In this embodiment, both layers comprise $TiO_2$ as a scattering body.

A further preferred embodiment for color converters has a one-layer structure, comprising at least one yellow fluorescent dye present in accordance with the invention and at least one red fluorescent dye of the formula (XXX) and scattering bodies in one layer. In this embodiment, the polymer consists preferably of polystyrene or polycarbonate.

In one embodiment, at least one polymer layer of the color converter has been mechanically reinforced with glass fibres.

Inventive color converters may be present in any geometric arrangement. The color converters may be present, for example, in the form of films, sheets or plaques. It is likewise possible for the matrix comprising organic fluorescent colorants to be present in droplet or hemispherical form, or in the form of lenses with convex and/or concave, flat or spherical surfaces.

Casting refers to the embodiment where LEDs or components comprising LEDs are fully cast or enveloped with polymer comprising an organic fluorescent dye.

In one embodiment of the invention, the polymer layers (matrices) comprising organic fluorescent dye are 25 to 200 micrometers in thickness, preferably 35 to 150 μm and more preferably 50 to 100 μm.

In another embodiment, the polymer layers comprising organic fluorescent dye are 0.2 to 5 millimeters in thickness, preferably 0.3 to 3 mm, more preferably 0.4 to 1 mm.

When the color converters consist of one layer or have a layer structure, the individual layers, in a preferred embodiment, are continuous and do not have any holes or interruptions.

The concentration of the organic fluorescent dyes in the polymer depends on factors including the thickness of the color converter and of the polymer layer. If a thin polymer layer is used, the concentration of the organic fluorescent dye is generally higher than in the case of a thick polymer layer.

Typically, the concentration of the organic fluorescent dyes is 0.001 to 0.5% by weight, preferably 0.002 to 0.1% by weight, most preferably 0.005 to 0.05% by weight, based in each case on the amount of the polymer. Typically, the concentration of the red organic fluorescent dye is 0.001 to 0.5% by weight, preferably 0.002 to 0.1% by weight, most preferably 0.005 to 0.05% by weight, based on the amount of polymer used.

In a preferred embodiment, at least one of the layers or matrices comprising fluorescent dye comprises scattering bodies for light.

In a further preferred embodiment of the multilayer structure, several layers comprising fluorescent dye and one or more layers comprising scatterers without fluorescent dye are present.

Suitable scattering bodies are inorganic white pigments, for example titanium dioxide, barium sulphate, lithopone, zinc oxide, zinc sulphide, calcium carbonate with a mean particle size to DIN 13320 of 0.01 to 10 µm, preferably 0.1 to 1 µm, more preferably 0.15 to 0.4 µm.

Scattering bodies are included typically in an amount of 0.01 to 2.0% by weight, preferably 0.05 to 0.5% by weight, more preferably 0.1 to 0.4% by weight, based in each case on the polymer of the layer comprising scattering bodies.

Inventive color converters may optionally comprise further constituents, such as a carrier layer.

Carrier layers serve to impart mechanical stability to the color converter. The type of material of the carrier layers is not crucial, provided that it is transparent and has the desired mechanical strength. Suitable materials for carrier layers are, for example, glass or transparent rigid organic polymer, such as polycarbonate, polystyrene or polymethacrylates or polymethyl methacrylates.

Carrier layers generally have a thickness of 0.1 mm to 10 mm, preferably 0.3 mm to 5 mm, more preferably 0.5 mm to 2 mm.

In one embodiment of the invention, inventive color converters have at least one barrier layer against oxygen and/or water, as disclosed in the application EP 11003839.5 (now PCT/EP2012/058503), which was yet to be published at the priority date of the present application. Examples of suitable barrier materials for barrier layers are, for example, glass, quartz, metal oxides, $SiO_2$, a multilayer system composed of alternating layers of $Al_2O_3$ and $SiO_2$ layers, titanium nitride, $SiO_2$/metal oxide multilayer materials, polyvinyl alcohol, polyacrylonitrile, polyvinylidene chloride (PVDC), liquid-crystalline polymers (LCPs), polystyrene-acrylonitrile (SAN), polybutylene terephthalate (PBT), polybutylene naphthalate (PBN), polyethylene terephthalate (PET), polyethylene naphthalate (PEN), polyvinyl butyrate (PVT), polyvinyl chloride (PVC), polyamides, polyoxymethylenes, polyimides, polyether imides, epoxy resins, polymers derived from ethylene vinyl acetate (EVA) and polymers derived from ethylene vinyl alcohol (EVOH).

A preferred material for barrier layers is glass or a multilayer system composed of alternating layers of $Al_2O_3$ and $SiO_2$ layers.

Preferably, suitable barrier layers have a low oxygen permeability.

More preferably, suitable barrier layers have a low oxygen and water permeability.

Inventive color converters are especially suitable for the conversion of blue light to green-yellow light.

They are especially suitable for conversion of light emitted by blue LEDs. Suitable LEDs are, for example, those based on gallium nitride (GaN). It is likewise possible to use them for conversion of light produced by mercury lamps, by organic light-emitting diodes (OLEDs) or by UV-LEDs.

They are additionally suitable for applications as a light collection system (fluorescence collector) in photovoltaics and in fluorescence conversion solar cells.

In a further embodiment, the inventive color converters are used for the conversion of blue light to white light.

Inventive color converters exhibit a high quantum yield on irradiation with light, especially with blue LED light. In addition, they have a long lifetime and especially a high photostability on illumination with blue light. They emit pleasant light with good color reproduction.

Inventive color converters can be produced by different processes.

In one embodiment, the process for producing inventive color converters comprises the dissolution of the at least one polymer and of the at least one organic fluorescent dye in a solvent and subsequent removal of the solvent.

In another embodiment, the process for production of inventive color converters comprises the extrusion of the at least one organic fluorescent dye with the at least one polymer.

The invention further provides illumination devices comprising at least one LED and at least one inventive color converter. The at least one LED is preferably blue and emits light preferably within a wavelength range from 400 to 500 nm, preferably 420 to 480 nm, more preferably 440 to 470 nm, most preferably 445 to 460 nm.

In one embodiment, inventive illumination devices comprise exactly one LED. In another embodiment, inventive illumination devices comprise several LEDs.

In one embodiment, inventive illumination devices comprise several LEDs, all of which are blue. In another embodiment, inventive illumination devices comprise several LEDs, at least one LED being blue and at least one LED not being blue, but rather emitting light in another color, for example red.

In addition, the type of LED used is not crucial for the inventive illumination devices. In a preferred embodiment, the power density of the LED used is less than 20 mW/cm$^2$, preferably less than 15 mW/cm$^2$. The use of LEDs of higher power densities such as 25 or 30 mW/cm$^2$ is likewise possible. A higher power density of the LED can, however, reduce the lifetime of the fluorescent dyes and of the color converters.

Inventive color converters can be used in combination with LEDs in virtually any geometric shape and irrespective of the structure of the illumination device.

In one embodiment, color converter and LED are present in a phosphor on a chip arrangement.

Preferably, inventive color converters are used in a remote phosphor structure. In this case, the color converter is spatially separated from the LED. In general, the distance between LED and color converter is from 0.1 cm to 50 cm, preferably 0.2 to 10 cm and most preferably 0.5 to 2 cm. Between color converter and LED may be different media, such as air, noble gases, nitrogen or other gases, or mixtures thereof.

The color converter may, for example, be arranged concentrically around the LED or have a planar geometry. It may be present, for example, as a plaque, sheet, film, in droplet form or as a casting.

Inventive illumination devices are suitable for illumination indoors, outdoors, of offices, of vehicles, in torches, games consoles, street lights, illuminated traffic signs.

Inventive illumination devices exhibit a high quantum yield. In addition, they have a long lifetime, especially a high photostability on illumination with blue light. They emit pleasant light with good color reproduction.

The present invention further provides novel polymer mixtures comprising at least one polymer and at least one organic fluorescent dye, comprising at least one structural unit of the formula (II)

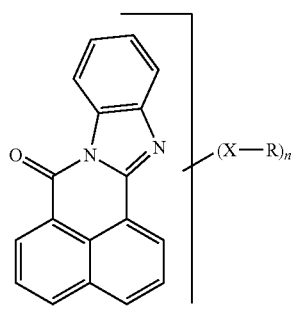

(II)

where the symbols are each defined as follows:

n is a number from 0 to (10-p) for each structural unit of the formula (II, preferably a number from 1, 2, 3, 4 or to 5 for each structural unit of the formula (II), (X—R) is phenyl, tolyl, ethylphenyl, ortho/meta/para xylyl, mesityl, naphthyl, anthranyl, phenanthrenyl, pyrenyl, benzopyrenyl, fluorenyl, indanyl, indenyl, tetralinyl, phenoxy, thiophenoxy, 4-ethoxyphenyl, each of which may be mono- or polysubstituted by identical or different radicals (i), (ii), (iii), (iv) and/or (v):

(i) $C_1$-$C_{30}$-alkyl whose carbon chain may comprise one or more —O—, —S—, —NR$^1$—, —C≡C—, —CR$^1$=CR$^1$— and/or —CO— moieties and which may be mono- or polysubstituted by: $C_1$-$C_{12}$-alkoxy, hydroxyl, halogen, cyano and/or aryl which may be mono- or polysubstituted by $C_1$-$C_{18}$-alkyl and/or $C_1$-$C_6$-alkoxy;

(ii) $C_3$-$C_5$-cycloalkyl whose carbon skeleton may comprise one or more —O—, —S—, —NR$^1$—, —CR$^1$=CR$^1$— and/or —CO— moieties and which may be mono- or polysubstituted by $C_1$-$C_8$-alkyl, $C_1$-$C_{12}$-alkoxy and/or $C_1$-$C_6$-alkylthio;

(iii) aryl or hetaryl, to each of which may be fused further 5- to 7-membered saturated or unsaturated rings whose carbon skeleton may comprise one or more —O—, —S—, —NR$^1$—, —N=CR$^1$—, —CR$^1$=CR$^1$—, —CO—, —SO— and/or —SO$_2$— moieties, where the overall ring system may be mono- or polysubstituted by: $C_1$-$C_{18}$-alkyl, $C_1$-$C_{12}$-alkoxy, —C=CR$^1$—, —CR$^1$=CR$^1$—, hydroxyl, halogen, cyano, —NR$^2$R$^3$, —NR$^2$COR$^3$, —CONR$^2$R$^3$, —SO$_2$NR$^2$R$^3$, —COOR$^2$ and/or —SO$_3$R$^2$;

(iv) a —U-aryl radical which may be mono- or polysubstituted by the above radicals mentioned as substituents for the aryl radicals (iii), where U is a —O—, —S—, —NR$^1$—, —CO—, —SO— or —SO$_2$— moiety;

(v) $C_1$-$C_{12}$-alkoxy, $C_1$-$C_6$-alkylthio, —C≡CR$^1$, —CR$^1$=CR$^1$$_2$, hydroxyl, mercapto, halogen, cyano, nitro, —NR$^2$R$^3$, —NR$^2$COR$^3$, —CONR$^2$R$^3$, —SO$_2$NR$^2$R$^3$, —COOR$^2$ or —SO$_3$R$^2$;

where

R$^1$, R$^2$, R$^3$ are each independently hydrogen;

$C_1$-$C_1$-alkyl whose carbon chain may comprise one or more —O—, —S—, —CO—, —SO— and/or —SO$_2$— moieties and which may be mono- or polysubstituted by $C_1$-$C_{12}$-alkoxy, $C_1$-$C_6$-alkylthio, hydroxyl, mercapto, halogen, cyano, nitro and/or —COOR$^1$;

aryl or hetaryl, to each of which may be fused further saturated or unsaturated 5- to 7-membered rings whose carbon skeleton may comprise one or more —O—, —S—, —CO— and/or —SO$_2$— moieties, where the overall ring system may be mono- or polysubstituted by $C_1$-$C_{12}$-alkyl and/or the above radicals mentioned as substituents for alkyl.

More preferably, the inventive polymer mixtures comprise organic fluorescent dyes selected from

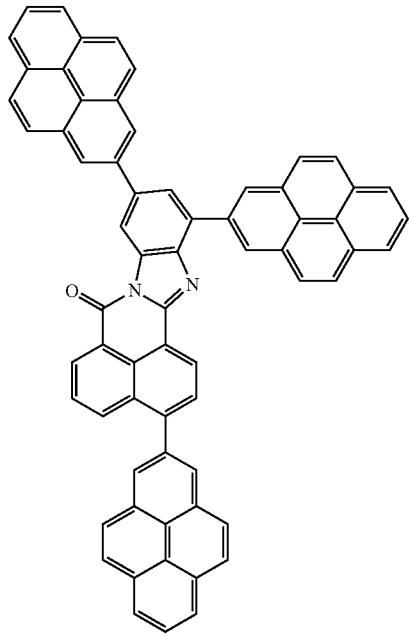

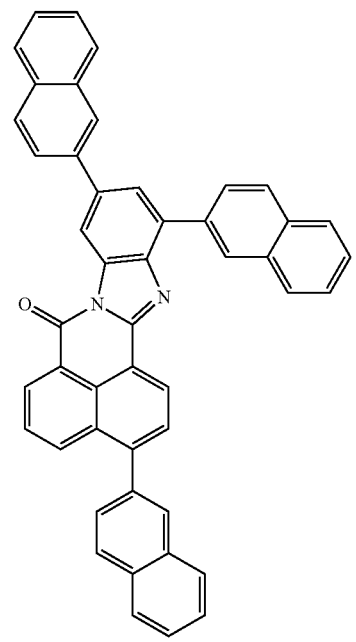

63
-continued
64
-continued
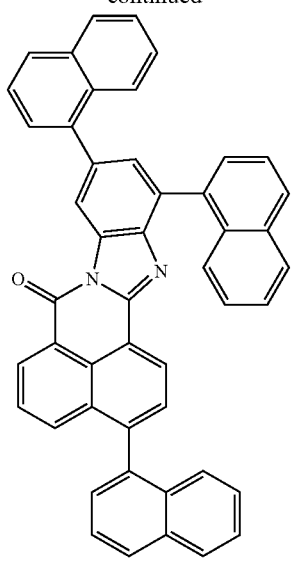
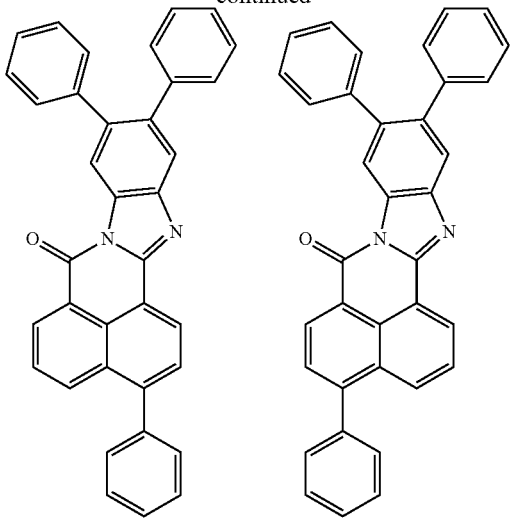
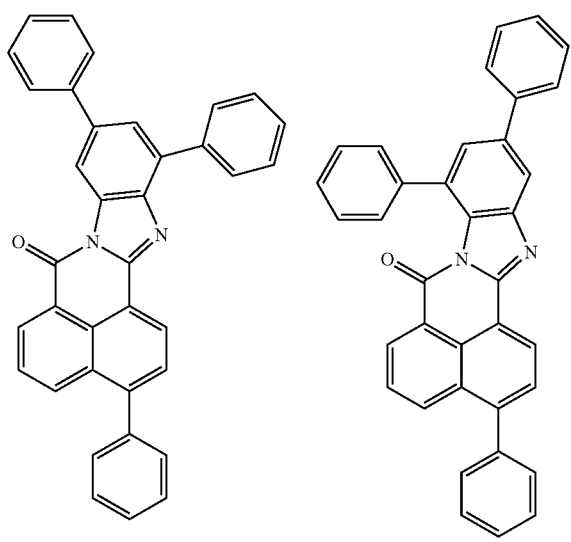
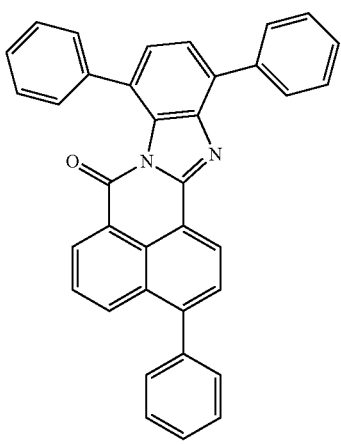
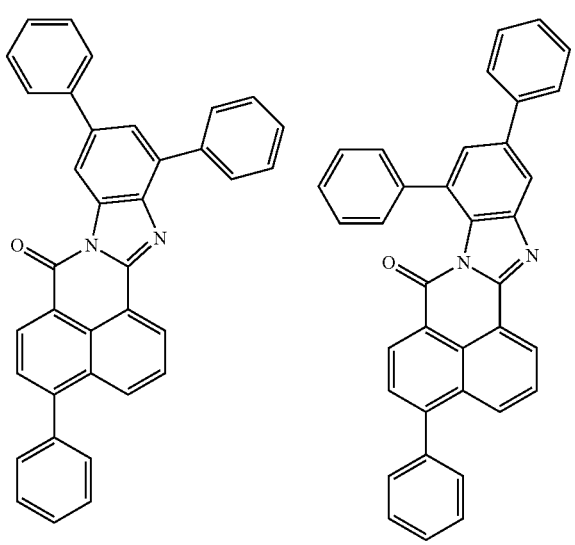
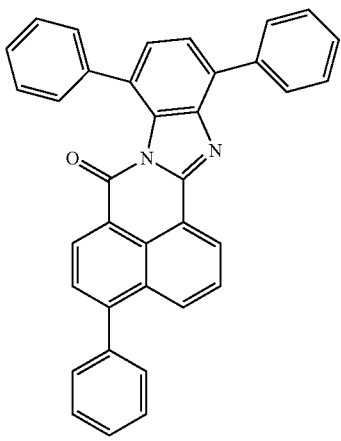

65
-continued
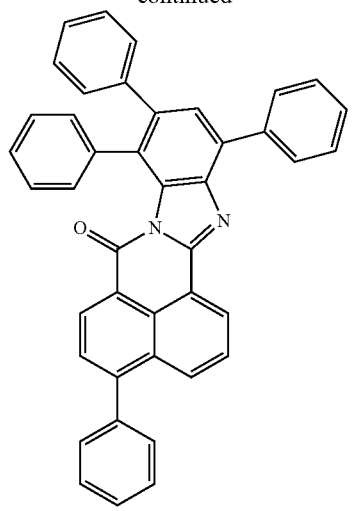
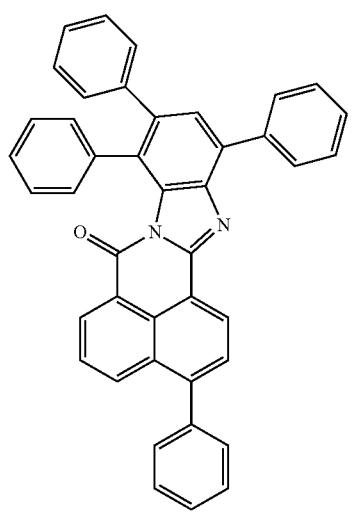
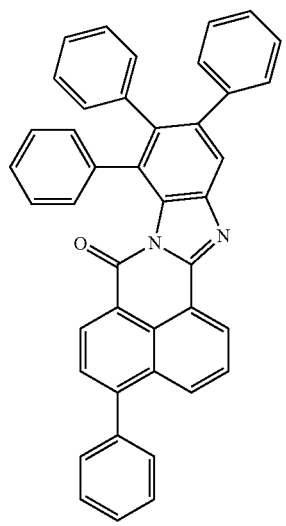
66
-continued
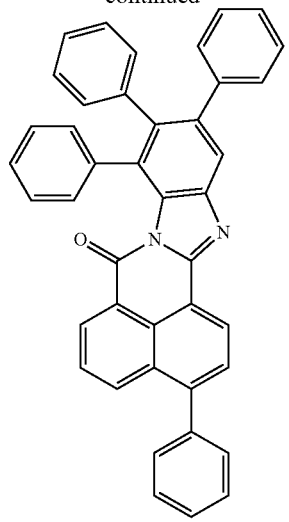
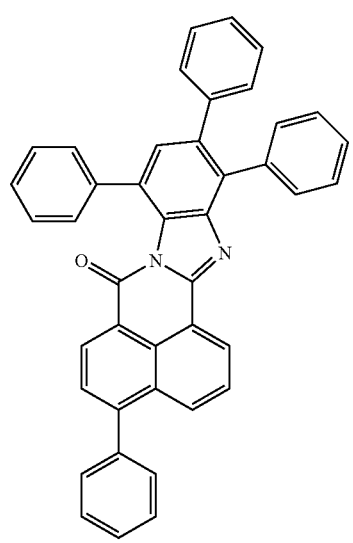
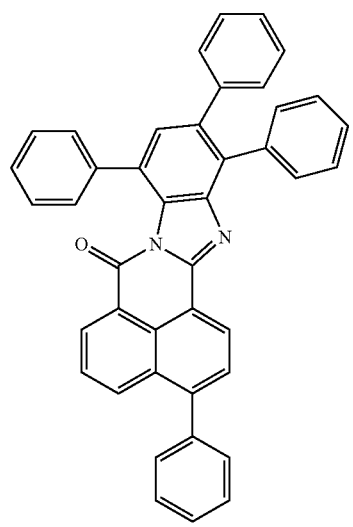

67
-continued
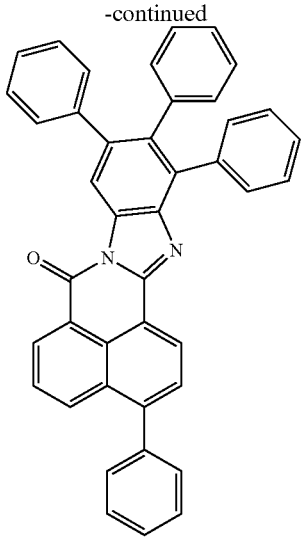
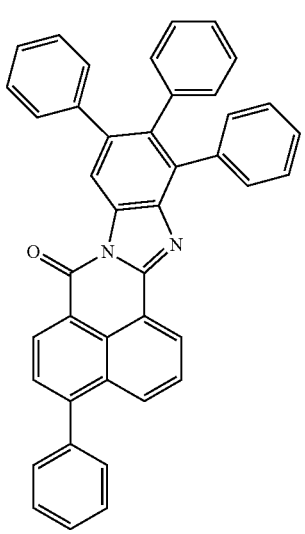
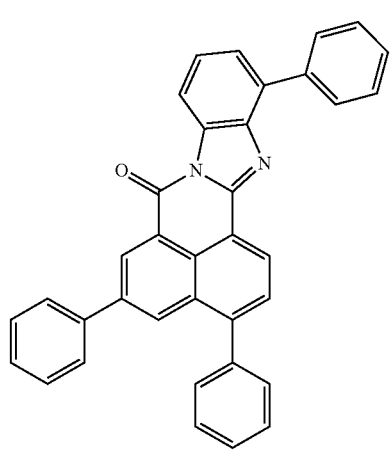
68
-continued
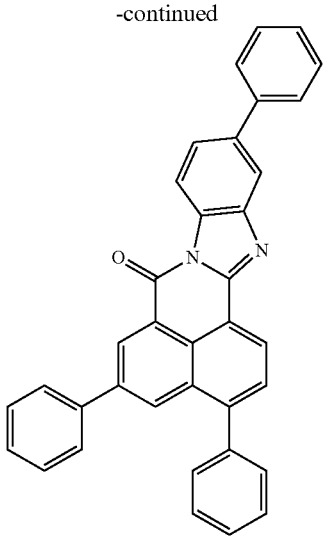
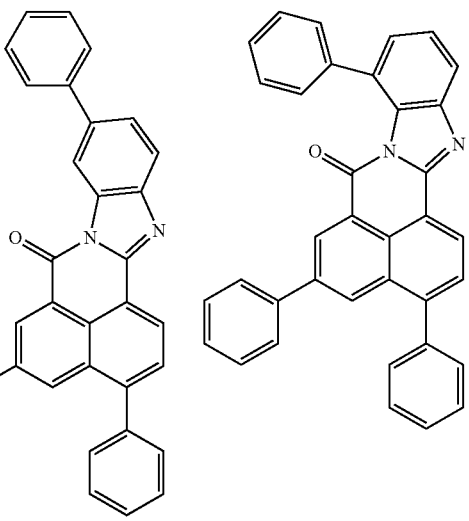
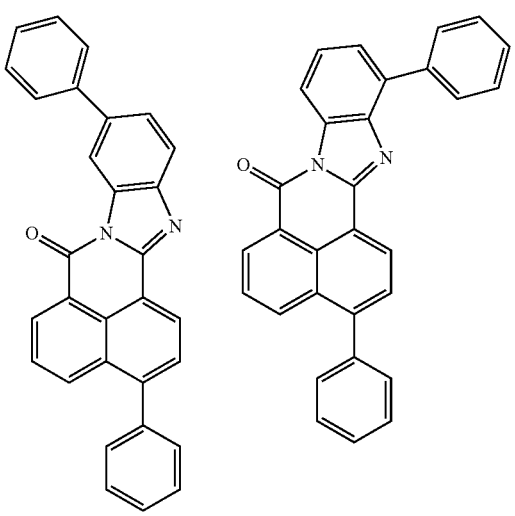

69
-continued
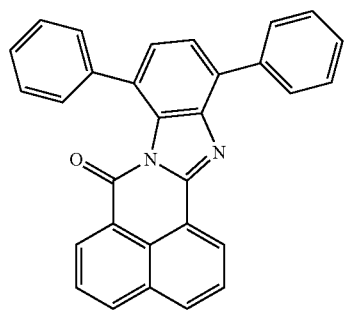
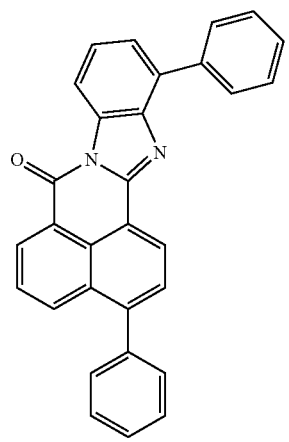
70
-continued
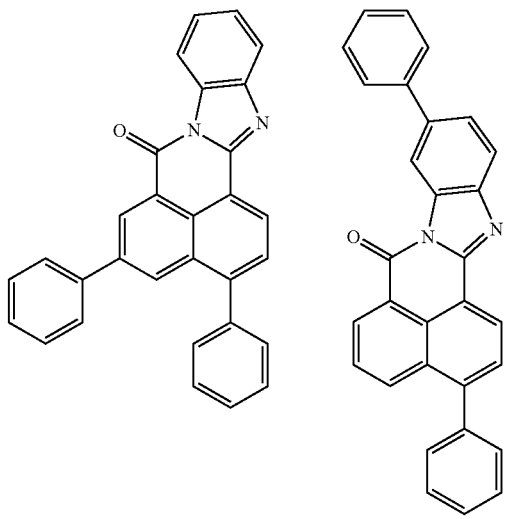
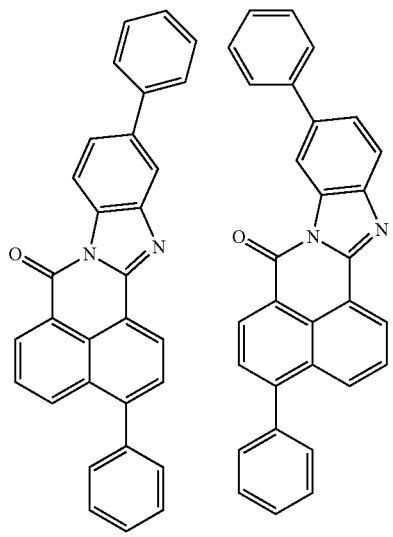
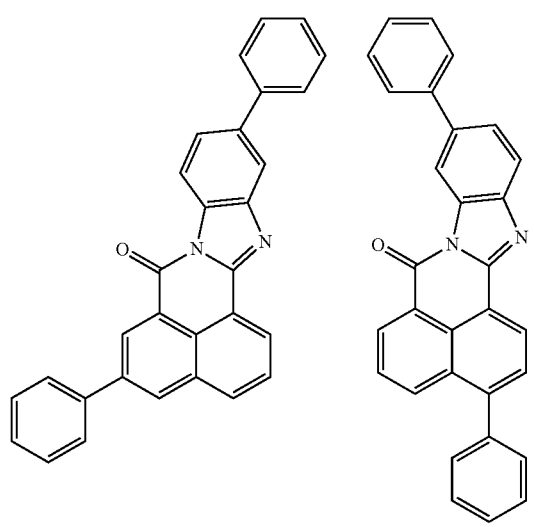
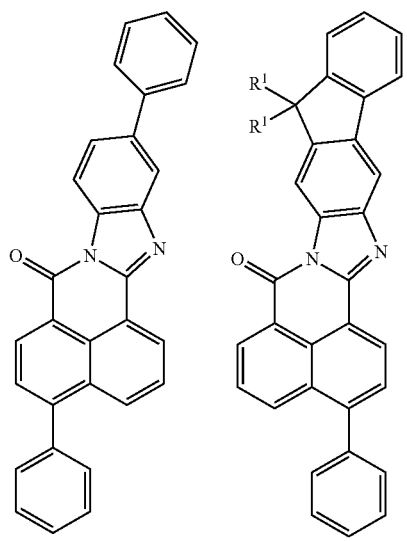

-continued
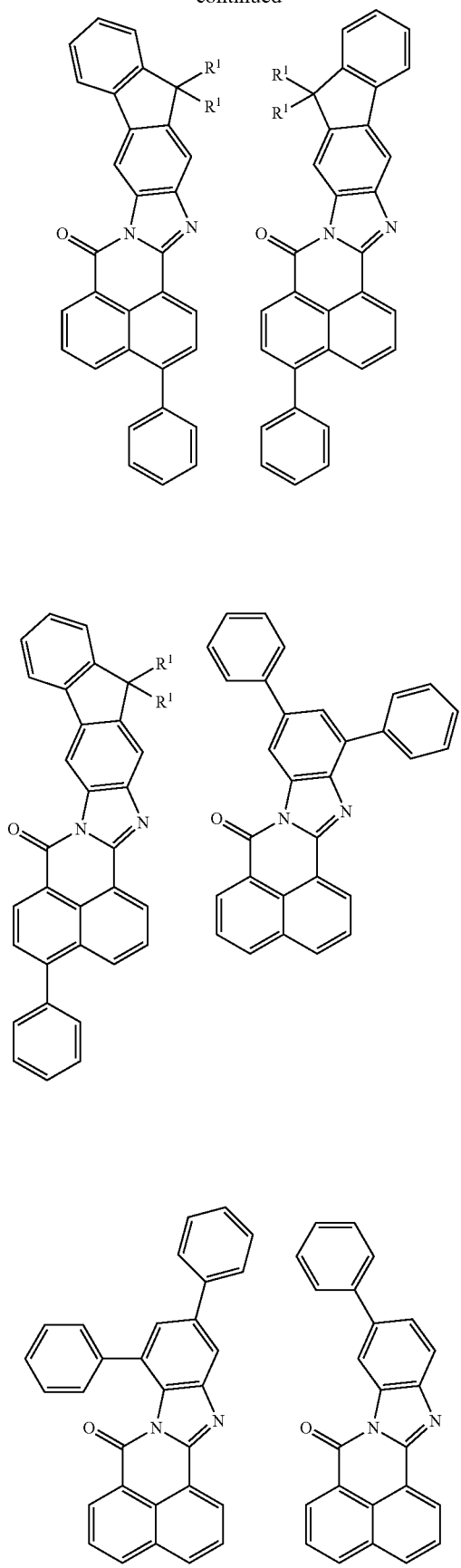
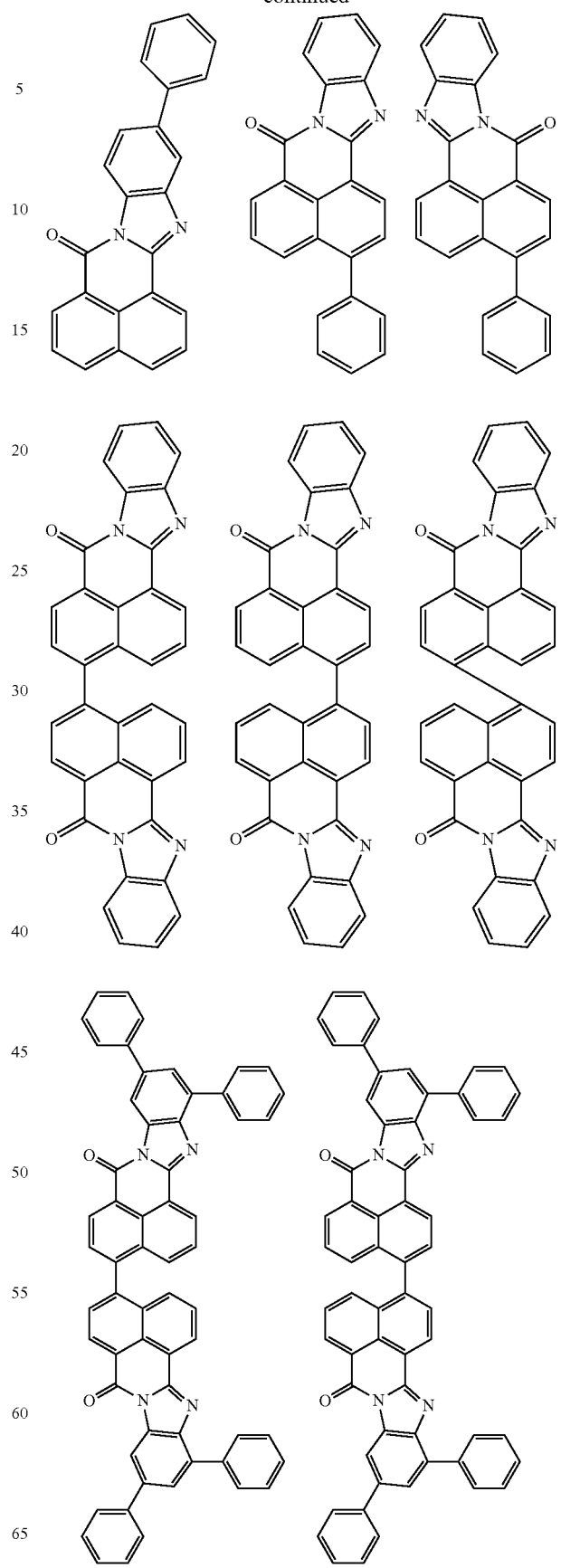

-continued

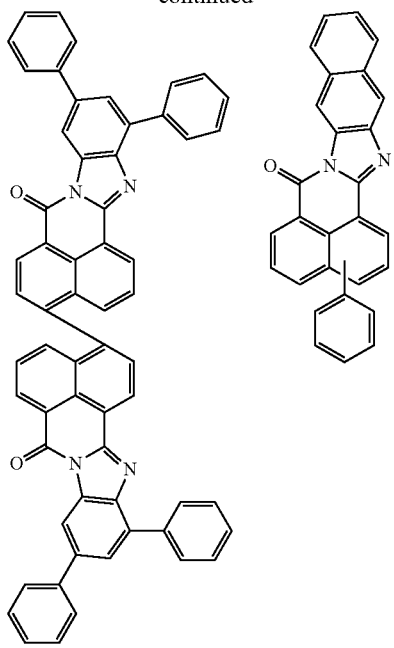

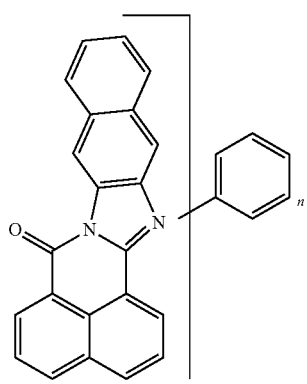

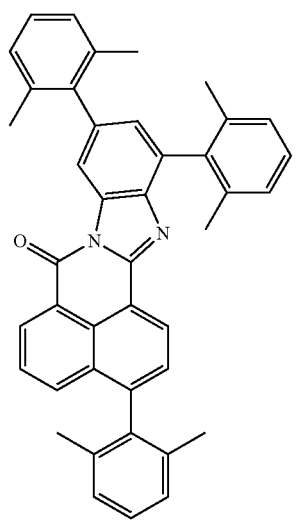

-continued

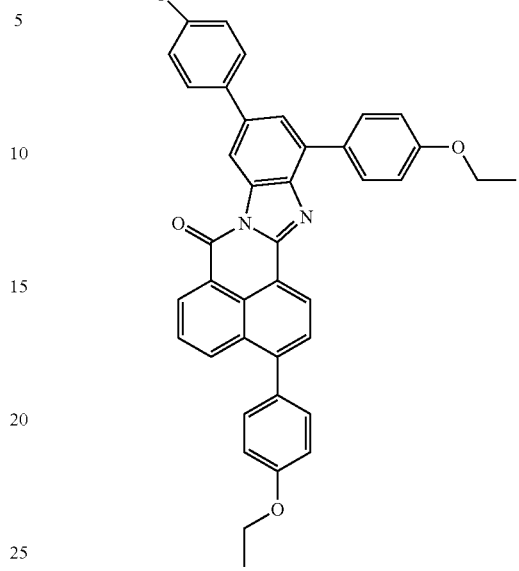

or mixtures thereof, where n is a number from 0, 1, 2, 3, 4, 5, 6, 7, 8, 9 or 10;

$R^1$ is independently hydrogen, $C_1$-$C_{18}$-alkyl or cycloalkyl, the carbon chain of which may comprise one or more —O—, —S—, —CO—, —SO— and/or —SO$_2$— moieties and which may be mono- or polysubstituted;

aryl or hetaryl which may be mono- or polysubstituted.

A polymer mixture is understood to mean, in the context of this invention, the mixture of at least one suitable polymer with at least one above-described organic fluorescent dye.

Polymers suitable for inventive polymer mixtures are in principle all polymers which are capable of dissolving or of homogeneously distributing the at least one organic fluorescent dye in a sufficient amount.

Suitable polymers may be inorganic polymers or organic polymers.

Suitable inorganic polymers are, for example, silicates or silicon dioxide. A prerequisite for the use of inorganic polymers is that the at least one organic fluorescent dye can be dissolved or homogeneously distributed therein without decomposition. In the case of silicates or silicon dioxide, this can be accomplished, for example, by deposition of the polymer from a waterglass solution.

Suitable organic polymers are, for example, polystyrene, polycarbonate, polymethyl methacrylate, polyvinylpyrrolidone, polymethacrylate, polyvinyl acetate, polyvinyl chloride, polybutene, polyethylene glycol, silicone, polyacrylate, epoxy resin, polyvinyl alcohol, polyacrylonitrile, polvinylidene chloride (PVDC), polystyrene-acrylonitrile (SAN), polybutylene terephthalate (PBT), polyethylene terephthalate (PET), polyvinyl butyrate (PVB), polyvinyl chloride (PVC), polyamides, polyoxymethylenes, polyimides, polyether imide or mixtures thereof.

Preferably, the at least one polymer consists essentially of polystyrene, polycarbonate, polymethyl methacrylate or mixtures thereof.

Most preferably, the at least one polymer consists essentially of polystyrene or polycarbonate.

Polystyrene is understood here to include all homo- or copolymers which result from polymerization of styrene and/or derivatives of styrene. Derivatives of styrene are, for example, alkylstyrenes such as alpha-methylstyrene, ortho-, meta-, para-methylstyrene, para-butylstyrene, especially para-tert-butylstyrene, alkoxystyrene such as para-methoxystyrene, para-butoxystyrene, para-tert-butoxystyrene.

In general, suitable polystyrenes have a mean molar mass $M_n$ of 10 000 to 1 000 000 g/mol (determined by GPC), preferably 20 000 to 750 000 g/mol, more preferably 30 000 to 500 000 g/mol.

In a preferred embodiment, the matrix of the color converter consists essentially or completely of a homopolymer of styrene or styrene derivatives.

In further preferred embodiments of the invention, the matrix consists essentially or completely of a styrene copolymer which is likewise considered to be a polystyrene in the context of this application. Styrene copolymers may comprise, as further constituents, for example, butadiene, acrylonitrile, maleic anhydride, vinylcarbazole, or esters of acrylic acid, methacrylic acid or itaconic acid, as monomers. Suitable styrene copolymers comprise generally at least 20% by weight of styrene, preferably at least 40% and more preferably at least 60% by weight of styrene. In another embodiment, they comprise at least 90% by weight of styrene. Preferred styrene copolymers are styrene-acrylonitrile copolymers (SAN) and acrylonitrile-butadiene-styrene copolymers (ABS), styrene-1,1'-diphenylethene copolymers, acrylic ester-styrene-acrylonitrile copolymers (ASA), methyl methacrylate-acrylonitrile-butadiene-styrene copolymers (MABS). A further preferred polymer is alpha-methylstyrene-acrylonitrile copolymer (AMSAN).

The styrene homo- or copolymers can be prepared, for example, by free-radical polymerization, cationic polymerization, anionic polymerization, or under the influence of organometallic catalysts (for example Ziegler-Natta catalysis). This can lead to isotactic, syndiotactic, atactic polystyrene or copolymers. They are preferably prepared by free-radical polymerization. The polymerization can be performed as a suspension polymerization, emulsion polymerization, solution polymerization or bulk polymerization.

The preparation of suitable polystyrenes is described, for example, in Oscar Nuyken, Polystyrenes and Other Aromatic Polyvinyl Compounds, in Kricheldorf, Nuyken, Swift, New York 2005, p. 73-150 and literature cited therein; and in Elias, Macromolecules, Weinheim 2007, p. 269-275.

Polycarbonates are polyesters of carbonic acid with aromatic or aliphatic dihydroxyl compounds. Preferred dihydroxyl compounds are, for example, methylenediphenyldihydroxyl compounds, for example bisphenol A.

One means of preparing polycarbonates is the reaction of suitable dihydroxyl compounds with phosgene in an interfacial polymerization. Another means is the reaction with diesters of carbonic acid, such as diphenyl carbonate, in a condensation polymerization.

The preparation of suitable polycarbonates is described, for example, in Elias, Macromolecules, Weinheim 2007, p. 343-347.

In a preferred embodiment, polymers which have been polymerized with exclusion of oxygen are used. The monomers preferably comprised, during the polymerization, a total of at most 1000 ppm of oxygen, more preferably at most 100 ppm and especially preferably at most 10 ppm.

Suitable polymers may comprise, as further constituents, additives such as flame retardants, antioxidants, light stabilizers, UV absorbers, free-radical scavengers, antistats. Such stabilizers are known to those skilled in the art.

Suitable antioxidants or free-radical scavengers are, for example, phenols, especially sterically hindered phenols such as butylhydroxyanisole (BHA) or butylhydroxytoluene (BHT), or sterically hindered amines (HALS). Such stabilizers are sold, for example, by BASF under the Irganox® trade name. In some cases, antioxidants and free-radical scavengers can be supplemented by secondary stabilizers such as phosphites or phosphonates, as sold, for example, by BASF under the Irgafos® trade name.

Suitable UV absorbers are, for example, benzotriazoles such as 2-(2-hydroxyphenyl)-2H-benzotriazoles (BTZ), triazines such as (2-hydroxyphenyl)-s-triazines (HPT), hydroxybenzophenones (BP) or oxalanilides. Such UV absorbers are sold, for example by BASF under the Uvinul® trade name.

In a preferred embodiment of the invention, suitable polymers do not comprise any antioxidants or free-radical scavengers.

In one embodiment of the invention, suitable polymers are transparent polymers.

In another embodiment, suitable polymers are opaque polymers.

The polymers mentioned serve as matrix material for the at least one organic fluorescent dye.

The at least one organic fluorescent dye may be present either dissolved in the polymer or as a homogeneously distributed mixture. Preferably, the at least one organic fluorescent dye is present dissolved in the polymer. The at least one organic fluorescent dye is likewise present in the polymer as a homogeneously distributed mixture.

Inventive polymer mixtures may be present, for example, as powder or granules. They may likewise be in the form of plaques, sheets, films.

Inventive polymer mixtures exhibit a high fluorescence quantum yield on irradiation with light, especially with blue LED light. In addition, they have a long lifetime, especially a high photostability on illumination with blue light. They emit pleasant light with good color reproduction.

The present invention further provides novel fluorescent dyes.

These have the general formula (II)

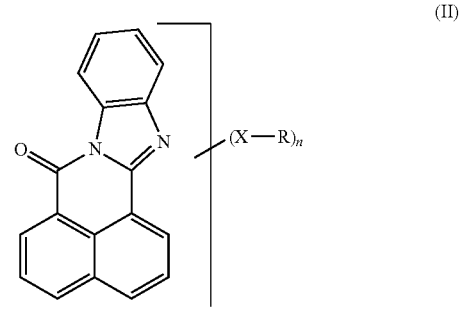

where
n is a number from 1 to 5, e.g. 1, 2, 3, 4, or 5 for each structural unit of the formula (II), (X—R) is phenyl, naphthyl, anthranyl, phenanthrenyl, pyrenyl, benzopyrenyl, fluorenyl, indanyl, indenyl, tetralinyl, phenoxy, thiophenoxy, $C_1$-$C_{12}$ alkoxyphenyl, each of which may be mono- or polysubstituted by identical or different radicals (i), (ii), (iii), (iv) and/or (v):

(i) $C_1$-$C_{30}$-alkyl whose carbon chain may comprise one or more —O—, —S—, —$NR^1$—, —C≡C—, —$CR^1$=$CR^1$— and/or —CO— moieties and which may be mono- or polysubstituted by: $C_1$-$C_{12}$-alkoxy, hydroxyl, halogen, cyano and/or aryl which may be mono- or polysubstituted by $C_1$-$C_{18}$-alkyl and/or $C_1$-$C_6$-alkoxy;

(ii) $C_3$-$C_8$-cycloalkyl whose carbon skeleton may comprise one or more —O—, —S—, —$NR^1$—, —$CR^1$=$CR^1$— and/or —CO— moieties and which may be mono- or polysubstituted by $C_1$-$C_{18}$-alkyl, $C_1$-$C_{12}$-alkoxy and/or $C_1$-$C_6$-alkylthio;

(iii) aryl or hetaryl, to each of which may be fused further 5- to 7-membered saturated or unsaturated rings whose carbon skeleton may comprise one or more —O—, —S—, —$NR^1$—, —N=$CR^1$—, —$CR^1$=$CR^1$—, —CO—, —SO— and/or —$SO_2$— moieties, where the overall ring system may be mono- or polysubstituted by: $C_1$-$C_{18}$-alkyl, $C_1$-$C_{12}$-alkoxy, —C≡$CR^1$—, —$Cr^1$=$CR^1$—, hydroxyl, halogen, cyano, —$NR^2R^3$, —$NR^2COR^3$, —$CONR^2R^3$, —$SO_2NR^2R^3$, —$COOR^2$ and/or —$SO_3R^2$;

(iv) a —U-aryl radical which may be mono- or polysubstituted by the above radicals mentioned as substituents for the aryl radicals (iii), where U is a —O—, —S—, —$NR^1$—, —CO—, —SO— or —$SO_2$— moiety;

(v) $C_1$-$C_{12}$-alkoxy, $C_1$-$C_6$-alkylthio, —C≡$CR^1$, —$CR^1$=$CR^1_2$, hydroxyl, mercapto, halogen, cyano, nitro, —$NR^2R^3$, —$NR^2COR^3$, —$CONR^2R^3$, —$SO_2NR^2R^3$, —$COOR^2$ or —$SO_3R^2$;

$R^1$, $R^2$, $R^3$ are each independently hydrogen;

$C_1$-$C_{18}$-alkyl whose carbon chain may comprise one or more —O—, —S—, —CO—, —SO— and/or —$SO_2$— moieties and which may be mono- or polysubstituted by $C_1$-$C_{12}$-alkoxy, $C_1$-$C_6$-alkylthio, hydroxyl, mercapto, halogen, cyano, nitro and/or —$COOR^1$;

aryl or hetaryl, to each of which may be fused further saturated or unsaturated 5- to 7-membered rings whose carbon skeleton may comprise one or more —O—, —S—, —CO— and/or —$SO_2$— moieties, where the overall ring system may be mono- or polysubstituted by $C_1$-$C_{12}$-alkyl and/or the above radicals mentioned as substituents for alkyl.

Preferably, inventive fluorescent dyes have a structure in which the symbols in formula (II) are each defined as follows:

n is a number from 1 to 5, e.g. 1, 2, 3, 4, or 5 for each structural unit of the formula (II), (X—R) is phenyl, tolyl, ethylphenyl, ortho/meta/para xylyl, mesityl, naphthyl, anthranyl, phenanthrenyl, pyrenyl, benzopyrenyl, fluorenyl, indanyl, indenyl, tetralinyl, phenoxy, thiophenoxy, 4-ethoxyphenyl.

Particular preference is given to fluorescent dyes selected from:

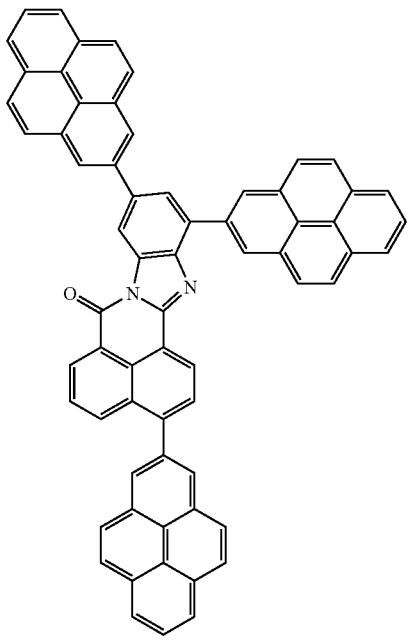

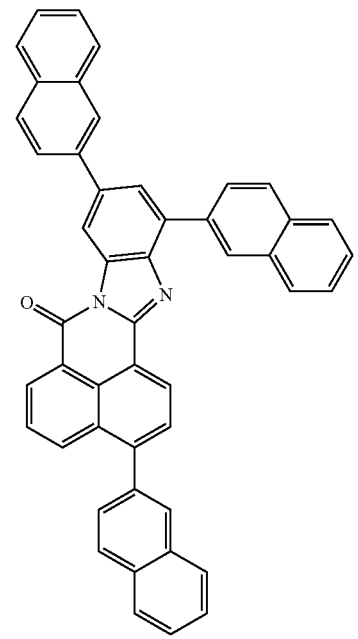

79
-continued
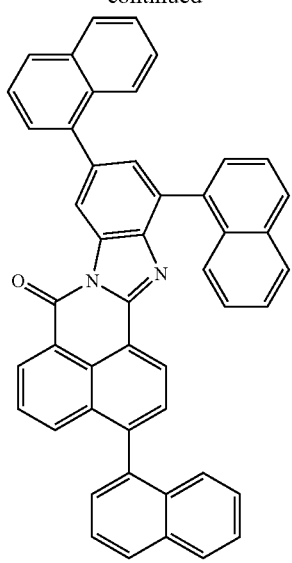
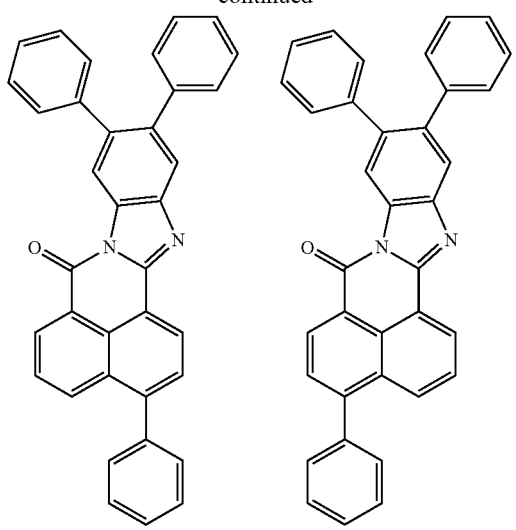
80
-continued
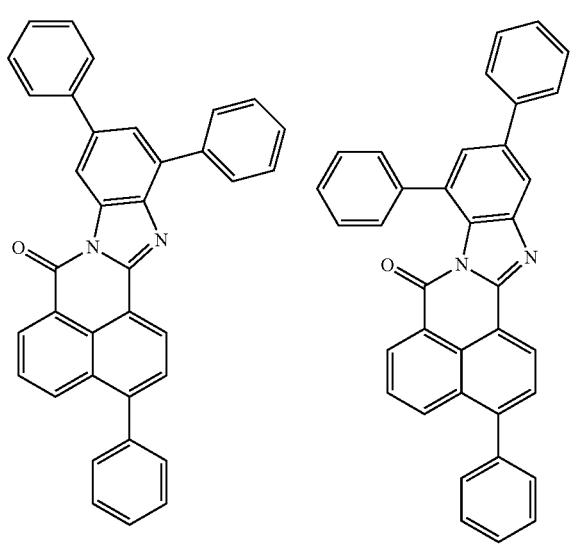
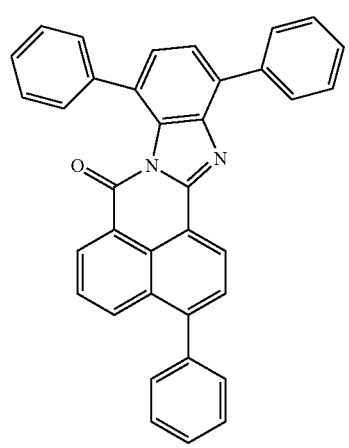
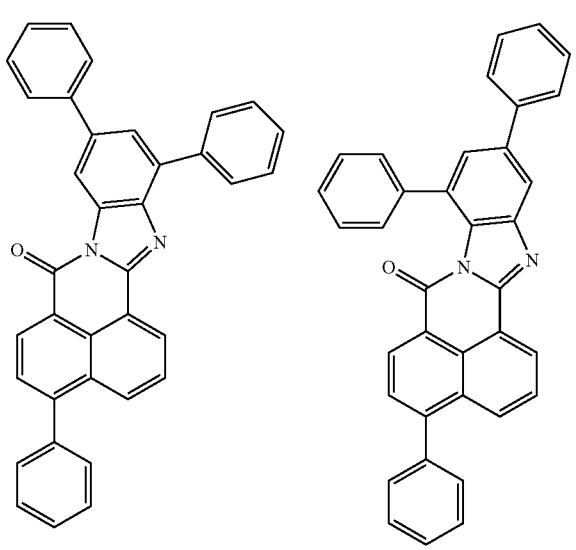
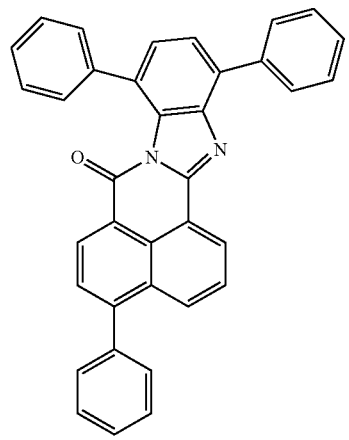

81
-continued
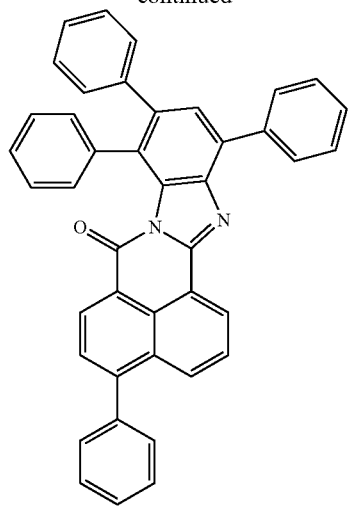
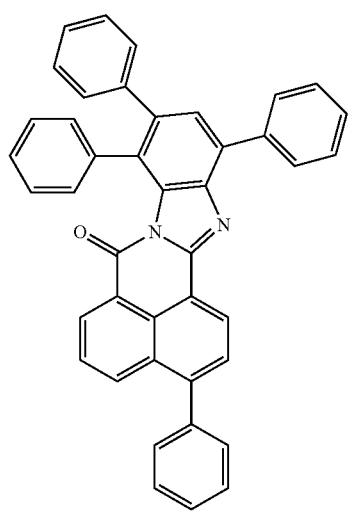
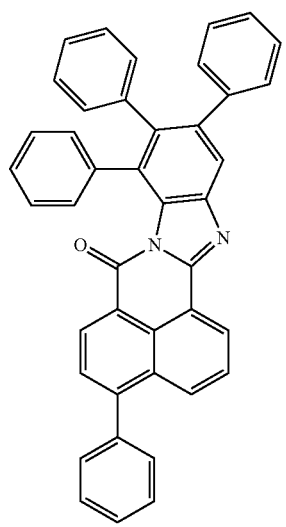
82
-continued
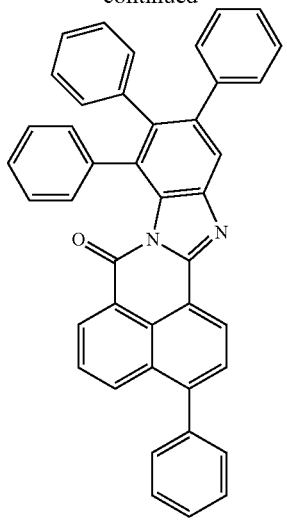
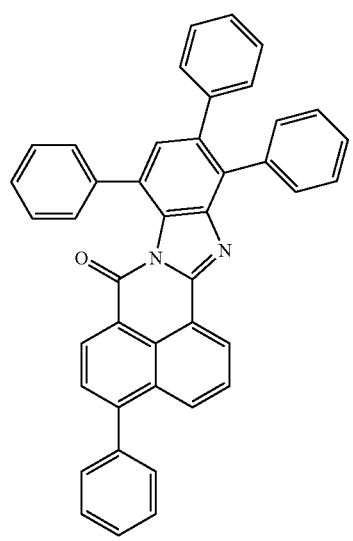
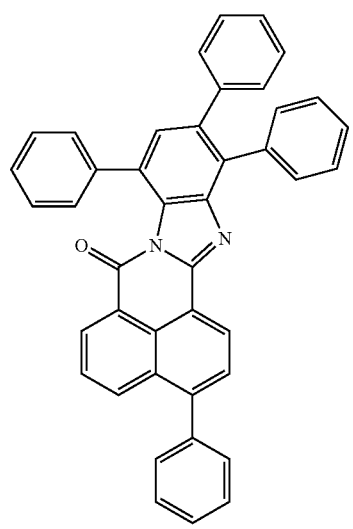

83
-continued
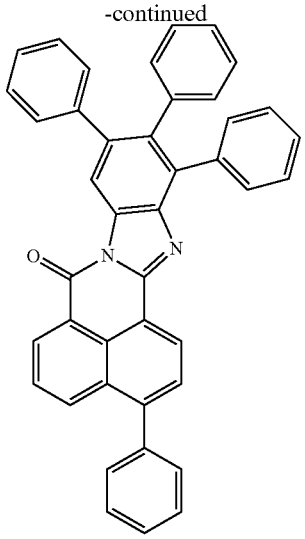
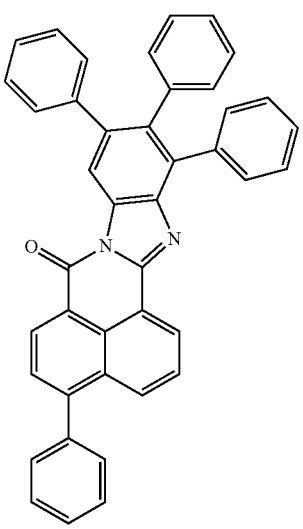
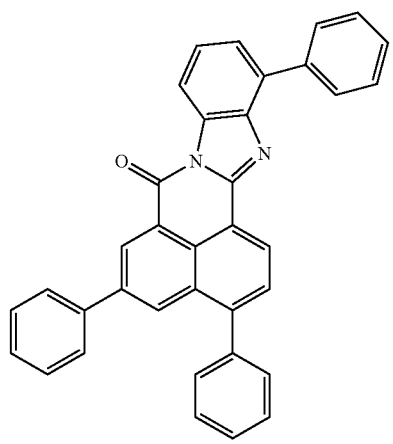
84
-continued
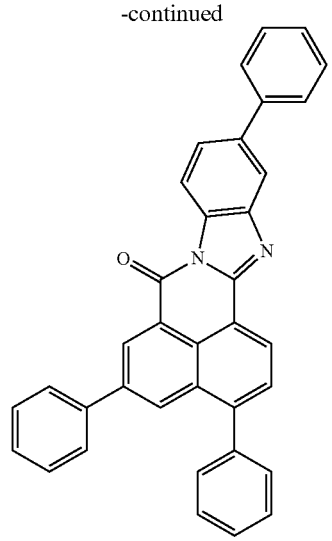
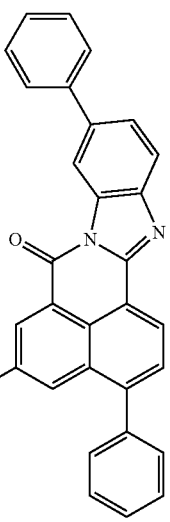 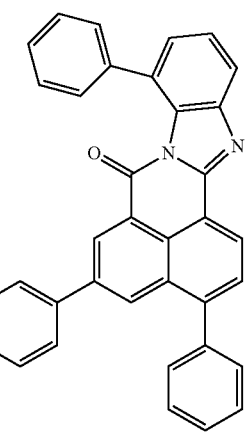
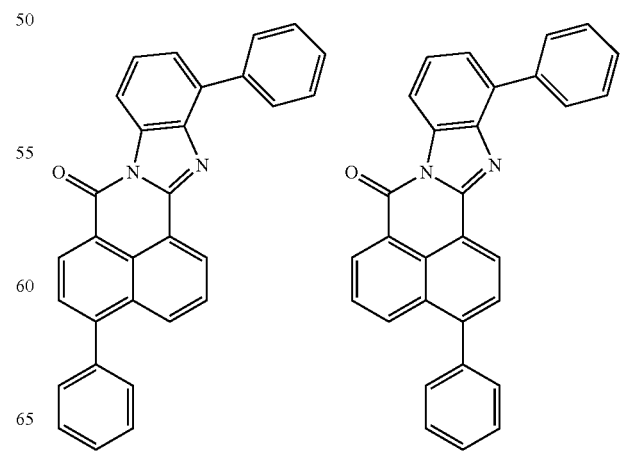

85
-continued
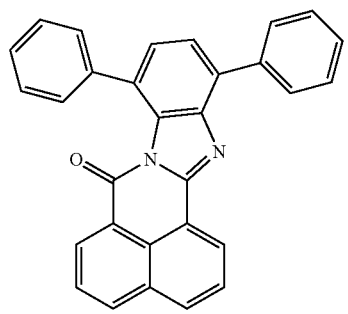
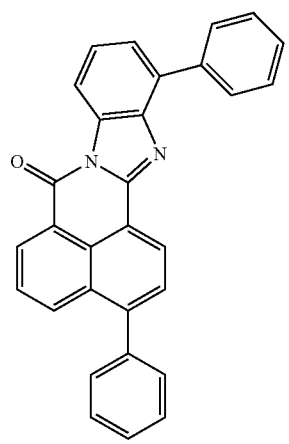
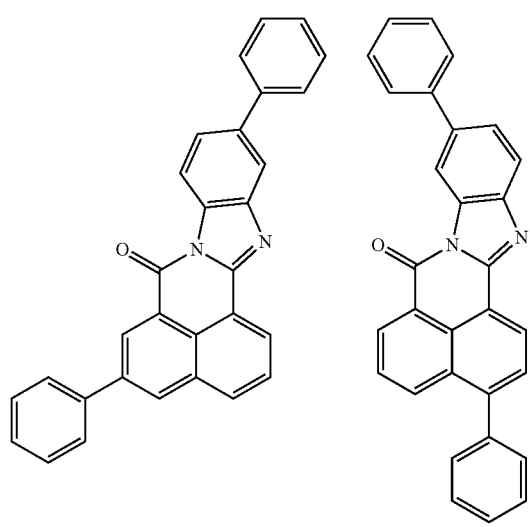
86
-continued
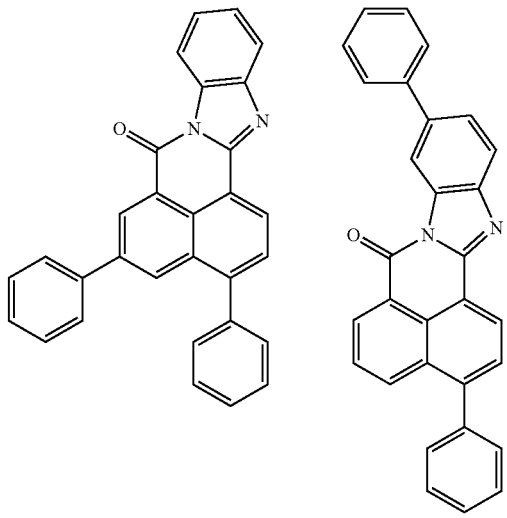
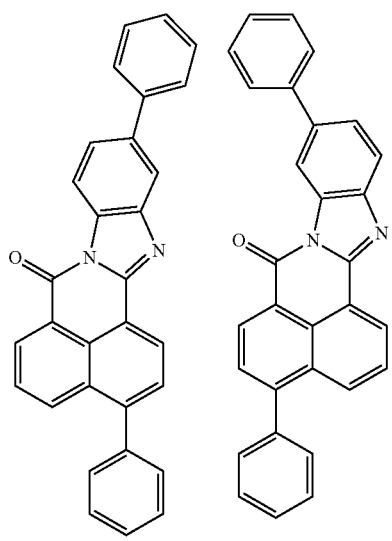

87
-continued
88
-continued
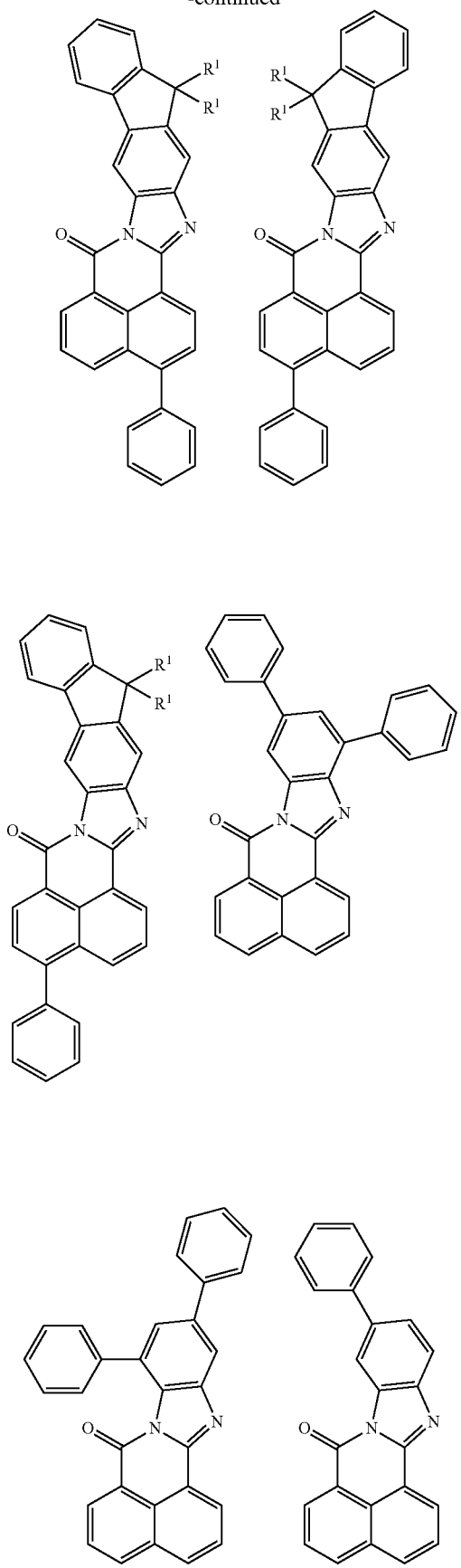
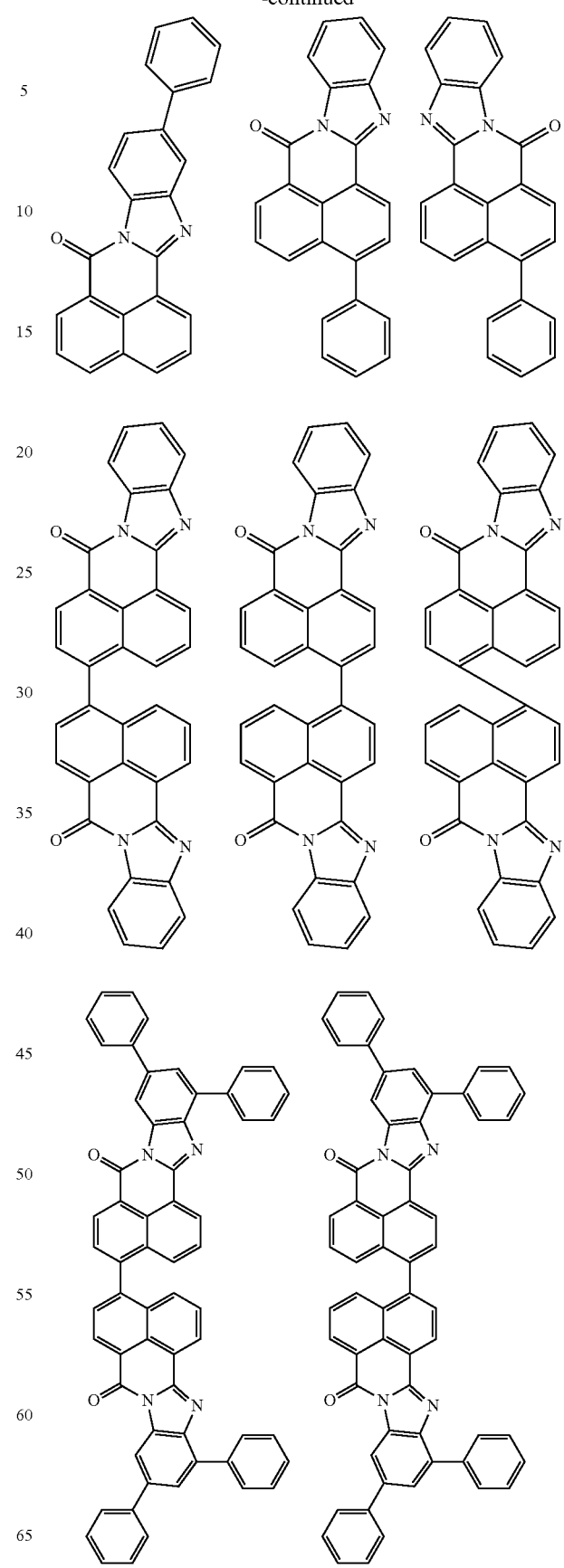

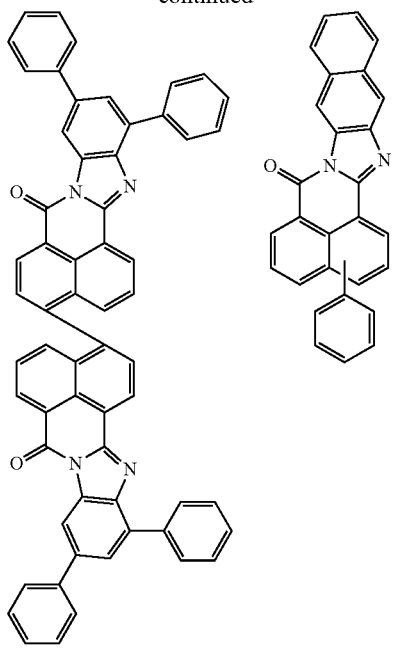

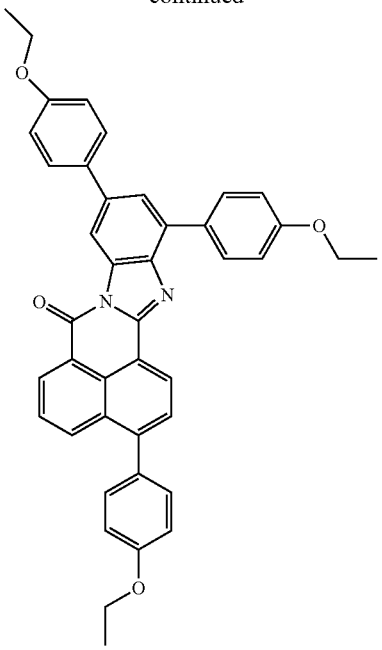

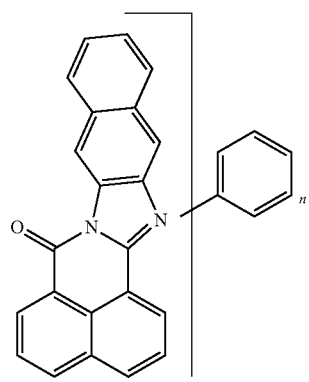

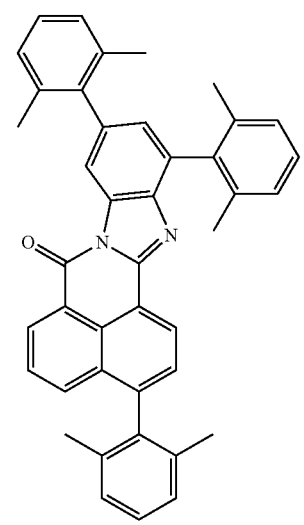

or mixtures thereof,
where n is a number from 0 to 10, e.g. 0, 1, 2, 3, 4, 5, 6, 7, 8, 9 or 10 f;

$R^1$ is independently hydrogen, $C_1$-$C_{18}$-alkyl or cycloalkyl, the carbon chain of which may comprise one or more —O—, —S—, —CO—, —SO— and/or —$SO_2$— moieties and which may be mono- or polysubstituted;

aryl or hetaryl which may be mono- or polysubstituted.

Inventive organic fluorescent dyes exhibit a high quantum yield on irradiation with light, especially with blue LED light. In addition, they have a long lifetime, especially a high photostability on illumination with blue light. They emit pleasant light with good color reproduction.

Suitable organic fluorescent dyes and especially inventive organic fluorescent dyes can be produced by different processes.

One process comprises the condensation of a naphthylenic anhydride with a 1,2-diamino-substituted aromatic or heteroaromatic, the bromination of the condensation product and the subsequent substitution of the bromine atoms by the desired substituents, e.g. phenyl.

In another process, naphthylenic anhydrides are used with a 1,2-diamino-substituted aromatic or heteroaromatic which already bears the desired substituents of the end product.

The products can be purified, for example, by column chromatography or by crystallization.

EXAMPLES

Various fluorescent dyes were synthesized. The fluorescent dyes produced according to the examples were used to produce color converters. For this purpose, they were incorporated into a matrix of a polymer, as described hereinafter. The polymer used was PMMA, a transparent homopolymer of methyl methacrylate with a Vicat softening temperature of 96° C. to DIN EN ISO 306 (Plexiglas® 6N from Evonik). Production of the Color Converters for Testing of the Dyes:

Approx. 2.5 g of polymer and 0.02% by weight of dye were dissolved in approx. 5 ml of methylene chloride, and 0.5% by weight of $TiO_2$ were dispersed therein, based in each case on the amount of polymer used. The resulting solution/dispersion was coated onto a glass surface with a box-type coating bar (wet film thickness 400 μm). After the solvent had dried off, the film was detached from the glass and dried at 50° C. in a vacuum drying cabinet overnight. Two circular film pieces with a diameter of 15 mm were punched out of this film of thickness 80-85 μm, and then served as test samples.

To determine the fluorescence quantum yield (FQY), they were analysed in the model C9920-02 quantum yield measurement system (from Hamamatsu). This involved illuminating each of the samples with light of 450-455 nm in an integrating sphere (Ulbricht sphere). By comparison with the reference measurement in the Ulbricht sphere without a sample, the unabsorbed proportion of the excitation light and the fluorescence light emitted by the sample are determined by means of a CCD spectrometer. Integration of the intensities over the spectrum of the unabsorbed excitation light and over that of the fluorescence light emitted gives, in each case, the degree of absorption or the fluorescence intensity or the fluorescence quantum yield of the sample.

Example 1: Preparation of

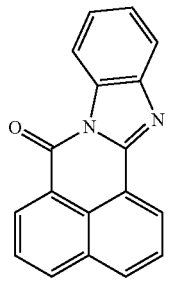 [SMILES: O=c1c2cccc3cccc(c32)c2nc3ccccc3n12]

Under argon, 15.0 g (75.7 mmol) of 1,8-naphthalic anhydride, 9.82 g (90.8 mmol) of 1,2-phenylenediamine and 13.9 g (75.7 mmol) of zinc acetate were introduced into 150 ml of quinoline at room temperature. The mixture was stirred at 160° C. for 5 hours. The hot suspension was stirred into 1000 ml of 1 molar hydrochloric acid. The precipitated solid was filtered off with suction after 30 minutes. The residue was washed with 1000 ml of hot demineralized water, then twice with 100 ml each time of methanol, and suction-dried. The yellow residue was dried at 70° C. under reduced pressure overnight. Yield: 92% Fluorescence quantum yield (FQY) in PMMA=77%.

Example 2: Preparation of a Mixture of

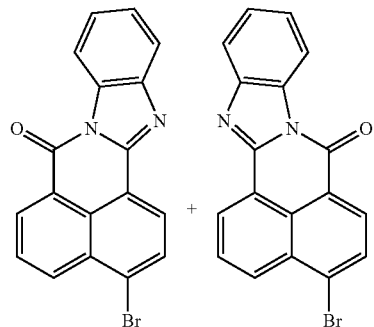

Under argon, 15.0 g (54 mmol) of 4-bromo-1,8-naphthalic anhydride and 7.03 g (65 mmol) of 1,2-phenylenediamine and 9.93 g (54 mmol) of zinc acetate were introduced into 150 ml of quinoline at room temperature. The mixture was stirred at 145° C. under argon for 4 hours. The yellow suspension was stirred into 1000 ml of 1 molar hydrochloric acid. The precipitated solid was filtered off with suction after 1 hour. The residue was twice more suspended in 500 ml each time of 1 molar hydrochloric acid and filtered off with suction, and the residue was washed with 2.5 l of hot demineralized water, then washed twice with 50 ml each time of methanol. The residue was recrystallized in 500 ml of toluene, and washed with toluene, and the pale yellow product was dried at 60° C. under reduced pressure overnight. Yield: 56%.

Example 3: Preparation of a Mixture of

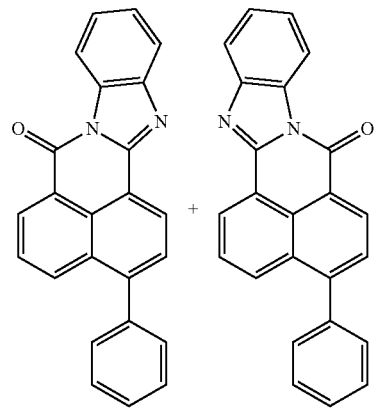

1.0 g (2.86 mmol) of the product from Example 2 and 0.72 g (5.73 mmol) of phenylboronic acid were introduced into 60 ml of toluene at room temperature under nitrogen. A solution of 1.19 g (8.59 mmol) of potassium carbonate in 5 ml of demineralized water was added thereto. Under argon, 33 mg (0.0286 mmol) of tetrakis(triphenylphosphine)palladium(0) were added thereto, and the mixture was stirred at 90° C. under an argon atmosphere for 4 hours. The yellow-green solution was stirred at room temperature overnight and the yellow residue was filtered off with suction. The residue was purified by means of column chromatography (silica gel 60, 20/1 dichloromethane/isopropanol).
Yield: 42.4%, $R_f$ (85/15 toluene/methanol): 0.79
FQY (PMMA)=89%

Example 4: Preparation of a Mixture of

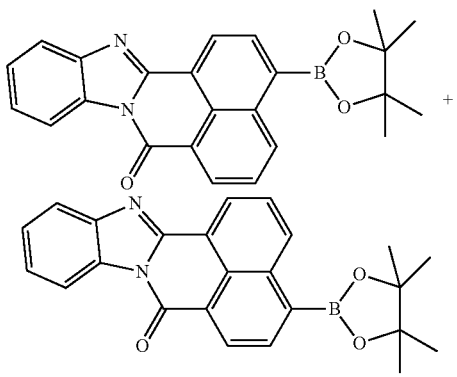

A mixture of 5.0 g (14.3 mmol) of the product from Example 1, 10.9 g (43 mmol) of bis(pinacolato)diboron, 1.05 g (1.43 mmol) of 1,1'-bis(diphenylphosphino)ferrocenedichloro-palladium, 4.22 g of potassium acetate (43 mmol) and 180 ml of toluene was stirred at 70° C. under nitrogen for 20 hours. The solvent was removed by distillation under reduced pressure. After the mixture had been cooled to room temperature, the product was purified by column chromatography using silica gel with dichloromethane as the eluent. Subsequently, the product was recrystallized from 1:1 toluene/petroleum ether. This gave 4.8 g (85%) of yellow product. $R_f$(dichloromethane)=0.35.

Example 4a: Preparation of 3-bromo-7,14-diphenylbenzofluoranthene

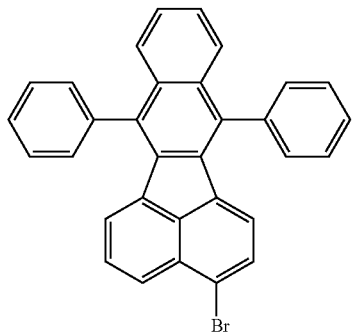 [SMILES: Brc1ccc2c3c(cccc13)-c1c-2c(-c2ccccc2)c2ccccc2c1-c1ccccc1]

A mixture of 50 ml of N-methylpyrrolidone (NMP), 500 ml of dichloromethane, 10.0 g (25 mmol) of 7,14-diphenyl-benzofluoranthene (prepared as described in WO 2010/031833) and 6.45 g (36 mmol) of N-bromosuccinimide was stirred at room temperature for 20 hours. Subsequently, the dichloromethane was removed by distillation and the product was precipitated by adding water. The product was filtered and dried. This gave 12.1 g of the product as a beige solid. Yield: quantitative.

$R_f$ (2:1 petroleum ether:toluene)=0.9

Example 4b: Preparation of

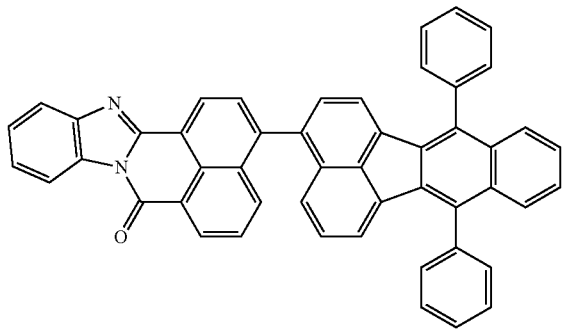 [SMILES: O=c1c2cccc3c(-c4ccc5c6c(cccc46)-c4c-5c(-c5ccccc5)c5ccccc5c4-c4ccccc4)ccc(c32)c2nc3ccccc3n12]

A mixture of 160 ml of toluene, 1.76 g (3.64 mmol) of the product from Example 4a, 1.60 g (4.00 mmol) of the boron compound from 4, 13.1 g of potassium carbonate, 80 ml of water, 32 ml of ethanol and 2.1 g (1.82 mmol) of tetrakis (triphenylphosphine)palladium was heated to 65° C. for 16 hours. The organic phase was removed, dried over magnesium sulphate and purified by column chromatography using silica gel with toluene as the eluent. This gave 2.0 g (82%) of yellow product.

$R_f$(dichloromethane)=0.30

FQY (PMMA)=80%

Example 5: Preparation of

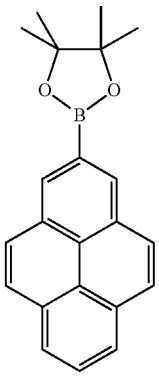 [SMILES: CC1(C)OB(c2cc3ccc4cccc5ccc(c2)c3c45)OC1(C)C]

A flask was baked out and cooled under nitrogen.

4.13 g (20 mmol) of pyrene and 5.08 g (20 mmol) of bis(pinacolato)diborane were introduced with 0.663 g (1 mmol) of methoxy(cyclooctadiene)iridium(I) dimer and 0.548 g (2 mmol) of 4,4'-di-tert-butyl-2,2'-dipyridyl into 125 ml of cyclohexane (anhydrous). Under a nitrogen atmosphere, the mixture was stirred at 80° C. for 7 hours. The mixture was stirred at room temperature overnight. The brown suspension was filtered off with suction. The filtrate was concentrated on a rotary evaporator at 40° C. The product was purified by means of column chromatography (silica gel, 2/1 toluene/cyclohexane). This gave a colorless solid 1 (4,4,5,5-tetramethyl-2-(2-pyrenyl)-1,3,2-dioxaborolane).

Yield: 14%;

$R_f$ (toluene) main component: 0.51

Example 6: Preparation of

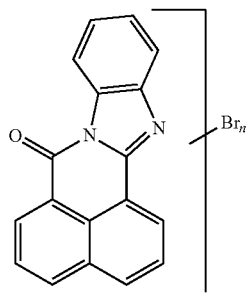

n = 1-4

Under nitrogen, 10.0 g (37 mmol) of the compound from Example 1 were introduced into 150 ml of chlorobenzene and 100 ml of demineralized water. 56 ml of bromine (1110 mmol) were fed in at room temperature. The mixture was heated to reflux (80-85° C.) and stirred at reflux for a further 4.5 hours. The mixture was stirred at room temperature overnight. At 80-85° C., the excess bromine was outgassed with nitrogen within 1 hour. The suspension was stirred into 1000 ml of 1 molar hydrochloric acid at room temperature. The residue was filtered off with suction. The residue was washed with hot water. This gave a yellow solid. The paste was dried at 70° C. under reduced pressure overnight. This gave a mixture of mono-, di-, tri- and tetrabrominated compounds.

Yield: 88%

$R_f$ (10/1 toluene/ethyl acetate)=0.69; 0.55 and others.

Example 7

0.398 g (0.785 mmol) of the product from Example 6 were introduced under nitrogen with 0.850 g (2.59 mmol) of 4,4,5,5-tetramethyl-2-(2-pyrenyl)-1,3,2-dioxaborolane at room temperature into 40 ml of toluene. A solution of 2.82 g (20.4 mmol) of potassium carbonate in 18 ml of demineralized water and 7 ml of ethanol was added thereto. 453 mg (0.392 mmol) of tetrakis(triphenylphosphine)palladium (0) were added to the yellow suspension. The mixture was heated to 65° C. under nitrogen and stirred at this temperature for a further 22 hours. The brown suspension was admixed with 100 ml of toluene at room temperature, and extracted by shaking with dichloromethane and demineralized water. The organic phases were concentrated by rotary evaporation. The brown residue was purified by means of column chromatography (silica gel 60, dichloromethane). The orange solid was purified with a further column chromatography step (silica gel 60, 1/1 toluene/cyclohexane). This gave an orange solid which, according to mass spectroscopy analysis, corresponded to a mixture of essentially di- to tetra-pyrenyl-substituted compounds.

$R_f$ (1/1 toluene/cyclohexane)—main component: 0.71; secondary component: 0.62

FQY (PMMA)=77%

Example 8

1.0 g (2.0 mmol) of the mixture of brominated compounds from Example 6 and 1.28 g (7.2 mmol) of 2-naphthylboronic acid were introduced into 60 ml of toluene at room temperature under nitrogen. A solution of 2.5 g (18 mmol) of potassium carbonate in 10 ml of demineralized water was added thereto. Under argon, 69.4 mg (0.06 mmol) of tetrakis (triphenylphosphine)-palladium(0) were added thereto. The mixture was heated to 65° C. under nitrogen and stirred at this temperature for a further 27 hours. At room temperature, the orange suspension was dissolved with 300 ml of dichloromethane and extracted by shaking with demineralized water. The organic phases were concentrated by rotary evaporation. The brown-red residue was purified by means of column chromatography (silica gel 60, 5/1 toluene/cyclohexane). The result was an orange solid which, according to mass spectroscopy analyses, was a mixture of di-, tri- and tetrasubstituted compounds.

$R_f$ (toluene): 0.52

FQY (PMMA)=75%

Example 9

1.0 g (2.0 mmol) of the mixture of brominated compounds from Example 6 and 1.28 g (7.2 mmol) of 1-naphthylboronic acid were introduced into 60 ml of toluene at room temperature under nitrogen. A solution of 2.5 g (18 mmol) of potassium carbonate in 10 ml of demineralized water was added thereto. Under argon, 69.4 mg (0.06 mmol) of tetrakis (triphenylphosphine)-palladium(0) were added thereto. The mixture was heated to 65° C. under nitrogen and stirred at this temperature for a further 28 hours. At room temperature, the brown solution was admixed with 150 ml of dichloromethane and extracted by shaking with demineralized water. The organic phases were concentrated by rotary evaporation. The brown residue was purified by means of column chromatography (silica gel 60, 6/1 toluene/cyclohexane). The result was an orange solid which, according to mass spectroscopy analyses, was a mixture of di-, tri- and tetrasubstituted compounds.

Yield: 43.1%; $R_f$ (toluene)—main component: 0.44; secondary component: 0.52

FQY (PMMA)=75%

Example 10

5.07 g (10 mmol) of the mixture of brominated compounds from Example 6 and 7.47 g (60 mmol) of phenylboronic acid were introduced into 300 ml of toluene under nitrogen at room temperature. To this was added a solution of 12.44 g (90 mmol) of potassium carbonate in 50 ml of demineralized water. Under argon, 346 mg (0.3 mmol) of tetrakis(triphenylphosphine)-palladium(0) were added thereto. The mixture was stirred at 90° C. for a further 4 hours. The mixture was stirred at room temperature overnight. The suspension was filtered off with suction and the orange residue was stirred in toluene. The residue was filtered off with suction and suction-dried with n-pentane. The product was purified by column chromatography (silica gel 60, toluene).

Yield: 31%; $R_f$ (toluene)—main component: 0.43.

FQY (PMMA) 83%.

It is possible to isolate further di- and trisubstituted isomers of higher polarity as a mixture of equal FQY in PMMA.

Example 11: Preparation of a Mixture of

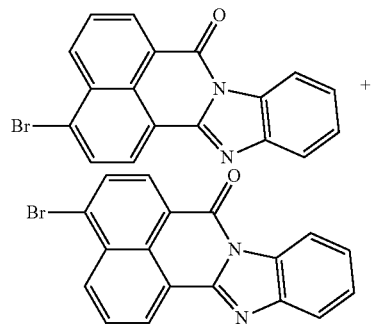

A mixture of 10.0 g (36 mmol) of 4-bromo-1,8-naphthalic anhydride, 4.68 g (43.3 mmol) of 1,2-phenyelenediamine, 6.62 g of zinc(II) acetate (36 mmol) and 100 ml of quinoline was kept at reflux at 145° C. for 5 hours. The reaction mixture was added to 500 ml of 1M hydrochloric acid. The resulting precipitate was filtered off with suction, washed with hot water and recrystallized from toluene. 10.6 g (84%) of the yellow product were obtained.

$R_f$ (2:1 cyclohexane:ethyl acetate)=0.29

Example 12: Preparation of a Mixture of

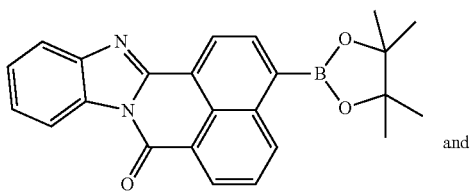

and

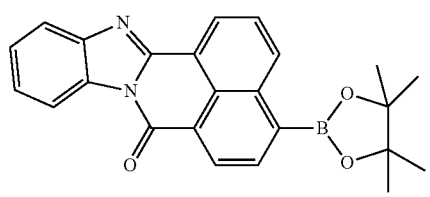

A mixture of 5.0 g (14.3 mmol) of the product from Example 9, 10.9 g (43 mmol) of bis(pinacolato)diboron, 1.05 g (1.43 mmol) of 1,1'-bis(diphenylphosphino)ferrocenedichloro-palladium, 4.22 g of potassium acetate (43 mmol) and 180 ml of toluene was stirred at 70° C. under nitrogen for 20 hours. The solvent was removed by distillation under reduced pressure. The product was allowed to cool to room temperature and purified by column chromatography using silica gel with dichloromethane, and then recrystallized from toluene/petroleum ether. This gave 4.8 g (85%) of the yellow product.

$R_f$ (dichloromethane)=0.35

Example 13: Preparation of a Mixture of

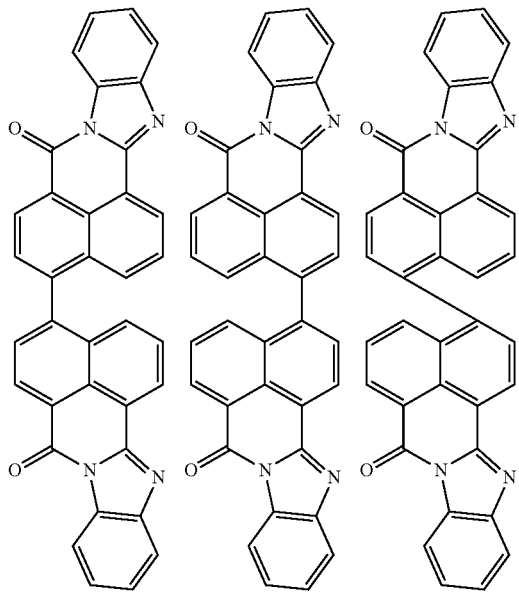

A mixture of 1.58 g (4 mmol) of the borated compound from Example 10 and 1.27 g (36.4 mmol) of the brominated compound from Example 9 was heated to 40° C. in 160 ml of toluene, and a solution of 80 ml of water, 13.1 g of potassium carbonate and 32 ml of ethanol, 2.1 g (1.8 mmol) of tetrakis(triphenylphosphine)palladium(0) were added, and the mixture was heated to 65° C. for 12 hours. After cooling to room temperature, 200 ml of toluene were added and the mixture was extracted by shaking with water and methylene chloride, and the organic phases were concentrated without and with rotary evaporation, and purified by chromatography on silica gel with toluene/ethyl acetate mixtures. This gave 1.22 g (62%) of a yellow compound.

$R_f$ (10:1 toluene/ethyl acetate)=0.1

FQY (PMMA)=82%

Example 13b: Preparation of a Mixture of

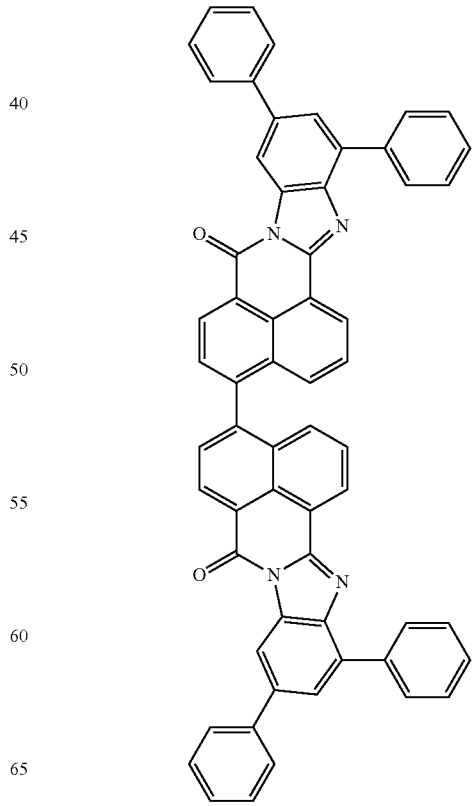

-continued

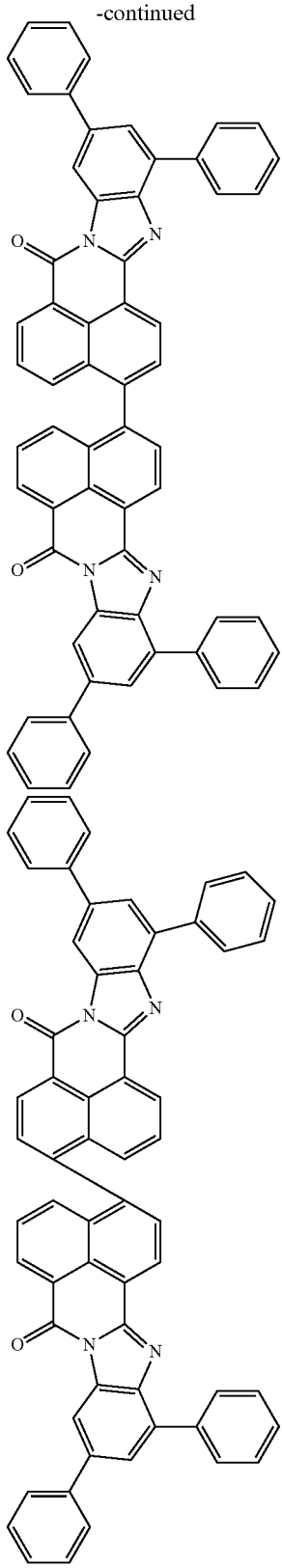

A mixture of 0.54 g (1 mmol) of the compound prepared in Example 11, 10 ml of chlorobenzene, 6 ml of water and 3.2 g of bromine was heated to 70° C. for 3 hours. Excess bromine was blown out with nitrogen, and the product was filtered and washed with water. This gave 0.76 g (89%) of a yellow product which, according to the mass spectroscopy analyses, was a mixture of mono- and polybrominated compounds.

A mixture of 0.3 g (0.35 mmol) of the above-described mixture of brominated compounds, 0.34 g (2.8 mmol) of phenylboronic acid, 0.8 g (5.6 mmol) of potassium carbonate dissolved in water, 0.04 g (0.035 mmol) of tetrakis(triphenylphosphine)palladium(0) was heated to 90° C. for 12 hours. The reaction mixture was cooled to room temperature and extracted by shaking with water and methylene chloride, and the organic phases were concentrated without and with rotary evaporation, and purified by chromatography on silica gel with toluene/ethyl acetate mixtures. This gave 0.1 g of a yellow compound, $R_f$ (10:1 toluene/ethyl acetate)=0.5 (FQY (PMMA)=77%), and 0.085 g of a yellow product, $R_f$=0.31 (FQY (PMMA)=79%)

Example 14: Preparation of 2,4-di(2-naphthyl)-5-nitroaniline

To a suspension of 2,4-dibromo-6-nitroaniline (50 g, 0.168 mol) in toluene (1000 ml) and 200 ml of ethanol are added 52.6 g (0.371 mol) of 2-naphthylboronic acid and 139 g (1 mol) of potassium carbonate and 1.1 g of tetrakis(triphenylphosphine)palladium, and the mixture is heated to reflux for 4 hours. The reaction is stopped by adding water, and filtered, and the residue is washed with ethyl acetate. The crude product is purified by column chromatography with ethyl acetate/heptane. This gives 37.8 g (60%).

Example 15: Preparation of 1,2-diamino-3,5-di(2-naphthyl)benzene

To a suspension of 1.2 g (3.1 mmol) of the product from Example 14 (2,4-di(2-naphthyl)-5-nitroaniline) in 10 ml of methanol are slowly added 0.9 g of Pd/C and 0.23 g (6.2 mmol) of NaBH$_4$. After the addition has ended, the reaction has already ended according to TLC monitoring. The reaction mixture is filtered through shell lime and washed with methanol. The methanol is removed under reduced pressure, the residue is taken up in ethyl acetate, washed with water and dried, and the solvent is removed under reduced pressure. This gives 0.77 g (60%) of a solid product.

Example 16: Preparation of a Mixture of

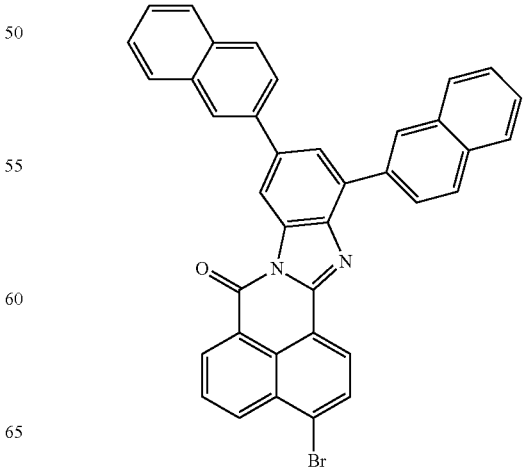

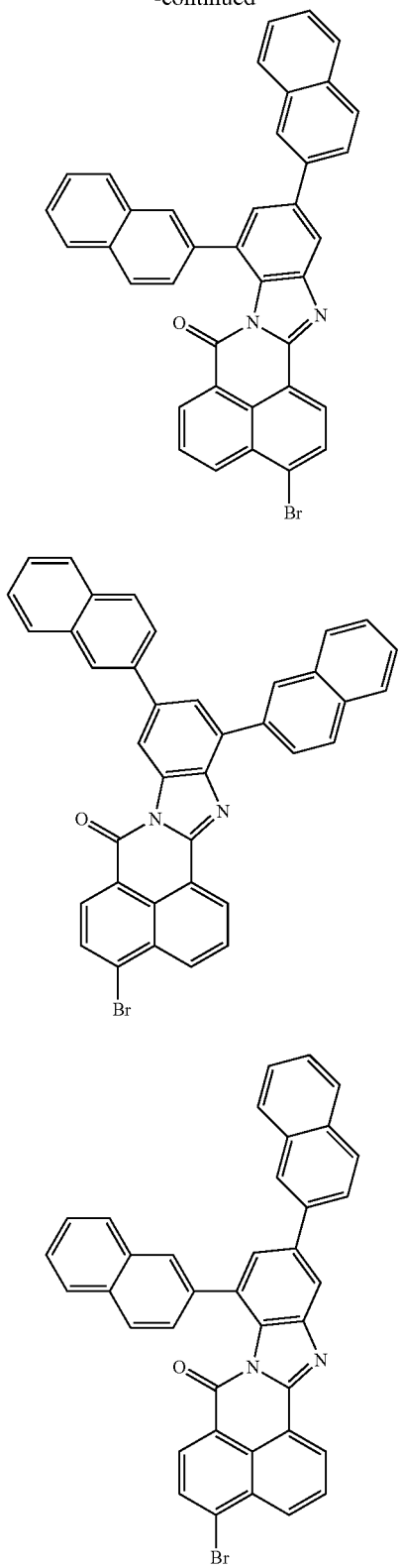

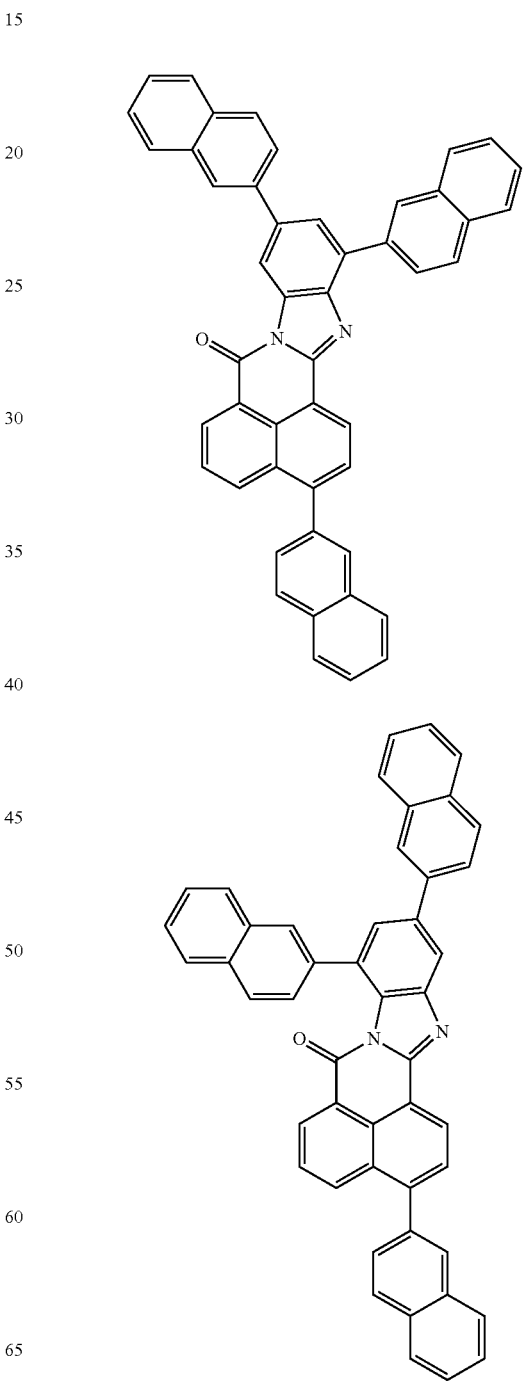

The yellow solution is stirred at room temperature overnight. The red-brown suspension is stirred into 250 ml of 1 molar hydrochloric acid. The precipitated solid is filtered off with suction after 1 hour, and the residue is twice more suspended in 100 ml each time of 1 molar hydrochloric acid and filtered off with suction, washed with 500 ml of hot demineralized water, then washed twice with 10 ml each time of methanol. The orange residue is suction-dried with n-pentane.

Yield: 6.0 g (quant.)

Example 17: Preparation of a Mixture of

Under argon, 2.91 g (10 mmol) of 4-bromo-1,8-naphthalic anhydride and 4.32 g (12 mmol) of 1,2-diamino-3,5-di(2-naphthyl)benzene are introduced with 1.84 g (10 mmol) of zinc acetate at room temperature into 30 ml of quinoline. The mixture is stirred at 145° C. under argon for 4 hours.

-continued

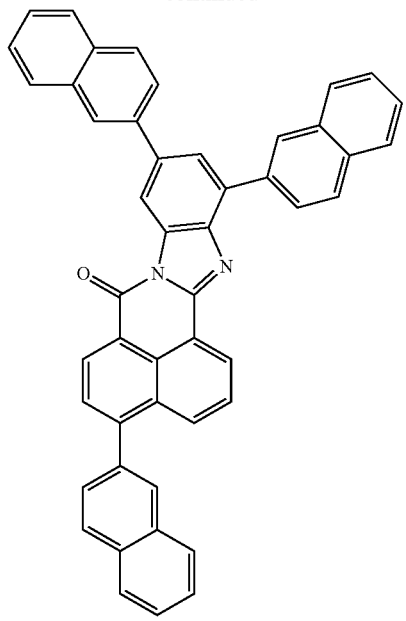

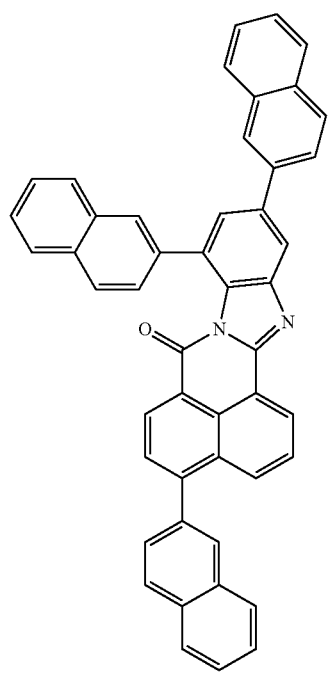

1.2 g (2 mmol) of the product from Example 16 and 0.5 g (4 mmol) of 2-naphthylboronic acid are introduced into 60 ml of toluene at room temperature under nitrogen, a solution of 0.83 g (6 mmol) of potassium carbonate in 5 ml of demineralized water is added thereto, and 23 mg (0.02 mmol) of tetrakis(triphenylphosphine)palladium(0) are added under argon, and the mixture is stirred at 90° C. for a further 5 hours. The yellow-green solution is stirred at room temperature overnight. The orange suspension is admixed with 700 ml of dichloromethane and extracted by shaking with demineralized water. The organic phases are concentrated by rotary evaporation, and the brown residue is purified by means of column chromatography (silica gel 60, 10:1 toluene/cyclohexane. Yield: 0.58 g (45%).

Example 18: Preparation of 2,4-diphenyl-5-nitroaniline

To a suspension of 2,4-dibromo-6-nitroaniline (50 g, 0.168 mol) in toluene (1000 ml) and 200 ml of ethanol were added 4.5 g (0.371 mol) of phenylboronic acid and 139 g (1 mol) of potassium carbonate and 1.1 g of tetrakis(triphenylphosphine)palladium, and the mixture was heated to reflux for 4 hours. The reaction was stopped by adding water, and filtered, and the residue was washed with ethyl acetate. The crude product was purified by column chromatography with ethyl acetate/heptane. This gave 25.3 g (49%).

Example 19: Preparation of 1,2-diamino-3,5-diphenylbenzene

To a suspension of 0.9 g (3.1 mmol) of the compound prepared above in 10 ml of methanol were slowly added 0.9 g of Pd/C and 0.23 g (6.2 mmol) of NaBH$_4$. After the addition had ended, the reaction had already ended according to TLC monitoring. The reaction mixture was filtered through shell lime, and washed with methanol. The methanol was removed under reduced pressure, the residue was taken up in ethyl acetate, washed with water and dried, and the solvent was removed under reduced pressure. This gave 0.4 g (50%) of a solid product.

Example 20: Preparation of a Mixture of

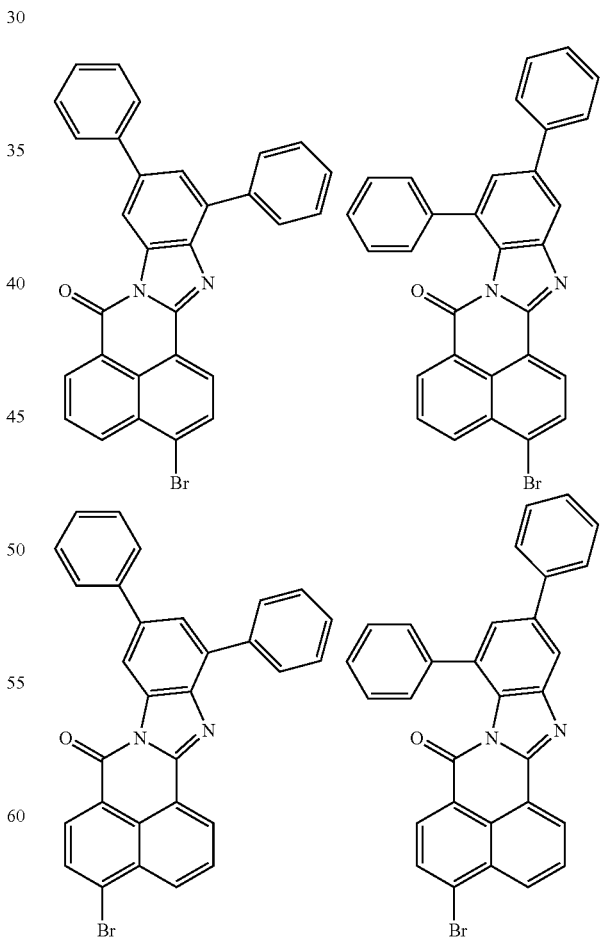

Under argon, 2.91 g (10 mmol) of 4-bromo-1,8-naphthalic anhydride and 3.18 g (12 mmol) of 1,2-diamino-3,5- diphenylbenzene (product from Example 19) were introduced with 1.84 g (10 mmol) of zinc acetate at room temperature into 30 ml of quinoline. The mixture was stirred under argon at 145° C. for 4 hours. The yellow solution was stirred at room temperature overnight. The red-brown suspension was stirred into 250 ml of 1 molar hydrochloric acid. The precipitated solid was filtered off with suction after 1 hour, the residue was twice more suspended in 100 ml each time of 1 molar hydrochloric acid and filtered off with suction, washed with 500 ml of hot demineralized water, then washed twice with 10 ml each time of methanol, and the orange residue was suction-dried with n-pentane.

Yield: >99%, $R_f$ (dichloromethane): 0.77

Example 21: Preparation of a Mixture of

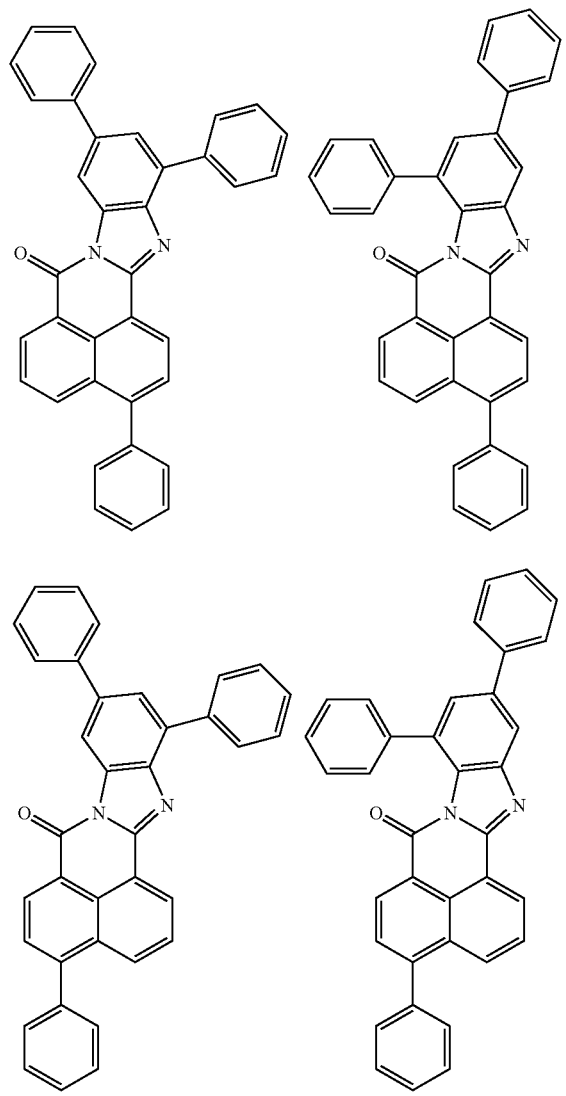

1.0 g (2 mmol) of the abovementioned compound and 0.5 g (4 mmol) of phenylboronic acid were introduced into 60 ml of toluene under nitrogen at room temperature, a solution of 0.83 g (6 mmol) of potassium carbonate in 5 ml of demineralized water was added thereto, and 23 mg (0.02 mmol) of tetrakis(triphenylphosphine)palladium(0) was added under argon, and the mixture was stirred at 90° C. for 5 hours. The yellow-green solution was stirred at room temperature overnight. The orange suspension was admixed with 700 ml of dichloromethane and extracted by shaking with demineralized water. The organic phases were concentrated by rotary evaporation. The brown residue was purified by means of column chromatography (silica gel 60, 10/1 toluene/cyclohexane).

Yield: 38.8%; $R_f$ (10/1 toluene/cyclohexane): 0.28

FQY (PMMA)=82%

Example 22: Preparation of 2-nitro-4-phenylaniline

A suspension of 2-nitro-4-bromaniline (5 g, 23 mmol) in toluene was admixed with 2.8 g (23 mmol) of phenylboronic acid, 9.5 g (0.069 mol) of potassium carbonate and 1.3 g of tetrakis(triphenylphosphine)palladium. The mixture was heated to reflux for 4 hours and the reaction was stopped by adding 100 ml of water. The mixture was extracted with ethyl acetate and dried over sodium sulphate, and the solvent was removed under reduced pressure. Purification by column chromatography gave 3.6 g (73% yield).

Example 23: Preparation of 4-phenyl-1,2-diaminobenzene

To a suspension of 2 g (9.3 mmol) of the product obtained in Example 22 in 20 ml of methanol were slowly added 0.2 g of palladium on carbon and 0.7 g of $NaBH_4$. After the addition of $NaBH_4$ had ended, the reaction was already complete. The reaction mixture was filtered through shell lime and washed with ethyl acetate, and the solvent was removed under reduced pressure. This gave 1.3 g (77%).

Example 24: Preparation of a Mixture of

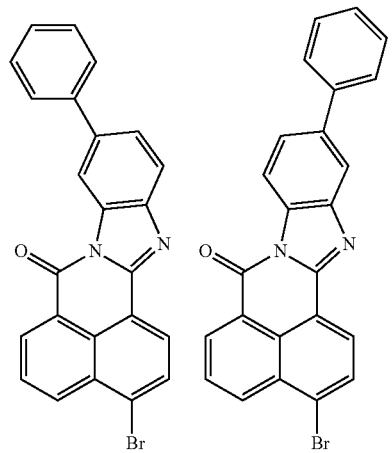

-continued

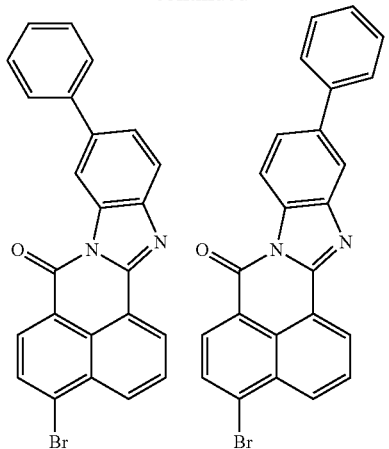

Under argon, 2.91 g (10 mmol) of 4-bromo-1,8-naphthalic anhydride and 2.26 g (12 mmol) of 1,2-diamino-4-phenylbenzene (product from Example 23) and 1.84 g (10 mmol) of zinc acetate were introduced into 30 ml of quinoline at room temperature. The mixture was stirred under argon at 145° C. for 4 hours. The brown suspension was stirred into 250 ml of 1 molar hydrochloric acid and the precipitated solid was filtered off with suction. The residue was twice more suspended in 100 ml each time of 1 molar hydrochloric acid and filtered off with suction, and washed with 500 ml of hot demineralized water and 20 ml of methanol.

Yield: 53%; $R_f$ (85/15 toluene/methanol): 0.90

Example 25: Preparation of a Mixture of

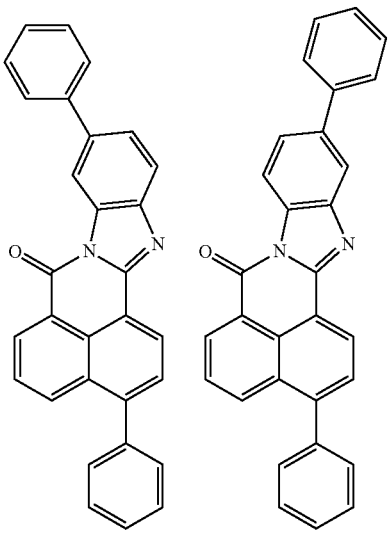

-continued

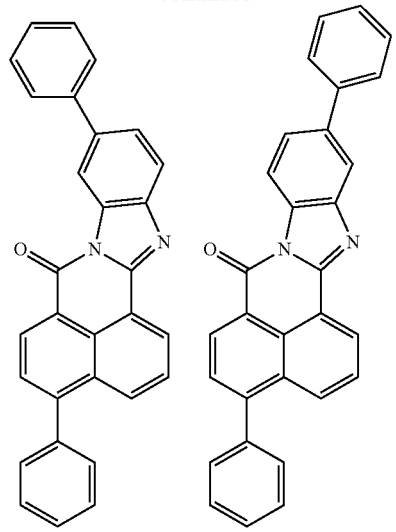

2.0 g (4.5 mmol) of the product obtained in Example 24 and 1.12 g (9 mmol) of phenylboronic acid were introduced into 135 ml of toluene at room temperature under nitrogen, and a solution of 1.87 g (13.5 mmol) of potassium carbonate in 8 ml of demineralized water was added thereto. Under argon, 52 mg (0.045 mmol) of tetrakis(triphenylphosphine)palladium(0) were added thereto and the mixture was stirred under an argon atmosphere at 90° C. for 4.5 hours. The solution was admixed with 150 ml of dichloromethane and extracted by shaking with demineralized water. The organic phases were concentrated by rotary evaporation. The residue was purified by means of column chromatography (silica gel 60, dichloromethane).

Yield: 22.5%;

$R_f$ (dichloromethane)—component 1: 0.27; component 2: 0.15

FQY (PMMA)=85%

Example 26: Preparation of a Mixture of

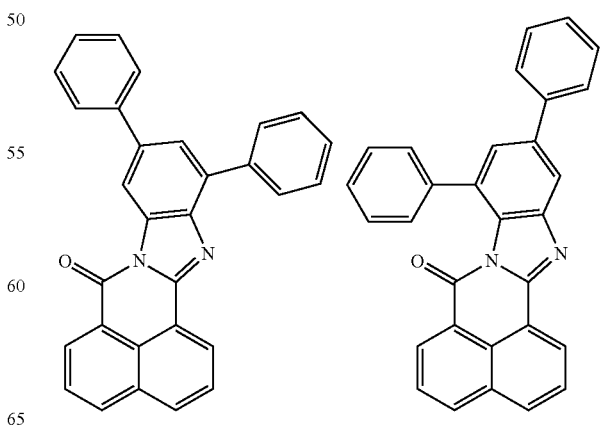

Under argon, 0.61 g (3 mmol) of 1,8-naphthalic anhydride and 0.96 g (3.6 mmol) of 1,2-diamino-3,5-diphenylbenzene and 0.55 g (3 mmol) of zinc acetate were introduced into 9 ml of quinoline at room temperature. The mixture was stirred under argon at 145° C. for 3.5 hours, the brown suspension was stirred into 80 ml of 1 molar hydrochloric acid and the precipitated solid was filtered off with suction. The residue was twice more suspended with 35 ml each time of 1 molar hydrochloric acid and filtered off with suction, and washed with hot demineralized water and methanol. The orange residue was purified by means of column chromatography (silica gel 60; 2/1 toluene/dichloromethane).

Yield: 57.1%, $R_f$ (dichloromethane): 0.68

FQY (PMMA)=79%

Example 27: Preparation of a Mixture of

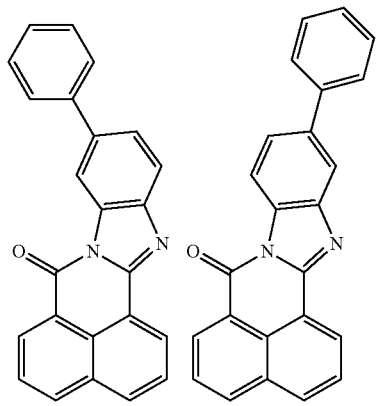

Under argon, 0.61 g (3 mmol) of 1,8-naphthalic anhydride and 0.68 g (3.6 mmol) of 1,2-diamino-4-phenylbenzene and 0.55 g (3 mmol) of zinc acetate were introduced into 9 ml of quinoline at room temperature. The mixture was stirred under argon at 145° C. for 3.5 hours, stirred at room temperature overnight and stirred into 80 ml of 1 molar hydrochloric acid. The precipitated solid was filtered off with suction, twice suspended with 35 ml each time of 1 molar hydrochloric acid and filtered off with suction, and washed with water and methanol. The yellow-green residue was purified by means of column chromatography (silica gel 60; 100/1 toluene/methanol).

Yield: 69.9%; $R_f$ (85/15 toluene/methanol)—component 1: 0.71; component 2: 0.67

FQY (PMMA)=78%

Example 28: Preparation of 2-nitro-4-(2-naphthyl)aniline

A suspension of 2-nitro-4-bromoaniline (5 g, 23 mmol) in toluene is admixed with 3.27 g (23 mmol) of 2-naphthylboronic acid, 9.5 g (0.069 mol) of potassium carbonate and 1.3 g of tetrakis(triphenylphosphine)palladium. The mixture is heated to reflux for 4 hours and the reaction is stopped by adding 100 ml of water. The mixture is extracted with ethyl acetate and dried over sodium sulphate, and the solvent is removed under reduced pressure. Purification by column chromatography gives 4.1 g (68% yield).

Example 29: Preparation of 4-phenyl-1,2-diaminobenzene

To a suspension of 2 g (9.3 mmol) of product obtained in Example 28 in 20 ml of methanol are slowly added 0.2 g of palladium on carbon and 0.7 g of $NaBH_4$. After the addition of $NaBH_4$ has ended, the reaction is already complete. The reaction mixture is filtered through shell lime and washed with ethyl acetate, and the solvents are removed under reduced pressure. This gives 1.52 g (70%).

Example 30: Preparation of a Mixture of

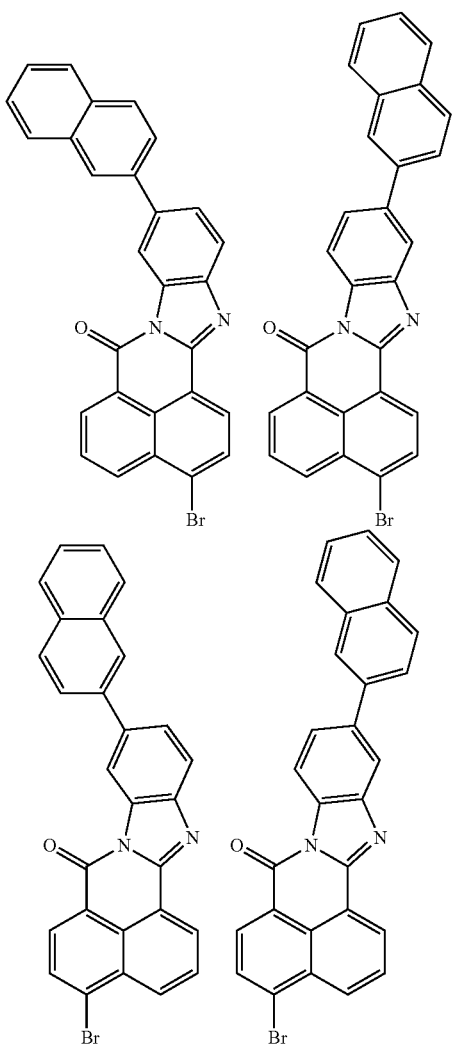

Under argon, 2.91 g (10 mmol) of 4-bromo-1,8-naphthalic anhydride and 2.81 g (12 mmol) of 1,2-diamino-4-(2-naphthyl)benzene and 1.84 g (10 mmol) of zinc acetate are introduced into 30 ml of quinoline at room temperature. The mixture is stirred under argon at 145° C. for 4 hours. The brown suspension is stirred into 250 ml of 1 molar hydrochloric acid and the precipitated solid is filtered off with suction. The residue is twice more suspended in 100 ml each time of molar hydrochloric acid and filtered off with suction, and washed with 500 ml of hot demineralized water and 20 ml of methanol.

Yield: 1.9 g (40%)

Example 31: Preparation of a Mixture of

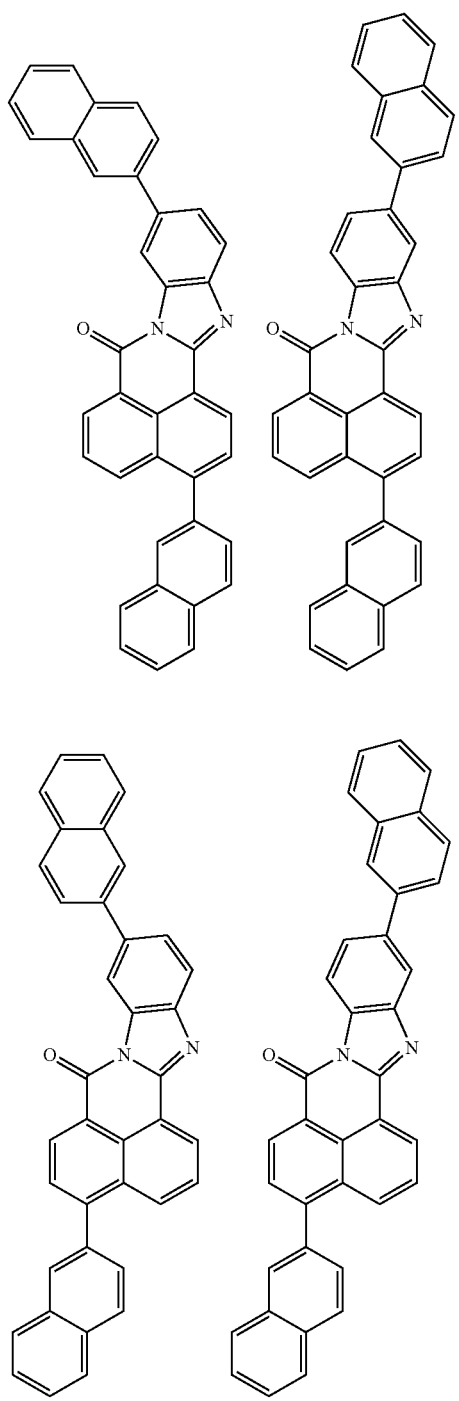

2.1 g (4.5 mmol) of the product obtained in Example 30 and 1.3 g (9 mmol) of 2-naphthylboronic acid are introduced into 135 ml of toluene at room temperature under nitrogen, and a solution of 1.87 g (13.5 mmol) of potassium carbonate in 8 ml of demineralized water is added thereto. Under argon, 52 mg (0.045 mmol) of tetrakis(triphenylphosphine) palladium(0) are added thereto and the mixture is stirred under an argon atmosphere at 90° C. for 4.5 hours. The solution is admixed with 150 ml of dichloromethane and extracted by shaking with demineralized water. The organic phases are concentrated by rotary evaporation. The residue is purified by means of column chromatography (silica gel 60, dichloromethane). Yield: 0.7 g (30%).

Example 32: Preparation of a Mixture of

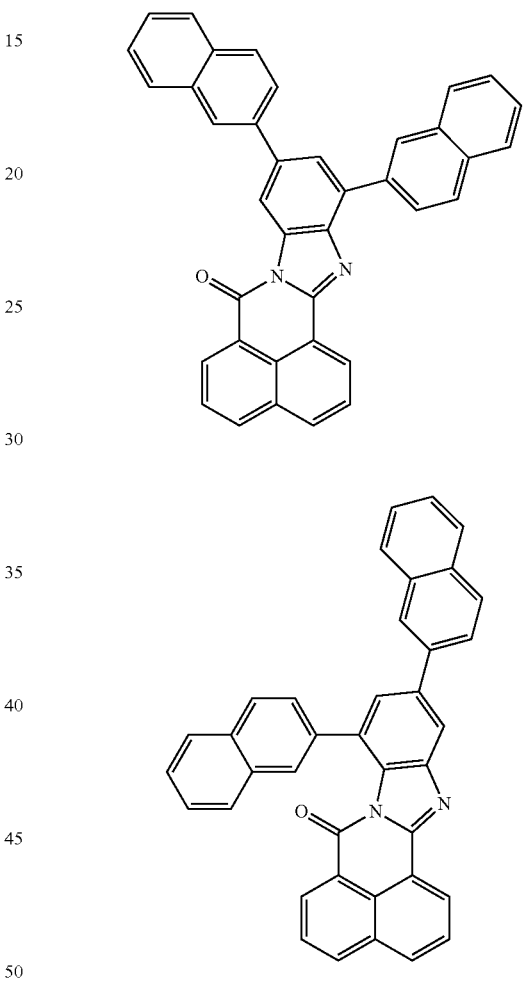

Under argon, 0.61 g (3 mmol) of 1,8-naphthalic anhydride and 1.3 g (3.6 mmol) of 1,2-diamino-3,5-di(2-naphthyl) benzene and 0.55 g (3 mmol) of zinc acetate are introduced into 9 ml of quinoline at room temperature. The mixture is stirred under argon at 145° C. for 3.5 hours, the brown suspension is stirred into 80 ml of 1 molar hydrochloric acid and the precipitated solid is filtered off with suction. The residue is twice more suspended with 35 ml each time of 1 molar hydrochloric acid and filtered off with suction, and washed with hot demineralized water and methanol. The orange residue is purified by means of column chromatography (silica gel 60; 2/1 toluene/dichloromethane).

Yield: 0.47 g (30%).

Example 33: Preparation of a Mixture of

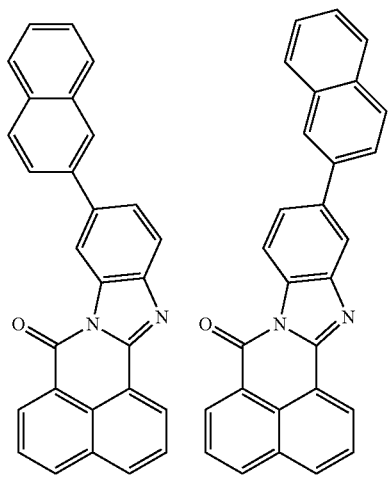

Under argon, 0.61 g (3 mmol) of 1,8-naphthalic anhydride and 0.84 g (3.6 mmol) of 1,2-diamino-4-(2-naphthyl)benzene and 0.55 g (3 mmol) of zinc acetate are introduced into 9 ml of quinoline at room temperature. The mixture is stirred under argon at 145° C. for 3.5 hours, stirred at room temperature overnight and stirred into 80 ml of 1 molar hydrochloric acid. The precipitated solid is filtered off with suction, twice suspended with 35 ml each time of 1 molar hydrochloric acid and filtered off with suction, and washed with water and methanol. The yellow-green residue is purified by means of column chromatography (silica gel 60; 100/1 toluene/methanol).

Yield: 0.71 g (60%).

Example 34: Preparation of

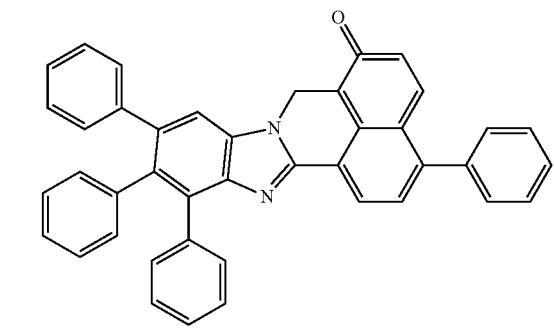

34.1

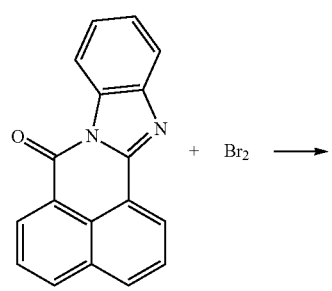

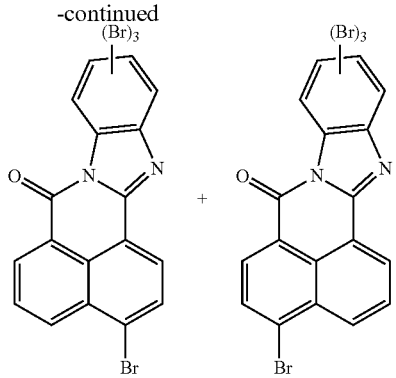

Under nitrogen, a flask was charged with 2.0 g (7.4 mmol) of the compound from Example 1, 50 ml of demineralized water and 17.74 g of bromine (111 mmol). The mixture was stirred over night at room temperature. At 50° C., the next morning, the excess bromine was outgassed with nitrogen. The yellow suspension was filtered off with suction. The residue was washed with hot water and dried at 70° C. under reduced pressure overnight. This gave the title compounds. The title compounds can be separated into individual isomers by chromatography.

Yield: 75%

34.2

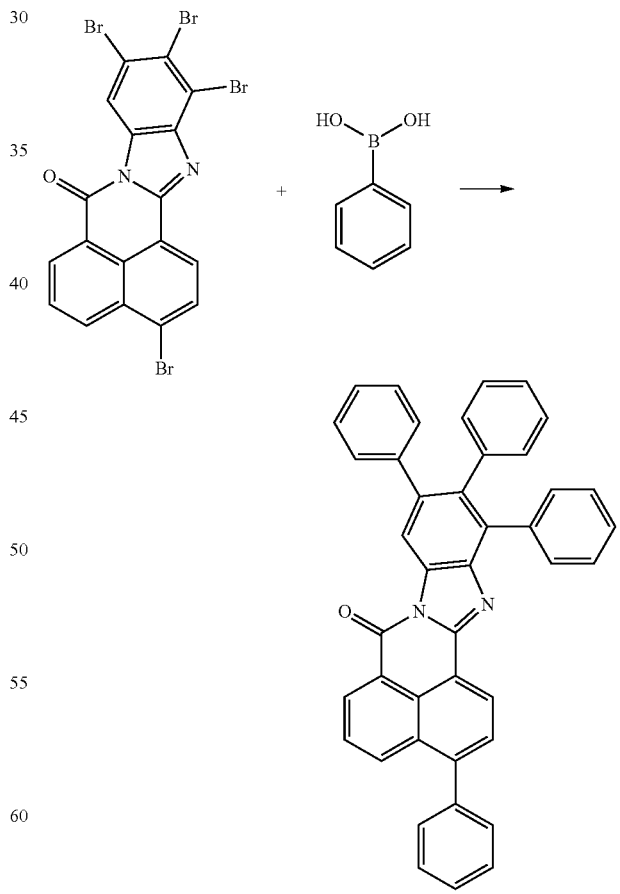

2.03 g (4 mmol) of the tetrabrominated compound from Example 34.1 and 2.99 g (24 mmol) of phenylboronic acid were introduced into 100 ml of toluene at room temperature under nitrogen. A solution of 4.98 g (36 mmol) of potassium carbonate in 20 ml of demineralized water was added thereto. 139 mg (0.12 mmol) of tetrakis(triphenylphosphine)palladium(0) were added. The mixture was heated to 90° C. for 3 h under nitrogen and stirred at room temperature overnight. At room temperature, the reaction mixture was sucked off and the residue was washed with pentane. The residue was dissolved in dichloromethane, dried over sodium sulfate, filtered. The residue was dissolved in toluene, activated charcoal was added and the mixture was stirred for one hour. After filtration, the solution was concentrated. The result was a solid which, according to $^{13}$C analyses, was the title compound.

UV (dichloromethane): lambda-max=417 nm; mass extinction coefficient: 44.1 kg×g$^{-1}$cm$^{-1}$; Fluorescence: lambda max (0.03% in polystyrene): 522.6 nm; FQY (polystyrene)=90% Photostability: 0.03% in polystyrene, irradiation with light (80 mW/cm$^2$): half-life: 37 days.

Application Examples of Color Converter Devices

Production of Masterbatches:

3 polymer masterbatches were produced, which comprise either 2% by weight of TiO$_2$, based on the amount of polymer used, or 0.2% by weight of inventive fluorescent dye, based on the amount of polymer used, or 0.2% by weight of noninventive fluorescent dye (N,N'-(2,6-diisopropylphenyl)-1,6,7,12-tetraphenoxyperylene-3,4; 9,10-tetracarboximide), based on the amount of polymer used.

The production was effected, in a first embodiment, by solution processing. The polymer was dissolved in methylene chloride and then either TiO$_2$ or the respective fluorescent dye was added. The mixture was stirred overnight and then spread out on a metal sheet to evaporate the solvent. The film obtained was detached, comminuted, dried at 50° C. in a vacuum drying cabinet overnight, and then ground to a fine powder in a laboratory mill.

The masterbatch was produced, in a second embodiment, by intimately mixing the components in an IKA kneader at a temperature of 200° C. and comminuting the mixture, for example by means of hot cutting of the extrudate and subsequent cooling.

Production of the Converter Material:

To produce the converter material, according to the desired concentrations (see Table 1), the powders of the above-described masterbatches were combined with undoped polymer and mixed. This blend was then either processed to a blend material in a solution operation or melted and mixed in a mini extruder at a temperature of 200° C.

The blend materials were cooled, then comminuted and ground.

Production of the Color Converter Plaques:

The pulverulent converter material was used to produce, by hot pressing on a Collin P 200 PV heated vacuum press:

About 3 g of the powder material were placed into a pressing frame (thickness about 0.8 mm) with a circular cutout of diameter 61 mm. Then the opposite plate was placed thereon. Thereafter, this arrangement was pushed into a press heated to 200° C. Pressing was effected under vacuum at 3 bar for 3 min, then at 5 bar for 3 min and finally 100 bar for 5 min. After cooling circular polymer plaques with a diameter of 61 mm and mean thickness of about 0.83-0.84 mm were obtained.

TABLE 1

| Example | Polymer | % yellow fluorescent dye* [% by wt.] | % red fluorescent dye** [% by wt.] | TiO$_2$*** [% by wt.] | Film thickness [μm] |
|---|---|---|---|---|---|
| A1 | PS | 0.0069 | 0.00100 | 0.25 | 0.83-0.84 |
| A2 | PS | 0.0085 | 0.00125 | 0.25 | 0.83-0.84 |
| A3 | PS | 0.0094 | 0.00171 | 0.25 | 0.83-0.84 |
| A4 | PS | 0.0102 | 0.00171 | 0.25 | 0.83-0.84 |
| A5 | PS | 0.0100 | 0.00171 | 0.25 | 0.83-0.84 |

PS Polystyrene

* Product from Example 10, main component is

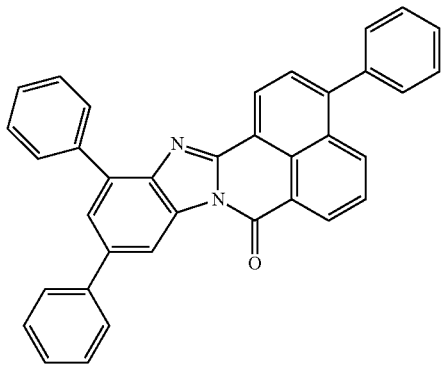 [SMILES: O=c1c2cccc3c(-c4ccccc4)ccc(c32)c2nc3c(-c4ccccc4)cc(-c4ccccc4)cc3n12]

3,10,12-triphenylbenzo[de]benzo[4,5]imidazo[2,1-a]isoquinolin-7-one; the % by weight figures are each based on the total amount of product from Example 10 based on the amount of polymer used

** N,N'-bis(2,6-diisopropylphenyl)-1,6,7,12-tetraphenoxyperylene-3,4; 9,10-tetracarboximide, 5 by weight based on the amount of polymer used

*** % by weight based on the amount of polymer used

Exposure of the Samples:

The basis used for this measurement was an apparatus which consists of 16 blue LEDs arranged in a matrix (peak wavelength 450-452 nm). The color converter plaque was placed onto this arrangement. Then the light emitted through the plaque and by the plaque was measured by an integral measurement with a large Ulbricht sphere, ISP 500-100, and a CAS 140CT-156 CCD detector (from Instrument Systems, Munich). The spectra was used to determine the relevant light analysis parameters of the emitted light, such as CIELAB coordinates x, y and the CCT (=correlated color temperature), distance from the Planck curve $d_{uv}$, color rendering index CRI etc.

The x and y coordinates were converted to a CCT (correlated color temperature). CCT described the relative color temperature of a white light source in kelvin. The color area for the CCT is within the CIE space on both sides of the Planck curve. The color rendering index (CRI) describes the quality of the color rendering by light sources of the same correlated color temperature. It states how naturally colors are reproduced. A CRI of 90-100 corresponds to very good color rendering.

| Example | x color coordinate | y color coordinate | CCT [K] | Planck distance [$d_{uv}$] | Color rendering index CRI |
|---|---|---|---|---|---|
| A1 | 0.3560 | 0.3586 | 4636 | −0.0007 | 94.22 |
| A2 | 0.3743 | 0.3753 | 4163 | 0.00119 | 95.10 |
| A3 | 0.4146 | 0.3951 | 3341 | −2E−05 | 93.00 |
| A4 | 0.4093 | 0.3872 | 3384 | −0.0024 | 91.90 |
| A5 | 0.4257 | 0.4101 | 3247 | 0.00415 | 94.12 |

The results are shown in the form of a graph in the FIGURE.

The FIGURE shows emission spectra of color converters plaques on illumination with 450 nm LEDs. The color converter plaques comprise an inventive yellow fluorescent dye, 3,10,12-triphenylbenzo[de]benzo[4,5]imidazo[2,1-a]isoquinolin-7-one, and a noninventive fluorescent dye, N,N'-(2,6-diisopropylphenyl)-1,6,7,12-tetraphenoxyperylene-3,4;9,10-tetracarboximide. The combination of yellow and red fluorescent dyes in the color converter plaques on irradiation with LEDs having a peak wavelength of 450-452 nm gives white light of varying color temperature.

The invention claimed is:
1. A fluorescent dye, selected from the group consisting of:

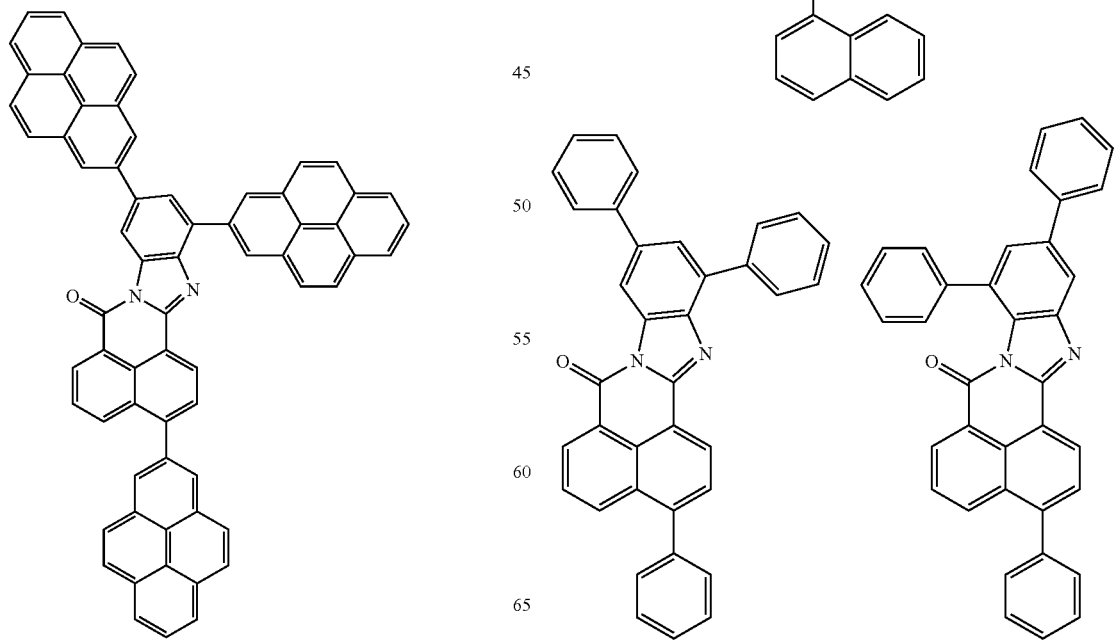

119
-continued
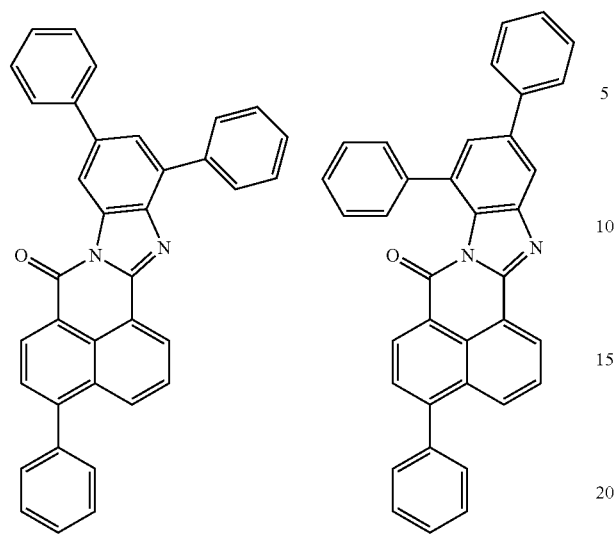
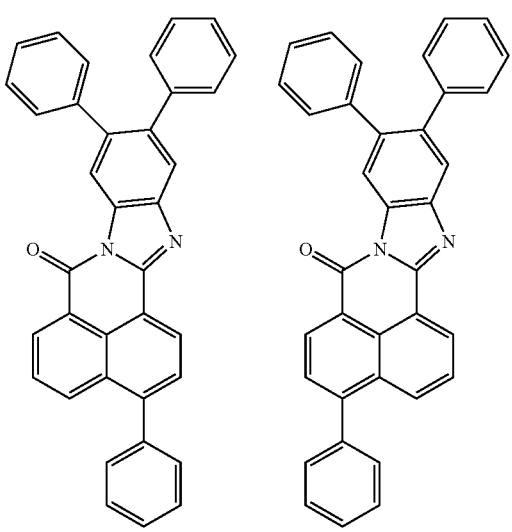
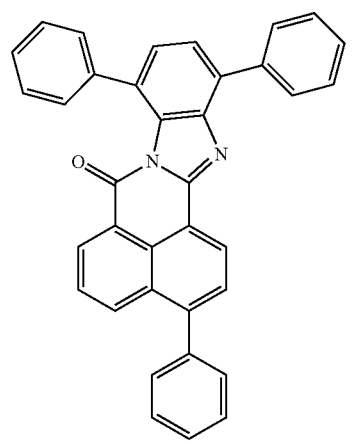
120
-continued
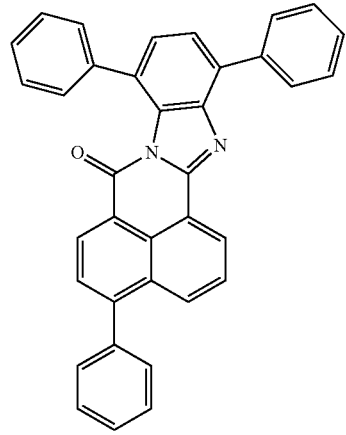
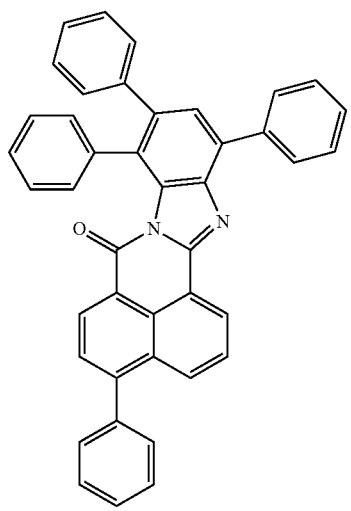
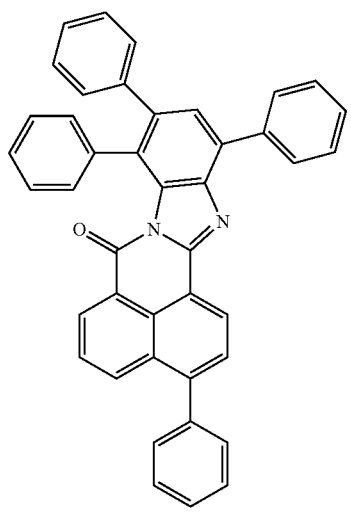

121
-continued
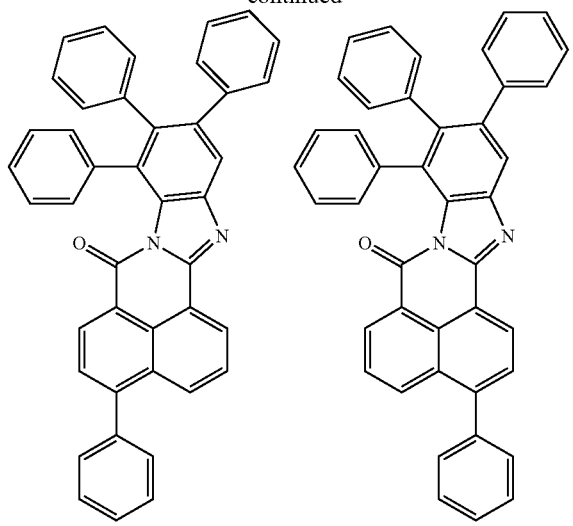
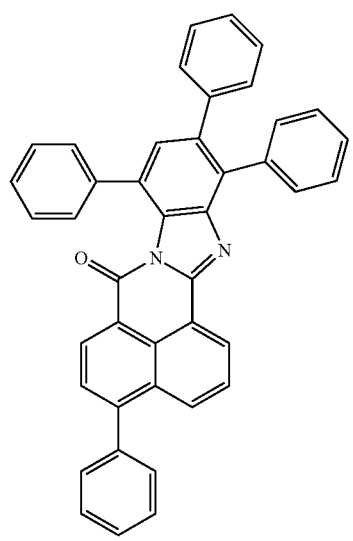
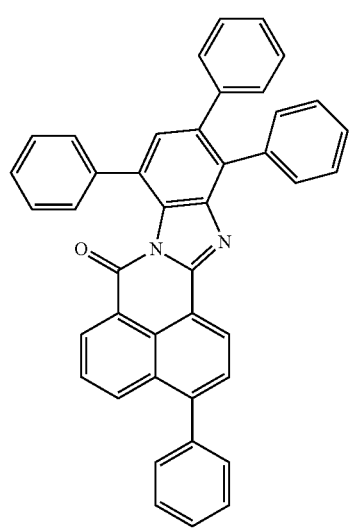
122
-continued
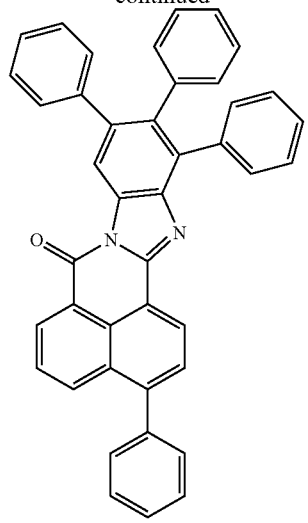
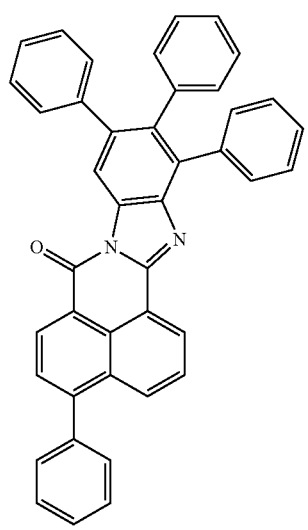
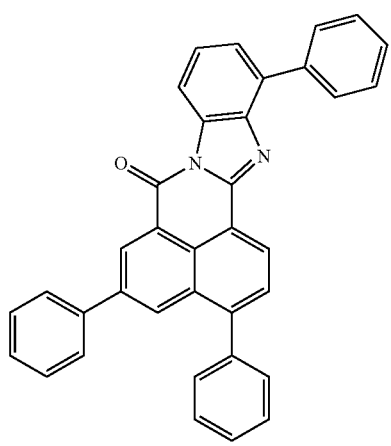

123
-continued
124
-continued
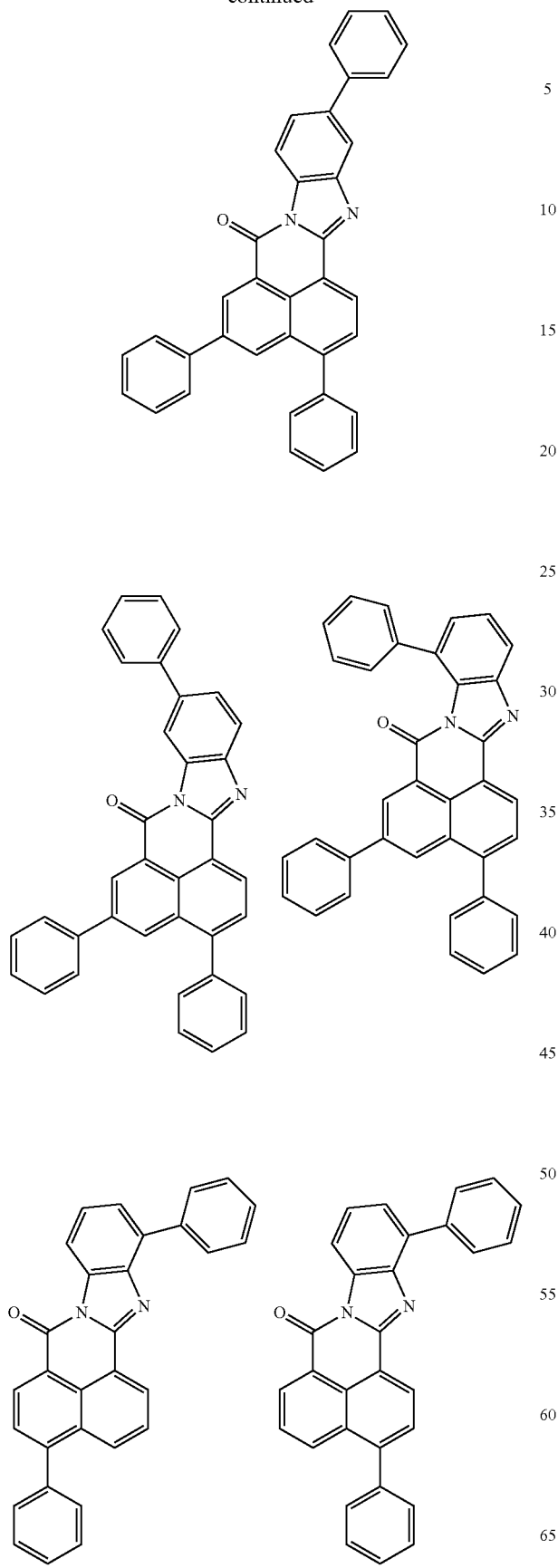

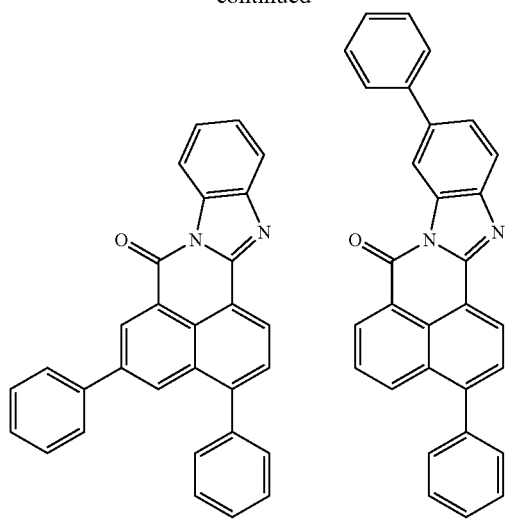
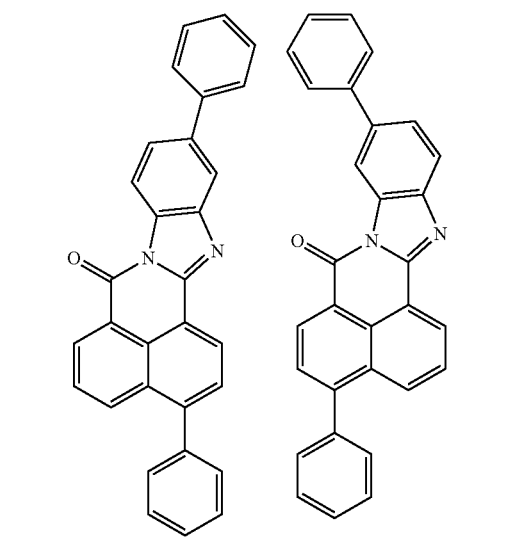
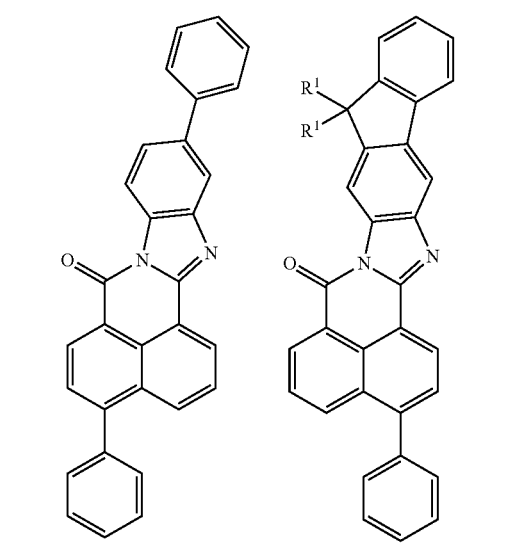
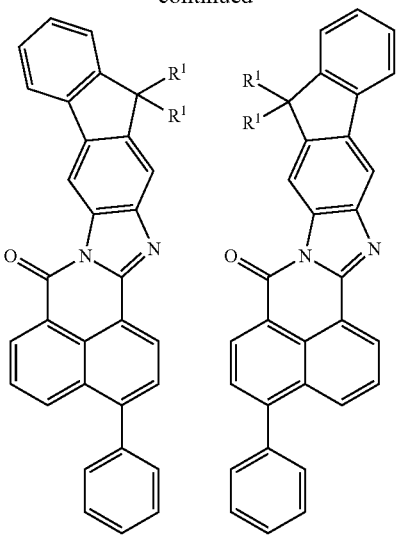
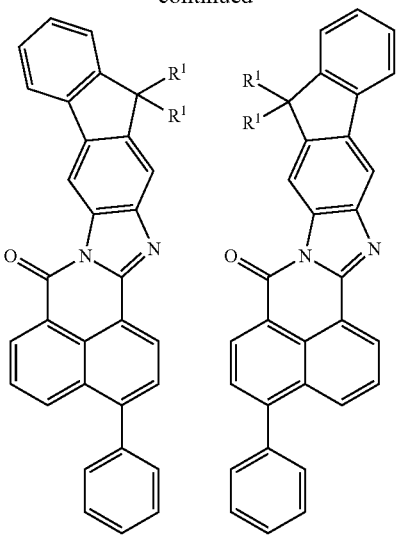
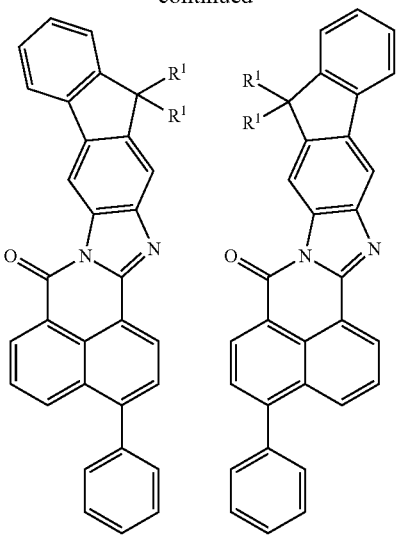

127
-continued
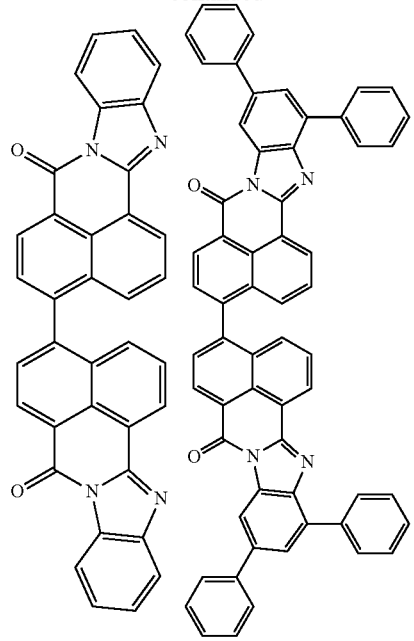
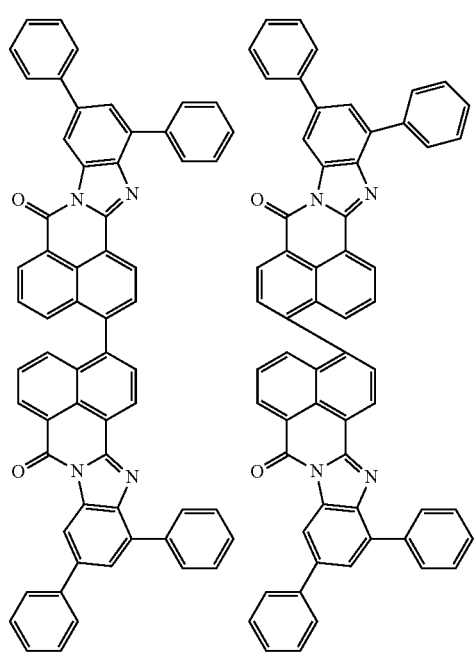
128
-continued
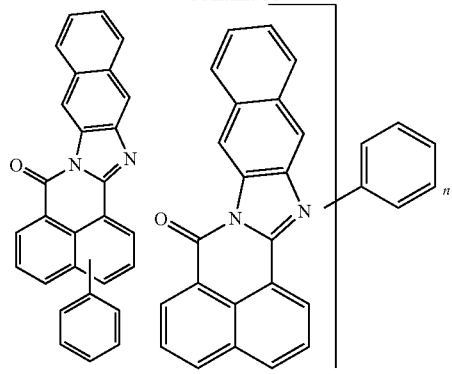
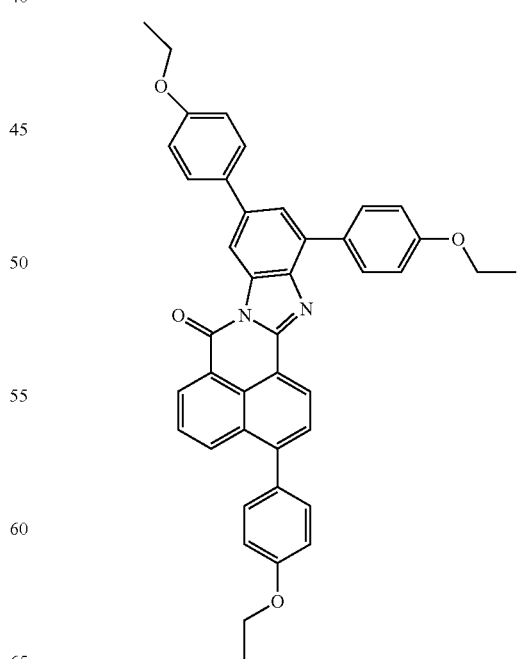
and mixtures thereof, wherein:

n is 1, 2, 3, 4, 5, 6, 7, 8, 9, or 10;

$R^1$ independently represents hydrogen, $C_1$-$C_{18}$-alkyl or cycloalkyl, the carbon chain of which may comprise one or more —O—, —S—, —CO—, —SO— and/or —$SO_2$-moieties and which may be mono- or polysubstituted; aryl or hetaryl which may be mono- or polysubstituted.

2. The fluorescent dye according to claim 1, wherein the dye is selected from the group consisting of:

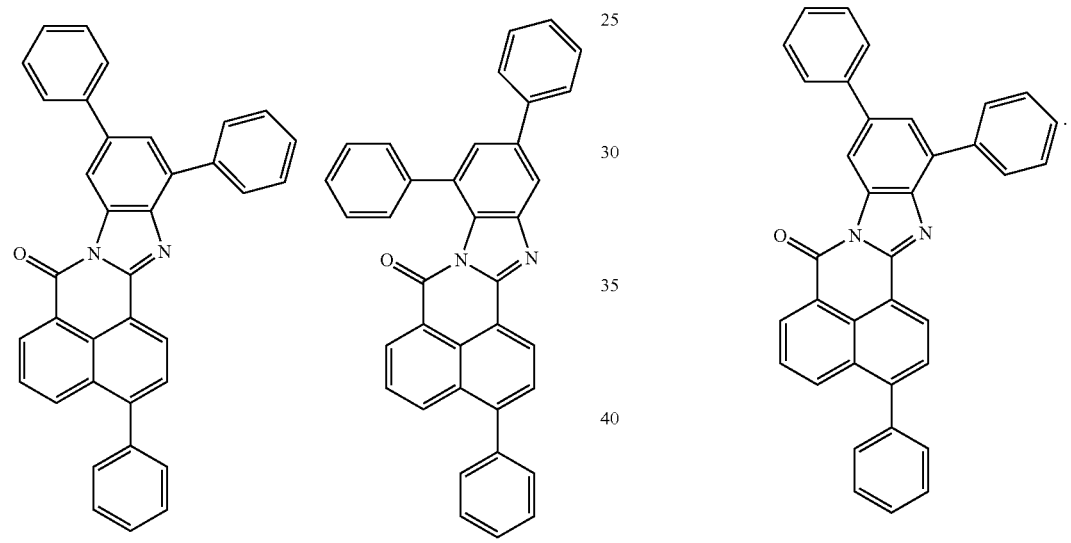

3. The fluorescent dye according to claim 1, wherein the dye is

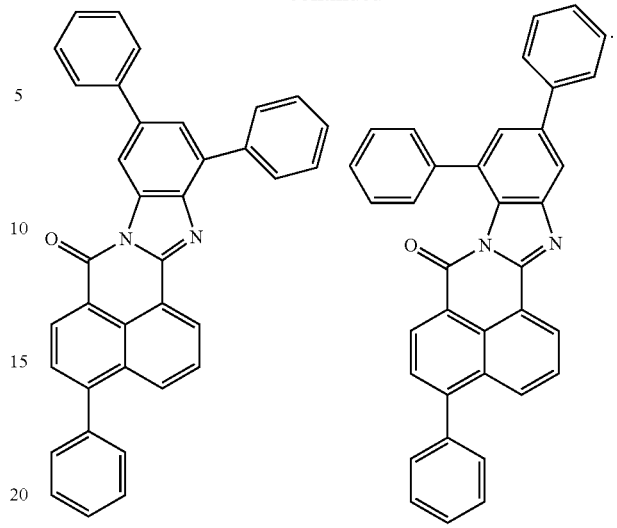

* * * * *

UNITED STATES PATENT AND TRADEMARK OFFICE
CERTIFICATE OF CORRECTION

PATENT NO. : 10,230,023 B2
APPLICATION NO. : 15/180161
DATED : March 12, 2019
INVENTOR(S) : Martin Koenemann et al.

It is certified that error appears in the above-identified patent and that said Letters Patent is hereby corrected as shown below:

In the Specification

Column 6, Lines 7-8, "polvi-nylidene chloride (PVDC)" should read --polyvinylidene chloride (PVDC)--;

Column 6, Lines 18-19, "polvi-nylidene chloride (PVDC)" should read --polyvinylidene chloride (PVDC)--;

Column 13, Line 46, "-N-CR$^1$-," should read -- -N=CR$^1$-,--;

Column 21, Line 45, "und" should read --and--;

Column 25, Line 25, "2,6-dicyclohexyithiophenoxy" should read --2,6-dicyclohexylthiophenoxy--;

Column 27, Line 29, "-CR$^1$=CR$^{12}$," should read -- -CR$^1$=CR$^1_2$,--;

Column 47, Line 25, "R$^4$=C$_1$ to C$_{30}$" should read --R$^4$ = C$_1$ to C$_{30}$--;

Column 47, Line 45, "XXX-1 XXX-2 and XXX-3," should read --XXX-1, XXX-2 and XXX-3,--;

Column 61, Line 34, "C$_3$-C$_5$-cycloalkyl" should read --C$_3$-C$_8$-cycloalkyl--;

Column 61, Line 37, "C$_1$-C$_8$-alkyl," should read --C$_1$-C$_{18}$-alkyl,--;

Column 61, Line 61, "C$_1$-C$_1$-alkyl" should read --C$_1$-C$_{18}$-alkyl--;

Column 74, Lines 58-59, "polvinylidene chloride (PVDC)," should read --polyvinylidene chloride (PVDC),--;

Column 110, Line 64, "each time of molar" should read --each time of 1 molar--;

Signed and Sealed this
Tenth Day of December, 2019

Andrei Iancu
*Director of the United States Patent and Trademark Office*

CERTIFICATE OF CORRECTION (continued)
U.S. Pat. No. 10,230,023 B2

In the Claims

Column 129, Line 5, "n is 1, 2, 3, 4, 5, 6, 7, 8, 9, or 10;" should read --n is 1, 2, 3, 4, 5, 6, 7, 8, 9, or 10; and--.